(12) United States Patent
Masuoka et al.

(10) Patent No.: US 7,960,762 B2
(45) Date of Patent: Jun. 14, 2011

(54) SOLID-STATE IMAGE SENSING DEVICE INCLUDING SOLID-STATE IMAGE SENSOR HAVING A PILLAR-SHAPED SEMICONDUCTOR LAYER

(75) Inventors: Fujio Masuoka, Tokyo (JP); Hiroki Nakamura, Tokyo (JP)

(73) Assignee: Unisantis Electronics (Japan) Ltd., Chuo-Ku, Tokyo (JP)

( * ) Notice: Subject to any disclaimer, the term of this patent is extended or adjusted under 35 U.S.C. 154(b) by 21 days.

(21) Appl. No.: 12/509,239

(22) Filed: Jul. 24, 2009

(65) Prior Publication Data
US 2009/0283804 A1 Nov. 19, 2009

Related U.S. Application Data

(63) Continuation of application No. PCT/JP2007/074961, filed on Dec. 26, 2007.

(51) Int. Cl.
*H01L 27/148* (2006.01)
(52) U.S. Cl. ............ 257/225; 257/72; 257/59; 257/257; 257/258; 257/222
(58) Field of Classification Search .................. 257/222, 257/225, 242, 257, 258, 59, 72
See application file for complete search history.

(56) References Cited

U.S. PATENT DOCUMENTS

| | | | | |
|---|---|---|---|---|
| 5,029,321 A | * | 7/1991 | Kimura | 257/243 |
| 5,114,865 A | * | 5/1992 | Kimura | 438/79 |
| 2006/0007333 A1 | | 1/2006 | Horii | |
| 2006/0157837 A1 | * | 7/2006 | Nagase | 257/678 |
| 2006/0170800 A1 | * | 8/2006 | Hagiwara | 348/294 |

FOREIGN PATENT DOCUMENTS

| | | |
|---|---|---|
| JP | 04-045548 | 2/1992 |
| JP | 2000-101056 | 4/2000 |
| JP | 2002-246583 A | 8/2002 |
| JP | 2006-024799 | 1/2006 |

* cited by examiner

*Primary Examiner* — Wai-Sing Louie
*Assistant Examiner* — Bilkis Jahan
(74) *Attorney, Agent, or Firm* — Brinks Hofer Gilson & Lione

(57) ABSTRACT

It is an object to provide a CCD solid-state image sensor, in which an area of a read channel is reduced and a rate of a surface area of a light receiving portion (photodiode) to an area of one pixel is increased. There is provided a solid-state image sensor, including: a first conductive type semiconductor layer; a first conductive type pillar-shaped semiconductor layer formed on the first conductive type semiconductor layer; a second conductive type photoelectric conversion region formed on the top of the first conductive type pillar-shaped semiconductor layer, an electric charge amount of the photoelectric conversion region being changed by light; and a high-concentrated impurity region of the first conductive type formed on a surface of the second conductive type photoelectric conversion region, the impurity region being spaced apart from a top end of the first conductive type pillar-shaped semiconductor layer by a predetermined distance, wherein a transfer electrode is formed on the side of the first conductive type pillar-shaped semiconductor layer via a gate insulating film, a second conductive type CCD channel region is formed below the transfer electrode, and a read channel is formed in a region between the second conductive type photoelectric conversion region and the second conductive type CCD channel region.

10 Claims, 47 Drawing Sheets

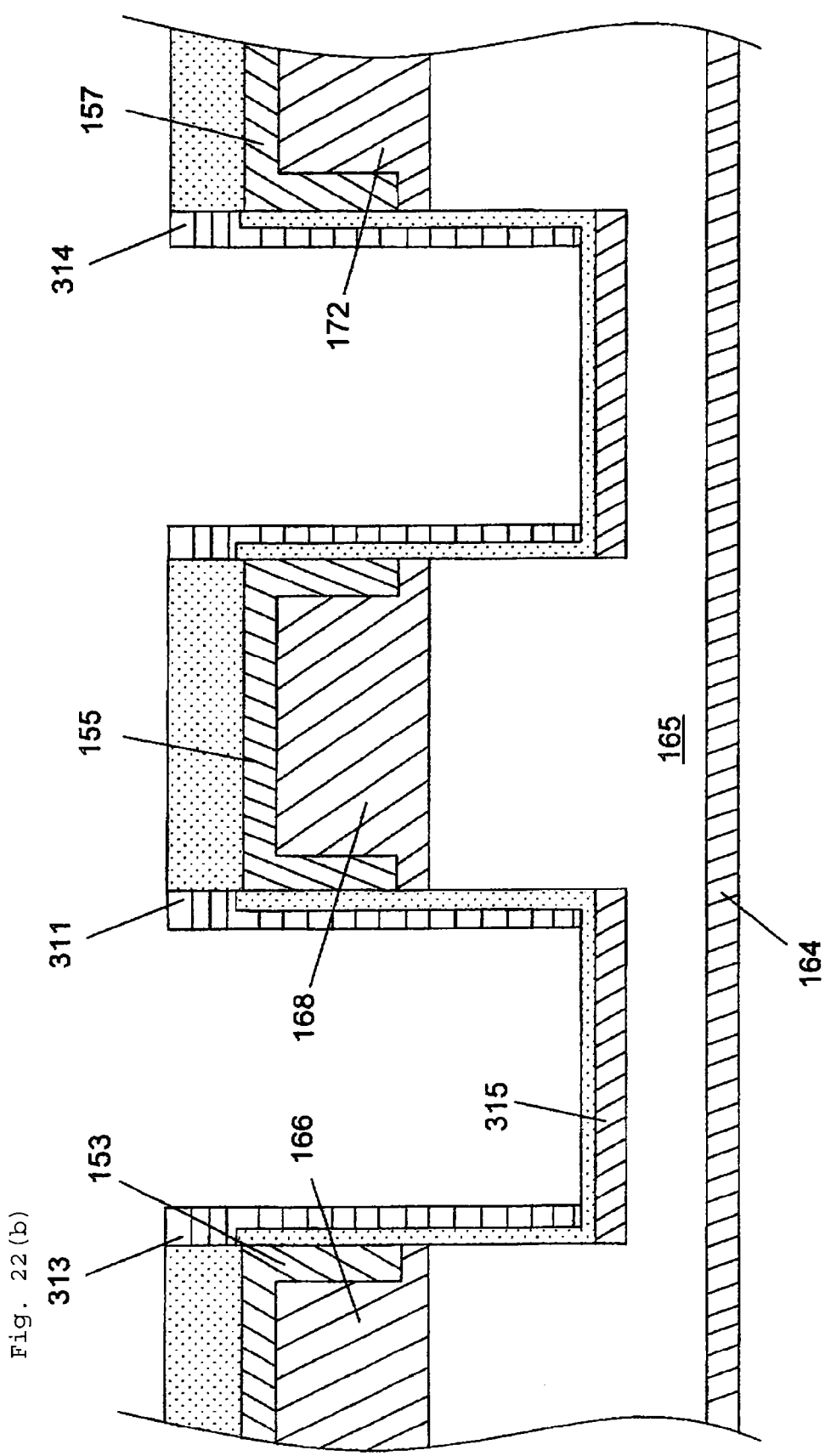

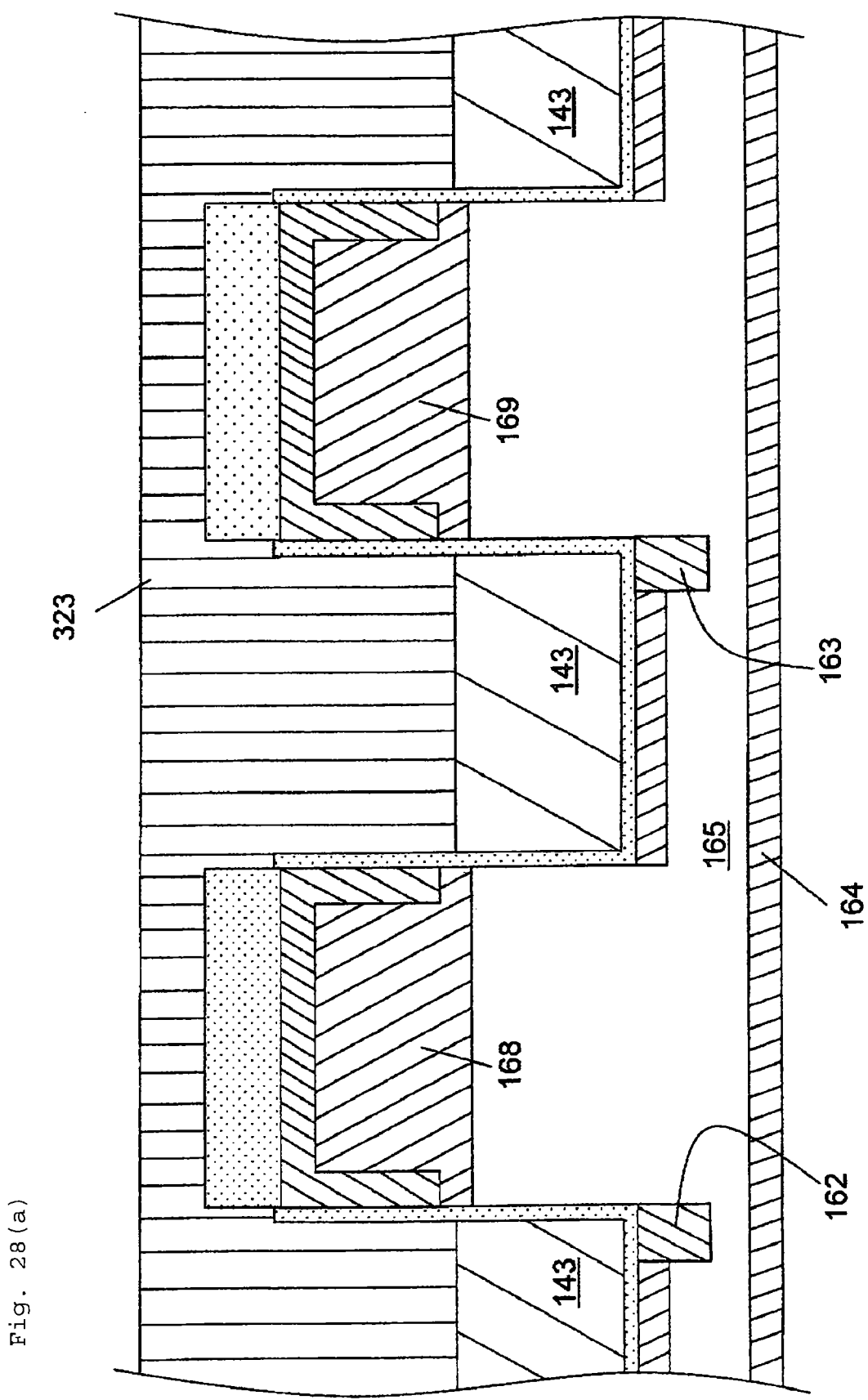

SOLID-STATE IMAGE SENSING DEVICE INCLUDING SOLID-STATE IMAGE SENSOR HAVING A PILLAR-SHAPED SEMICONDUCTOR LAYER

RELATED APPLICATIONS

This application is a continuation of PCT/JP2007/074961, filed on Dec. 26, 2007. The entire content of this application is incorporated herein by reference.

BACKGROUND OF THE INVENTION

The present invention relates to a solid-state image sensor, a solid-state image sensing device, and a method of producing the same, and in particular, to a CCD solid-state image sensor, a CCD solid-state image sensing device, and a method of producing the same.

A conventional solid-state image sensor used in a video camera or the like, in which light sensing elements are arranged in matrix form, includes, between light sensing element lines, a vertical charge coupled device (Vertical CCD: Charge Coupled Device) for reading signal charges generated by the light sensing element lines.

A structure of the aforementioned conventional solid-state image sensor will be described in the following (refer to, for example, Patent Document 1). FIG. 1 is a sectional view showing a unit pixel of the conventional solid state-image sensor. A photodiode (PD) are composed of an n-type photoelectric conversion region 13 which is formed in a p-type well region 12 formed on an n-type substrate 11 and functions as a charge storage layer, and a p+-type region 14 formed on the n-type photoelectric conversion region 13.

An n-type CCD channel region 16 is formed in the p-type well region 12 as an n-type impurity region. There is provided a read channel formed by a p-type impurity region between the n-type CCD channel region 16 and the photodiode on the side of reading the signal charge to the n-type CCD channel region 16. The signal charge generated in the photodiode is read through the read channel after being temporarily stored in the n-type photoelectric conversion region 13.

There is provided a p+-type isolation region 15 between the n-type CCD channel region 16 and other photodiodes. By the p+-type isolation region 15, the photodiodes and the n-type CCD channel region 16 are isolated, and respective n-type CCD channels 16 also are isolated not to touch with each other.

A transfer electrode 18 is formed on a surface of the semiconductor substrate via a Si oxide film 17, which horizontally extends so as to pass through between the photodiodes. Incidentally, the signal charge generated in the photodiode is read to the n-type CCD channel region 16 through a read channel below a transfer electrode to which a read signal is applied among the transfer electrodes 18.

A metal shield film 20 is formed on the surface of the semiconductor substrate in which the transfer electrode 18 is formed. The metal shield film 20 includes a metal shield film opening 24 for every photodiode as a light transmitting portion which transmits the light received by the p+-type region 14 acting as a light receiving portion.

Patent Document 1; Japanese Unexamined Patent Publication (Kokai) No. 2000-101056

SUMMARY OF THE INVENTION

As described above, in the conventional solid-state image sensors, the photodiode (PD), the read channel, n-type CCD channel region, and the p+-type isolation region are formed in a plane, and thus there has been a limitation in increasing a ratio of a surface area of the light receiving portion (photodiode) to an area of one pixel. Therefore, it is an object to provide a CCD solid-state image sensor, in which an area of the read channel is reduced, and the ratio of the surface area of the light receiving portion (photodiode) to the area of one pixel is increased.

A first aspect of the present invention is to provide a solid-state image sensor including: a first conductive type semiconductor layer; a first conductive type pillar-shaped semiconductor layer formed on the first conductive type semiconductor layer; a second conductive type photoelectric conversion region formed on the top of the first conductive type pillar-shaped semiconductor layer, an electric charge amount of the photoelectric conversion region being changed by light; and a high-concentrated impurity region of the first conductive type formed on a surface of the second conductive type photoelectric conversion region, the impurity region being spaced apart from a top end of the first conductive type pillar-shaped semiconductor layer by a predetermined distance, wherein a transfer electrode is formed on the side of the first conductive type pillar-shaped semiconductor layer via a gate insulating film, a second conductive type CCD channel region is formed below the transfer electrode, and a read channel is formed in a region between the second conductive type photoelectric conversion region and the second conductive type CCD channel region.

A second aspect of the present invention is to provides a solid-state image sensing device in which a plurality of solid-state image sensors are arranged in matrix form, the solid-state image sensor including: a first conductive type semiconductor layer; a first conductive type pillar-shaped semiconductor layer formed on the first conductive type semiconductor layer; a second conductive type photoelectric conversion region formed on the top of the first conductive type pillar-shaped semiconductor layer, an electric charge amount of the photoelectric conversion region being changed by light; and a high-concentrated impurity region of the first conductive type formed on a surface of the second conductive type photoelectric conversion region, the impurity region being spaced apart from a top end of the first conductive type pillar-shaped semiconductor layer by a predetermined distance, wherein a transfer electrode is formed on the side of the first conductive type pillar-shaped semiconductor layer via a gate insulating film, a second conductive type CCD channel region is formed below the transfer electrode, and a read channel is formed in a region between the second conductive type photoelectric conversion region and the second conductive type CCD channel region.

Preferably, the second conductive type CCD channel region is composed of a second conductivity type impurity region extending in a column direction, at least in respective portions between adjacent columns of the first conductive type pillar-shaped semiconductor layers, and an isolation region composed of high-concentrated impurities of the first conductivity type is provided so that the second conductivity type CCD channel regions may not contact with each other.

More preferably, a plurality of transfer electrodes including the transfer electrodes formed on the side of the first conductive type pillar-shaped semiconductor layer via the gate insulating film extend in a row direction, in respective portions between the adjacent rows of the first conductive type pillar-shaped semiconductor layers, and are arranged at a predetermined space so as to transfer a signal charge generated in the solid-state image sensor along the second conductive type CCD channel region.

A third aspect of the present invention is to provide a solid-state image sensing device, wherein a solid-state image sensor includes a first conductive type semiconductor layer, a first conductive type pillar-shaped semiconductor layer formed on the first conductive type semiconductor layer, a second conductive type photoelectric conversion region formed on the top of the first conductive type pillar-shaped semiconductor layer, an electric charge amount of the photoelectric conversion region being changed by light, and a high-concentrated impurity region of the first conductive type formed on a surface of the second conductive type photoelectric conversion region, the impurity region being spaced apart from a top end of the first conductive type pillar-shaped semiconductor layer by a predetermined distance, wherein a transfer electrode is formed on the side of the first conductive type pillar-shaped semiconductor layer via a gate insulating film, a second conductive type CCD channel region is formed below the transfer electrode, and a read channel is formed in a region between the second conductive type photoelectric conversion region and the second conductive type CCD channel region, and wherein a plurality of sets of the columns of solid-state image sensors, in which a first column of solid-state image sensors in which a plurality of solid-state image sensors are arranged in a first direction at a first space, and a second column of solid-state image sensors in which a plurality of solid-state image sensors are arranged in the first direction at the first space, and are displacedly arranged by a predetermined amount in the first direction with respect to the first column of solid-state image sensors are displacedly arranged at a second space are displacedly arranged by a predetermined amount in the first direction at the second space.

Preferably, the second conductive type CCD channel region is composed of a second conductive type impurity region which extends in the column direction passing through between respective pillar-shaped semiconductor layers of the adjacent columns of the first conductive type pillar-shaped semiconductor layers, at least in respective portions between the adjacent columns of the pillar-shaped semiconductor layers, and an isolation region composed of high-concentrated impurities of the first conductivity type is provided so that the second conductivity type CCD channel regions may not contact with each other.

More preferably, the transfer electrodes extend in the row direction passing through between respective pillar-shaped semiconductor layers of the adjacent rows of the pillar-shaped semiconductor layers, in respective portions between adjacent rows of the pillar-shaped semiconductor layers, and are arranged at a predetermined space so as to transfer a signal charge generated in the solid-state image sensor along the second conductive type CCD channel region.

A fourth aspect of the present invention is to provide a method of producing a solid-state image sensor, including the steps of: forming a first conductive type semiconductor layer, a first conductive type pillar-shaped semiconductor layer on the first conductive type semiconductor layer, a second conductive type photoelectric conversion region on the top of the first conductive type pillar-shaped semiconductor layer, and a high-concentrated impurity region of the first conductive type on a surface of the second conductive type photoelectric conversion region, the impurity region being spaced apart from a top end of the first conductive type pillar-shaped semiconductor layer by a predetermined distance; forming a second conductive type CCD channel region on the surface of the first conductive type semiconductor layer; forming a gate insulating film on the side of the first conductive type pillar-shaped semiconductor layer; and forming a transfer electrode on the side of the first conductive type pillar-shaped semiconductor layer via the gate insulating film, above the second conductive type CCD channel region.

Preferably, the step of forming the first conductive type semiconductor layer, the first conductive type pillar-shaped semiconductor layer on the first conductive type semiconductor layer, the second conductive type photoelectric conversion region on the top of the first conductive type pillar-shaped semiconductor layer, and the high-concentrated impurity region of the first conductive type on the surface of the second conductive type photoelectric conversion region, the impurity region being spaced apart from the top end of the first conductive type pillar-shaped semiconductor layer by the predetermined distance, further includes the steps of: forming a semiconductor layer of the first conductive type with a larger thickness than the first conductive type semiconductor layer; forming a semiconductor layer of the second conductive type on the semiconductor layer of the first conductive type with the larger thickness than the first conductive type semiconductor layer; forming a semiconductor layer with high-concentrated impurities of the first conductive type on the second conductive type semiconductor layer; selectively etching the semiconductor layer of the first conductive type with the larger thickness than the first conductive type semiconductor layer, the semiconductor layer of the second conductive type, and the semiconductor layer with high-concentrated impurities of the first conductivity type to form the first conductive type semiconductor layer, the first conductive type pillar-shaped semiconductor layer on the first conductive type semiconductor layer, the second conductive type photoelectric conversion region on the top of the first conductive type pillar-shaped semiconductor layer, and the high-concentrated impurity region of the first conductive type on the upper surface of the second conductive type photoelectric conversion region; forming an oxide film on the surface of the first conductive type semiconductor layer, the side of the second conductive type photoelectric conversion region, and the side of the first conductive type pillar-shaped semiconductor layer; depositing a masking material on the side surface of the first conductive type pillar-shaped semiconductor layer, the mask material being used in forming the high-concentrated impurity region of the first conductive type on the side surface of the second conductive type photoelectric conversion region by ion implantation; and forming the high-concentrated impurity region of the first conductive type on the side surface of the second conductive type photoelectric conversion region by ion implantation.

A fifth aspect of the present invention is to provide a method of producing a solid-state image sensing device, including the steps of: forming a first conductive type semiconductor layer, a plurality of first conductive type pillar-shaped semiconductor layers on the first conductive type semiconductor layer, a second conductive type photoelectric conversion region on the top of each of the plurality of first conductive type pillar-shaped semiconductor layers, and a high-concentrated impurity region of the first conductive type on the surface of the second conductive type photoelectric conversion region, the impurity region being spaced apart from the top end of the first conductive type pillar-shaped semiconductor layers; forming a second conductive type CCD channel region on the surface of the first conductive type semiconductor layer; forming a gate insulating film on the sides of the plurality of first conductive type pillar-shaped semiconductor layers; and forming a transfer electrode on the sides of the plurality of first conductive type pillar-shaped semiconductor layers via the gate insulating film, above the second conductive type CCD channel region.

Preferably, the step of forming the first conductive type semiconductor layer, the plurality of first conductive type pillar-shaped semiconductor layers on the first conductive type semiconductor layer, the second conductive type photoelectric conversion region on the top of each of the plurality of first conductive type pillar-shaped semiconductor layers, and the high-concentrated impurity region of the first conductive type on the surface of the second conductive type photoelectric conversion region, the impurity region being spaced apart from a top end of the first conductive type pillar-shaped semiconductor layer by a predetermined distance further includes the steps of forming a semiconductor layer of the first conductive type with a larger thickness than the first conductive type semiconductor layer; forming a semiconductor layer of the second conductive type on the semiconductor layer of the first conductive type with the larger thickness than the first conductive type semiconductor layer; forming a semiconductor layer with high-concentrated impurities of the first conductive type on the second conductive type semiconductor layer; selectively etching the semiconductor layer of the first conductive type with the larger thickness than the first conductive type semiconductor layer, the semiconductor layer of the second conductive type, and the semiconductor layer with high-concentrated impurities of the first conductivity type to form the first conductive type semiconductor layer, the plurality of first conductive type pillar-shaped semiconductor layers on the first conductive type semiconductor layer, the second conductive type photoelectric conversion region on the top of the plurality of first conductive type pillar-shaped semiconductor layers, and the high-concentrated impurity region of the first conductive type on the upper surface of the second conductive type photoelectric conversion region; forming an oxide film on the surface of the first conductive type semiconductor layer, the side of the second conductive type photoelectric conversion region, and the side of the first conductive type pillar-shaped semiconductor layer; depositing a masking material between the plurality of first conductive type pillar-shaped semiconductor layers, the mask material being used in forming the high-concentrated impurity region of the first conductive type on the side surface of the second conductive type photoelectric conversion region by ion implantation; and forming the high-concentrated impurity region of the first conductive type on the side surface of the second conductive type photoelectric conversion region by ion implantation.

Preferably, the step of forming the second conductive type CCD channel region on the surface of the first conductive type semiconductor layer is the steps of forming a second conductivity type impurity region on the surface of the first conductive type semiconductor layer between the plurality of first conductive type pillar-shaped semiconductor layers, forming an isolation region composed of high-concentrated impurities of the first conductivity type in the second conductivity type impurity region, and forming a second conductive type CCD channel region which extends in the column direction at least in respective portions between adjacent columns of the first conductive type pillar-shaped semiconductor layers, and is mutually-isolated.

Preferably, the step of forming the second conductive type CCD channel region on the surface of the first conductive type semiconductor layer, further includes the steps of: forming a nitride film on the sides of the plurality of first conductive type pillar-shaped semiconductor layers and the sides of the second conductive type photoelectric conversion region; forming a second conductive type impurity region on the surface of the first conductive type semiconductor layer between the plurality of first conductive type pillar-shaped semiconductor layers; depositing a masking material for forming the isolation region which is composed of the high-concentrated impurities of the first conductivity type on the second conductivity type impurity region; and forming the isolation region which is composed of the high-concentrated impurities of the first conductivity type in the second conductivity type impurity region by ion implantation, whereby a second conductive type CCD channel region which extends in the column direction at least in respective portions between adjacent columns of the first conductive type pillar-shaped semiconductor layers, and is mutually-isolated is formed.

More preferably, the step of forming the nitride film on the sides of the plurality of first conductive type pillar-shaped semiconductor layers and the side of the second conductive type photoelectric conversion region is a step of leaving the nitride film in a sidewall spacer shape on the sides of the plurality of first conductive type pillar-shaped semiconductor layers, the side of the second conductive type photoelectric conversion region, and the side of the high-concentrated impurity region of the first conductive type on the surface of the second conductive type photoelectric conversion region, by forming the nitride film on the surface of a structure formed at the previous step of this step to perform etch-back thereto.

The photo diode (PD), the read channel, the n type CCD channel region, and the $p^+$-type isolation region are formed in a plain face, and thus there has been a limitation in increasing the ratio of the surface area of the light receiving (photo diode) to the area of one pixel, in the conventional CCD solid-state image sensor, but according to the present invention, it is possible to provide the CCD solid-state image sensor, in which an occupation area of the read channel can be greatly reduced by arranging the read channel non-horizontally, and the ratio of the surface area of the light receiving portion (photodiode) to the area of one pixel is increased.

BRIEF DESCRIPTION OF THE DRAWINGS

FIG. 22(b) illustrates a cross-sectional process view taken from $Y_2$-$Y_2'$, showing the example of production of the solid-state image sensor in accordance with the present invention;

FIG. 28(a) illustrates a cross-sectional process view taken from $X_2$-$X_2'$, showing the example of production of the solid-state image sensor in accordance with the present invention;

DETAILED DESCRIPTION OF THE PREFERRED EMBODIMENTS

Hereinafter, embodiments of the present invention will be described in detail with reference to the accompanying drawings.

Figure 1:
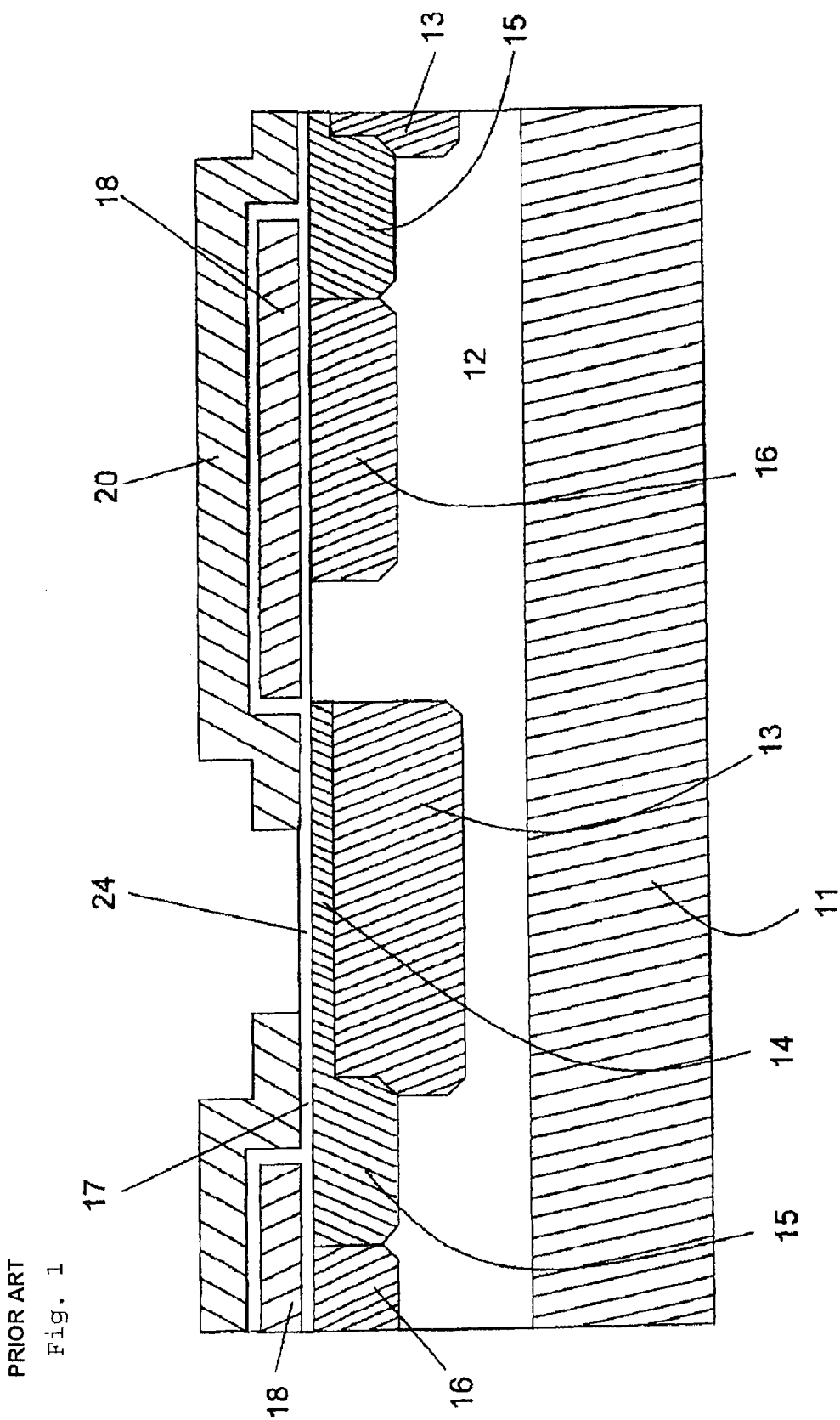
FIG. 1 illustrates a cross-sectional view of a unit pixel of a conventional solid-state image sensor.
Figure 2:
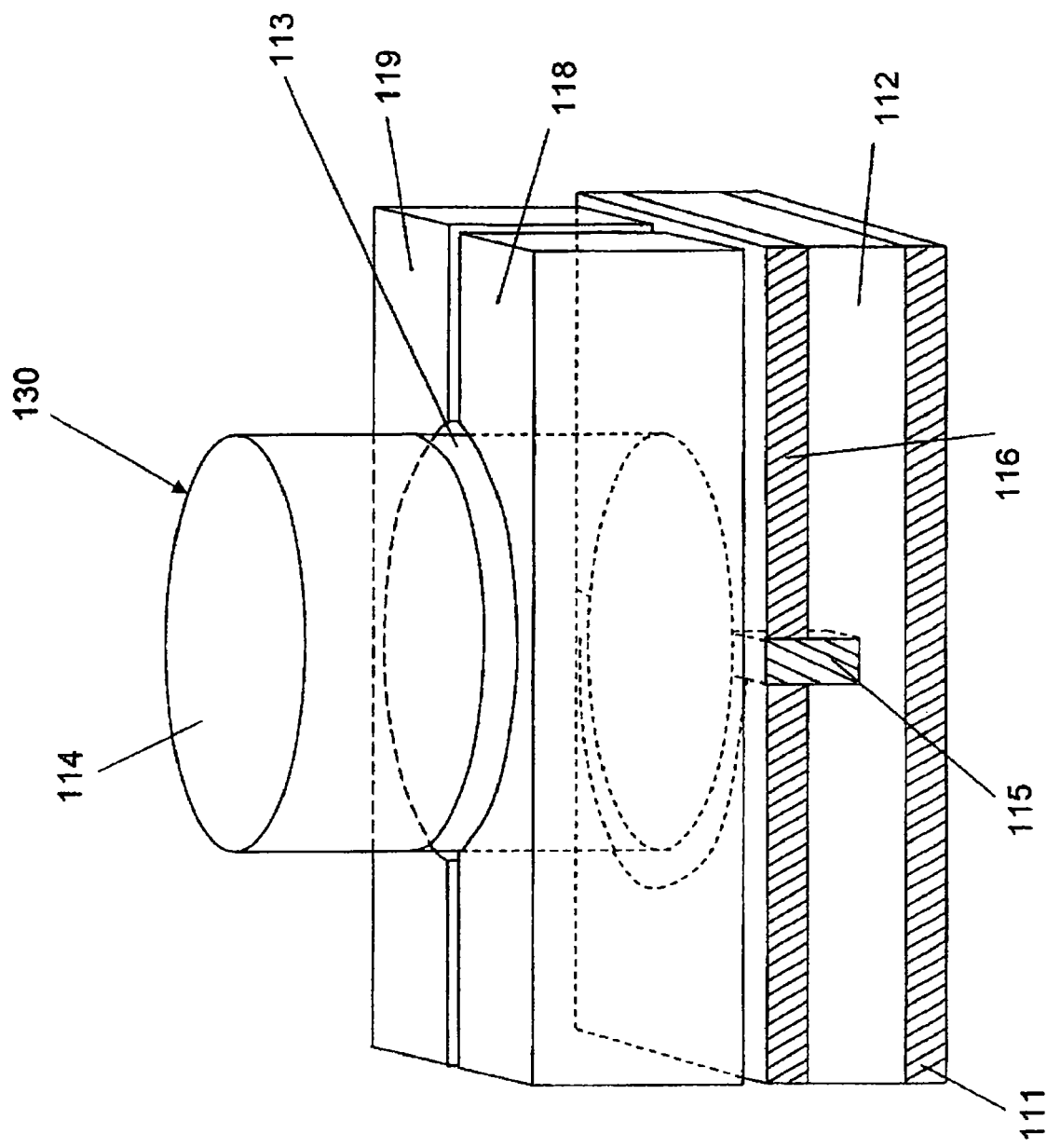
FIG. 2 illustrates a perspective view of one CCD solid-state image sensor in accordance with the present invention.
Figure 3:
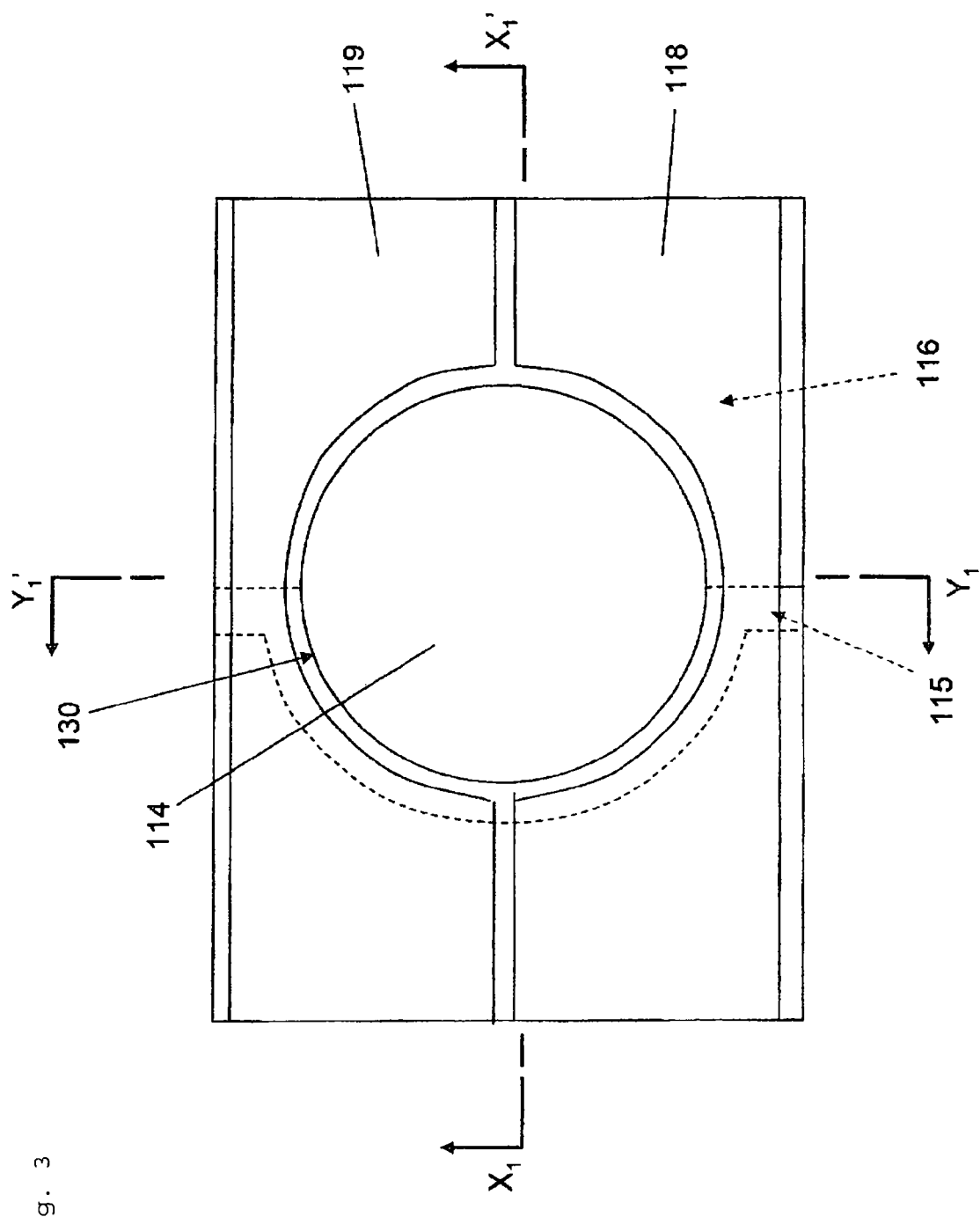
FIG. 3 illustrates a plan view of one CCD solid-state image sensor in accordance with the present invention.
Figure 4:
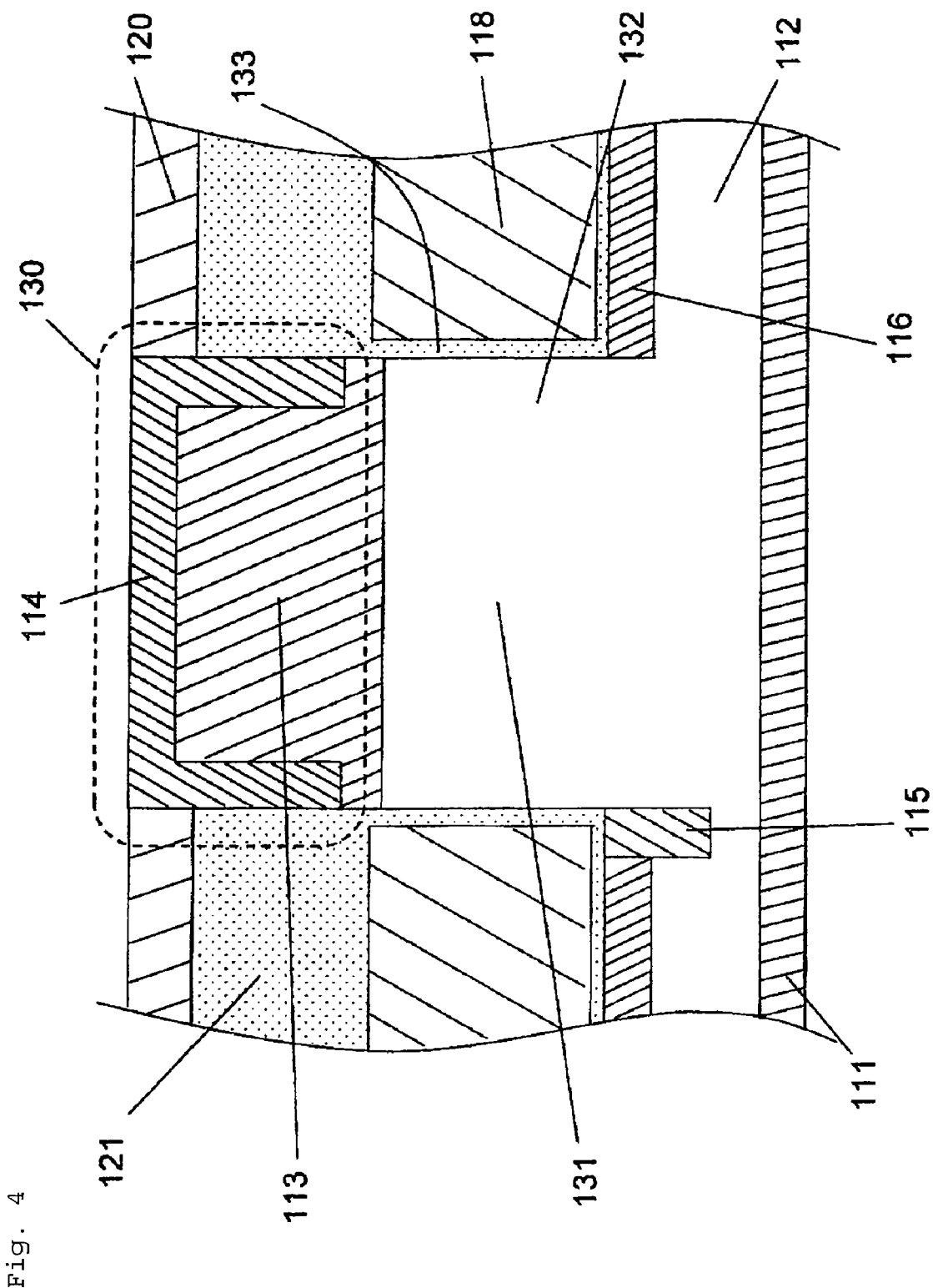
FIG. 4 illustrates a cross-sectional view taken from line $X_1$-$X_1$' shown in FIG. 3.
Figure 5:
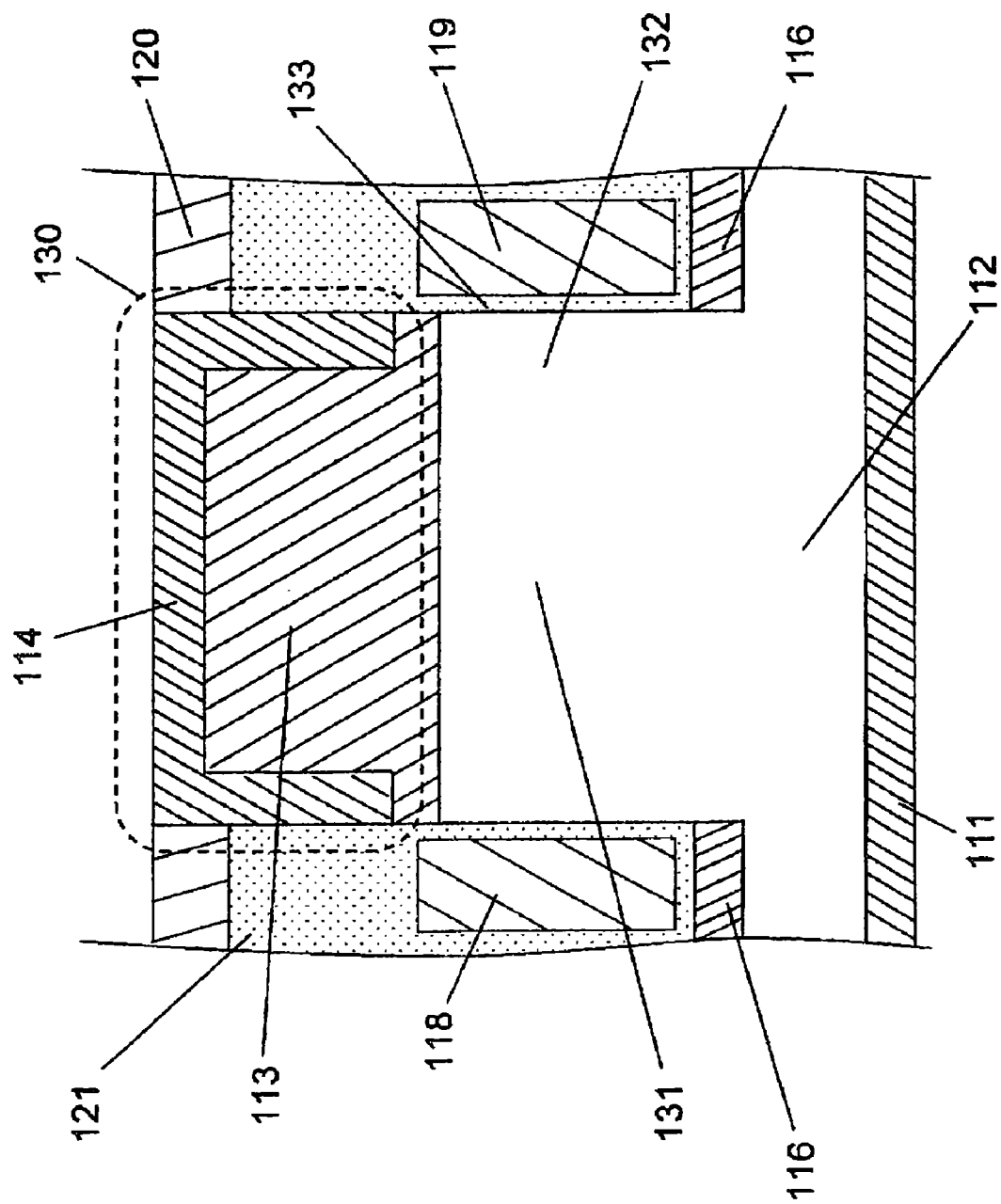
FIG. 5 illustrates a cross-sectional view taken from line $Y_1$-$Y_1$' shown in FIG. 3.

FIGS. 2 and 3 show a perspective view and a plan view of one CCD solid-state image sensor according to a first embodiment of the present invention, respectively. FIG. 4 is a cross-sectional view taken from line $X_1$-$X_1'$ shown in FIG. 3, and FIG. 5 is a cross-sectional view taken from line $Y_1$-$Y_1'$ shown in FIG. 3.

A p-type well region 112 is formed on an n-type substrate 111, and a p-type pillar-shaped semiconductor layer 131 is further formed on the p-type well region 112. An n-type photoelectric conversion region 113 in which an amount of charge is changed by light is formed on the top of the p-type pillar-shaped semiconductor layer 131, and a $p^+$-type region 114 is further formed on the surface of the n-type photoelectric conversion region 113, while being spaced apart from the top end of the p-type pillar-shaped semiconductor layer 131 by a predetermined distance. A light receiving portion (photodiode) 130 is formed of the $p^+$-type region 114 and the n-type photoelectric conversion region 113. Transfer electrodes 118 and 119 are formed on the side of the p-type pillar-shaped semiconductor layer 131 via a gate insulating film 133. An n-type CCD channel region 116 is formed below the transfer electrodes 118 and 119. A read channel 132 is formed in a region between the n-type photoelectric conversion region 113 on the top of the p-type pillar-shaped semiconductor layer and the n-type CCD channel region 116. Moreover, a $p^+$-type isolation region 115 is formed below the transfer electrodes 118 and 119 for isolation. A metal shield film 120 is connected to the p$^+$-type region 114. An oxide film 121 is formed as an interlayer insulation film.

When a read signal is applied to the transfer electrodes 118 or 119, a signal charge accumulated in the photodiode 130 will be read into the n-type CCD channel region 116 through the read channel 132. Moreover, the read signal charge is transferred in the vertical ($Y_1$-$Y_1'$) direction by the transfer electrodes 118 and 119.

Figure 6:
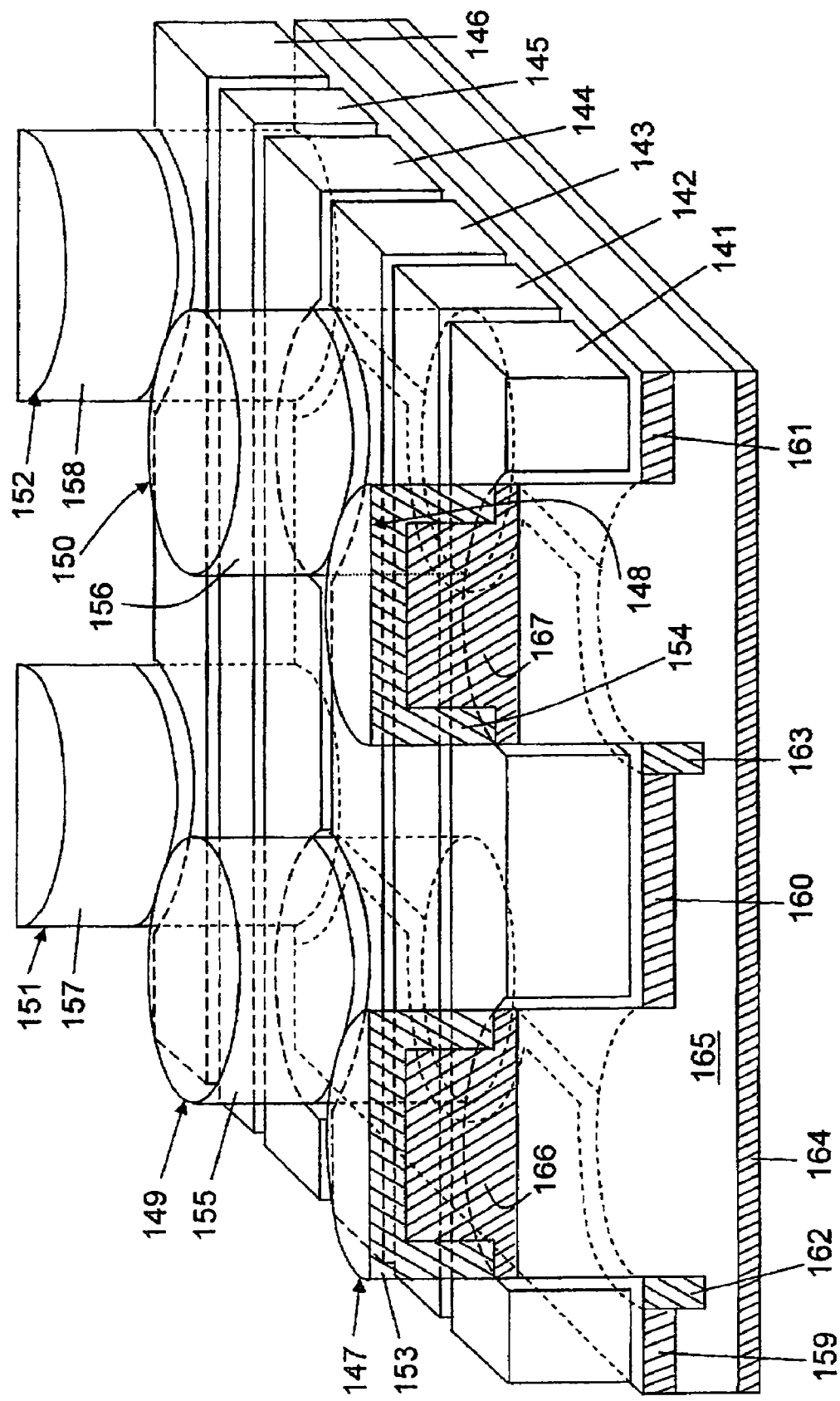
FIG. 6 illustrates a perspective view of CCD solid-state image sensors arranged in matrix form.
Figure 7:
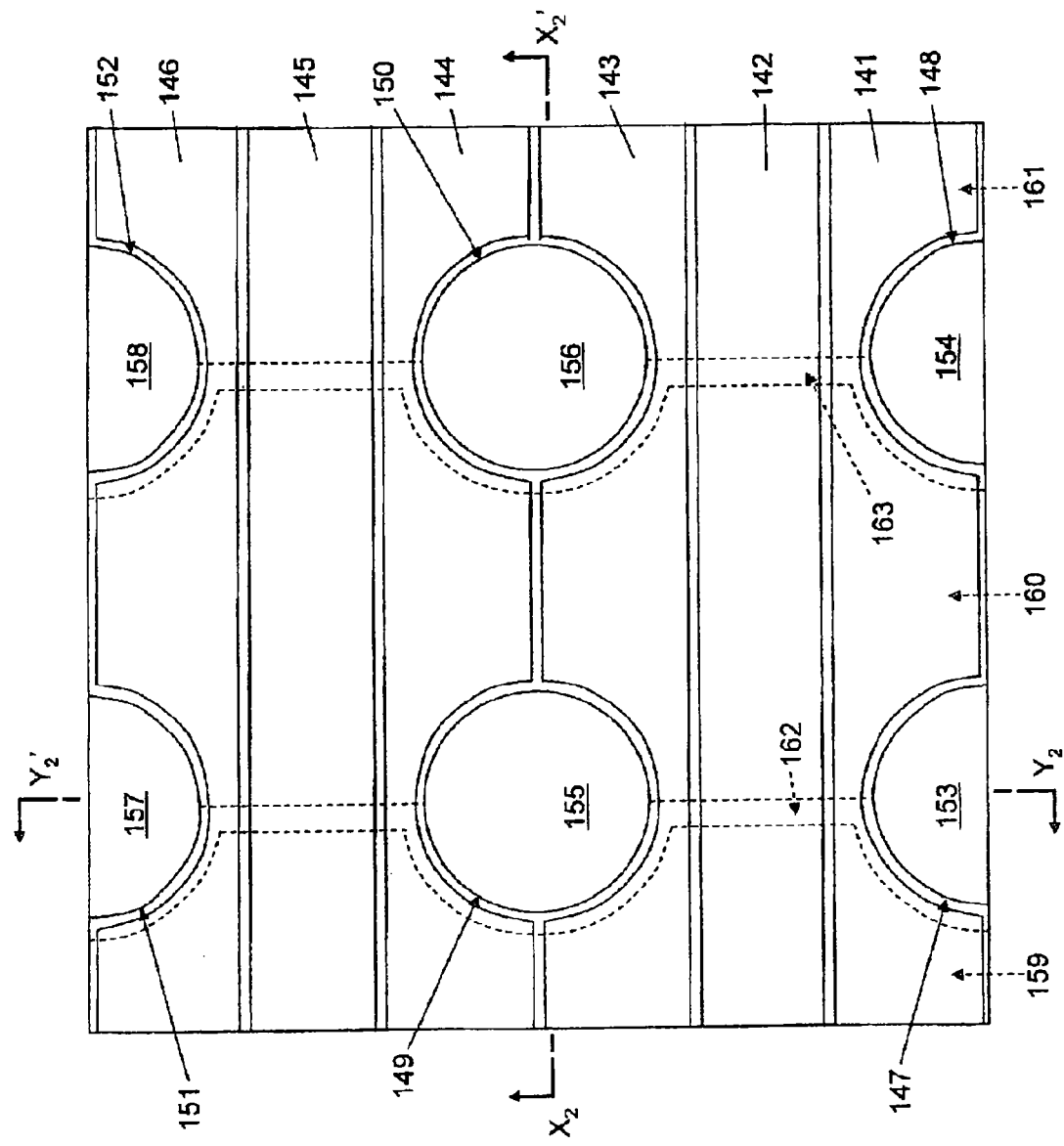
FIG. 7 illustrates a plan view of CCD solid-state image sensors arranged in matrix form.

Next, a perspective view and a plan view of a part of a solid-state image sensing device which is the second embodiment of the present invention and in which a plurality of CCD solid-state image sensors of the first embodiment are arranged in matrix form are shown in FIGS. 6 and 7, respectively.

In FIGS. 6 and 7, the solid-state image sensors having photodiodes (PDs) 147, 149, and 151 which have p$^+$-type regions 153, 155, and 157, respectively, are arranged on a semiconductor substrate, at a predetermined spacing (a vertical pixel pitch VP) and in the vertical ($Y_2$-$Y_2'$) direction (column direction) (a first column of solid-state image sensors). While being adjacent to respective solid-state image sensors of the first column of solid-state image sensors and at the same positions in the vertical direction, the solid-state image sensors having photodiodes (PD) 148, 150, 152 respectively including p$^+$-type regions 154, 156, 158 are arranged in the vertical direction at the same predetermined spacing (vertical pixel pitch VP) as that of the first column of solid-state image sensors (a second column of solid-state image sensors). The first column of solid-state image sensors and the second column of solid-state image sensors are arranged at the same spacing (horizontal pixel pitch HP) as the vertical pixel pitch. As is understood, the solid-state image sensors having the photodiodes 147, 149, 151, 148, 150, and 152 are arranged in so-called matrix form.

An n-type CCD channel region 160 for reading and vertically transferring the signal charges generated in the photodiodes 147, 149, and 151 is provided between the p-type pillar-shaped semiconductor layer of the first column of solid-state image sensors and the p-type pillar-shaped semiconductor layer of the second column of solid-state image sensors which are adjacently arranged. Similarly, in order to read and vertically transfer the signal charges generated in other photodiodes, the n-type CCD channel regions 159 and 161 are provided. The n-type CCD channel region is vertically extended between the p-type pillar-shaped semiconductor layers arranged in matrix form. Moreover, p$^+$-type isolation regions 162 and 163 are provided so that the n-type CCD channel regions may be isolated not to contact with each other. Although the p$^+$-type isolation regions 162 and 163 are provided along the axes of the first and second columns of solid-state image sensors and the outer edges of the p-type pillar-shaped semiconductor layers in the present embodiment, p$^+$-type isolation region should just be provided so that adjacent n-type CCD channel regions may not contact with each other, for example, the p$^+$-type isolation regions 162 and 163 can also be displacedly arranged in an $X_2$ direction from the arrangement shown in FIG. 7.

Between the p-type pillar-shaped semiconductor layers of a first row of solid-state image sensors in which the solid-state image sensors having the photodiodes 151 and 152 are arranged in the horizontal ($X_2$-$X_2'$) direction (row direction) and the p-type pillar-shaped semiconductor layers of a second row of solid-state image sensors in which the solid-state image sensors having the photodiodes 149 and 150 are arranged in the horizontal direction, transfer electrodes 146, 145, and 144 for vertically transferring the signal charges read from the photodiodes into the n-type CCD channel regions 159, 160, and 161 are provided. Moreover, between the p-type pillar-shaped semiconductor layers of the second row of solid-state image sensors in which the solid-state image sensors having the photodiodes 149 and 150 are arranged in the horizontal direction and the p-type pillar-shaped semiconductor layers of a third row of solid-state image sensors in which the solid-state image sensors having the photodiodes 147 and 148 are arranged in the horizontal direction, transfer electrodes 143, 142, and 141 are provided. When the read signal is applied to the transfer electrode 143, the signal charges accumulated in the photodiodes 149 and 150 will be read into the n-type CCD channel regions 160 and 161 through the read channel. The transfer electrode is horizontally extended between the p-type pillar-shaped semiconductor layers arranged in matrix form.

Incidentally, the photodiode 147 is composed of the p$^+$-type region 153 and the n-type photoelectric conversion region 166, while the photodiode 148 is composed of the p$^+$-type region 154 and the n-type photoelectric conversion region 167.

Figure 8:
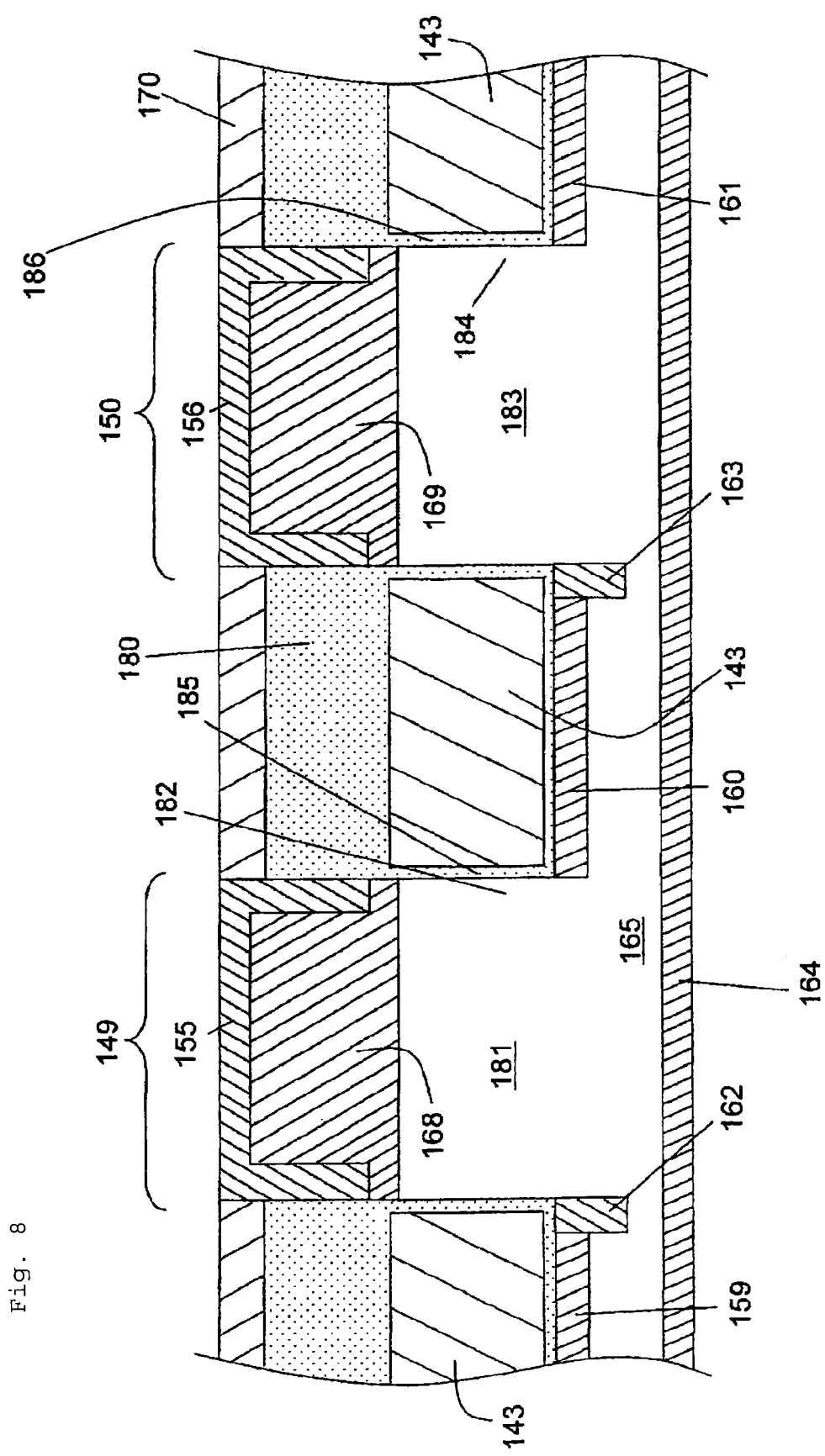
FIG. 8 illustrates a cross-sectional view taken from line $X_2$-$X_2$' shown in FIG. 7.
Figure 9:
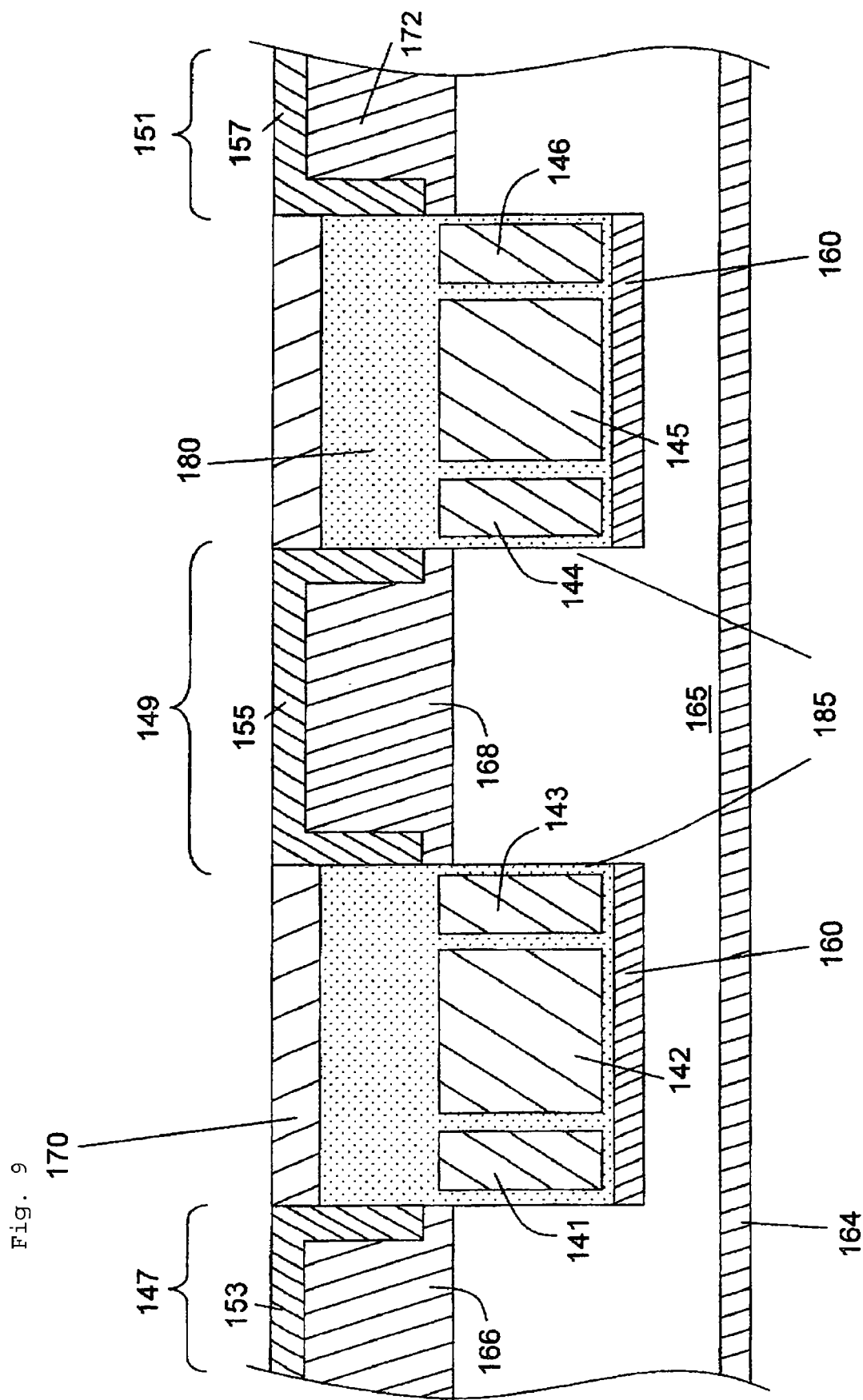
FIG. 9 illustrates a cross-sectional view taken from line $Y_2$-$Y_2$' shown in FIG. 7.

FIG. 8 is a cross-sectional view taken from line $X_2$-$X_2'$ shown in FIG. 7, and FIG. 9 is a cross-sectional view taken from line $Y_2$-$Y_2'$ in FIG. 7.

The solid-state image sensor of the second row and the first column in FIG. 7 will be described. A p-type well region 165 is formed on an n-type substrate 164, and a p-type pillar-shaped semiconductor layer 181 is further formed on the p-type well region 165. An n-type photoelectric conversion region 168 in which the amount of charge is changed by light is formed on the top of a p-type pillar-shaped semiconductor layer 181, and a p$^+$-type region 155 is further formed on the surface of the n-type photoelectric conversion region 168, while being spaced apart from the top end of the p-type pillar-shaped semiconductor layer 181 by a predetermined distance. The photodiode 149 is formed of the p$^+$-type region 155 and the n-type photoelectric conversion region 168. Moreover, the transfer electrodes 143 and 144 are formed on the side of the p-type pillar-shaped semiconductor layer via a gate insulating film 185. The n-type CCD channel region 160 is formed below the transfer electrodes 143 and 144. A read channel 182 is formed in a region between the n-type photoelectric conversion region 168 on the top of the p-type pillar-shaped semiconductor layer 181 and the n-type CCD channel region 160.

Subsequently, the solid-state image sensor of the second row and the second column in FIG. 7 will be described. The p-type well region 165 is formed on the n-type substrate 164, and a p-type pillar-shaped semiconductor layer 183 is further formed on the p-type well region 165. An n-type photoelectric conversion region 169 in which the amount of charge is changed by light is formed on the top of the p-type pillar-shaped semiconductor layer 183, and a p$^+$-type region 156 is further formed on the surface of the n-type photoelectric conversion region 169, while being spaced apart from the top end of the p-type pillar-shaped semiconductor layer 183 by a predetermined distance. The light receiving portion (photodiode) 150 is formed of the p$^+$-type region 156 and the n-type photoelectric conversion region 169. Moreover, the transfer electrodes 143 and 144 are formed on the side of the p-type pillar-shaped semiconductor layer 183 via a gate insulating film 186. The n-type CCD channel region 161 is formed below the transfer electrodes 143 and 144. A read channel 184 is formed in a region between the n-type photoelectric conversion region 169 on the top of the p-type pillar-shaped semiconductor layer 183 and the n-type CCD channel region 161.

A metal shield film 170 is connected to the p+-type regions 155, 156, 153 and 157. An oxide film 180 is formed as an interlayer insulation film between respective components. Moreover, p+-type isolation regions 162 and 163 are provided so that the n-type CCD channel regions may be isolated not to contact with each other. Although the p+-type isolation regions 162 and 163 are provided along the axes of the first and second columns of solid-state image sensors and the outer edges of the p-type pillar-shaped semiconductor layers in the present embodiment, p+-type isolation region should just be provided so that adjacent n-type CCD channel regions may not contact with each other, for example, the p+-type isolation regions 162 and 163 can also be displacedly arranged in an $X_2$ direction from the arrangement shown in FIG. 7. Incidentally, the photodiode 151 is composed of the p+-type region 157 and the n-type photoelectric conversion region 172.

As described above, the transfer electrodes 141, 142, 143, 144, 145, and 146 extending in the row direction are provided between the p-type pillar-shaped semiconductor layers of the adjacent rows of solid-state image sensors so as to pass through between the p-type pillar-shaped semiconductor layers of the adjacent rows of solid-state image sensor, and they are arranged spaced apart from each other by a predetermined distance. The transfer electrodes 141, 143, 144, and 146 adjacent to the p-type pillar-shaped semiconductor layers are formed on the side of the p-type pillar-shaped semiconductor layers via the gate oxide film. The transfer electrodes 141, 142, 143, 144, 145, and 146 constitute a vertical charge transfer device (VCCD) for vertically transferring the signal charges generated in the photodiodes along with the n-type CCD channel regions. The VCCD is driven in three phases (Φ1-Φ3), and the signal charges generated in the photodiodes are vertically transferred by the three transfer electrodes driven with different phases with respect to each photodiode. Although the VCCD is driven in three phases in the present embodiment, it will be clear to those skilled in the art that the VCCD can also have the configuration driven by any appropriate number of phases.

Figure 10:
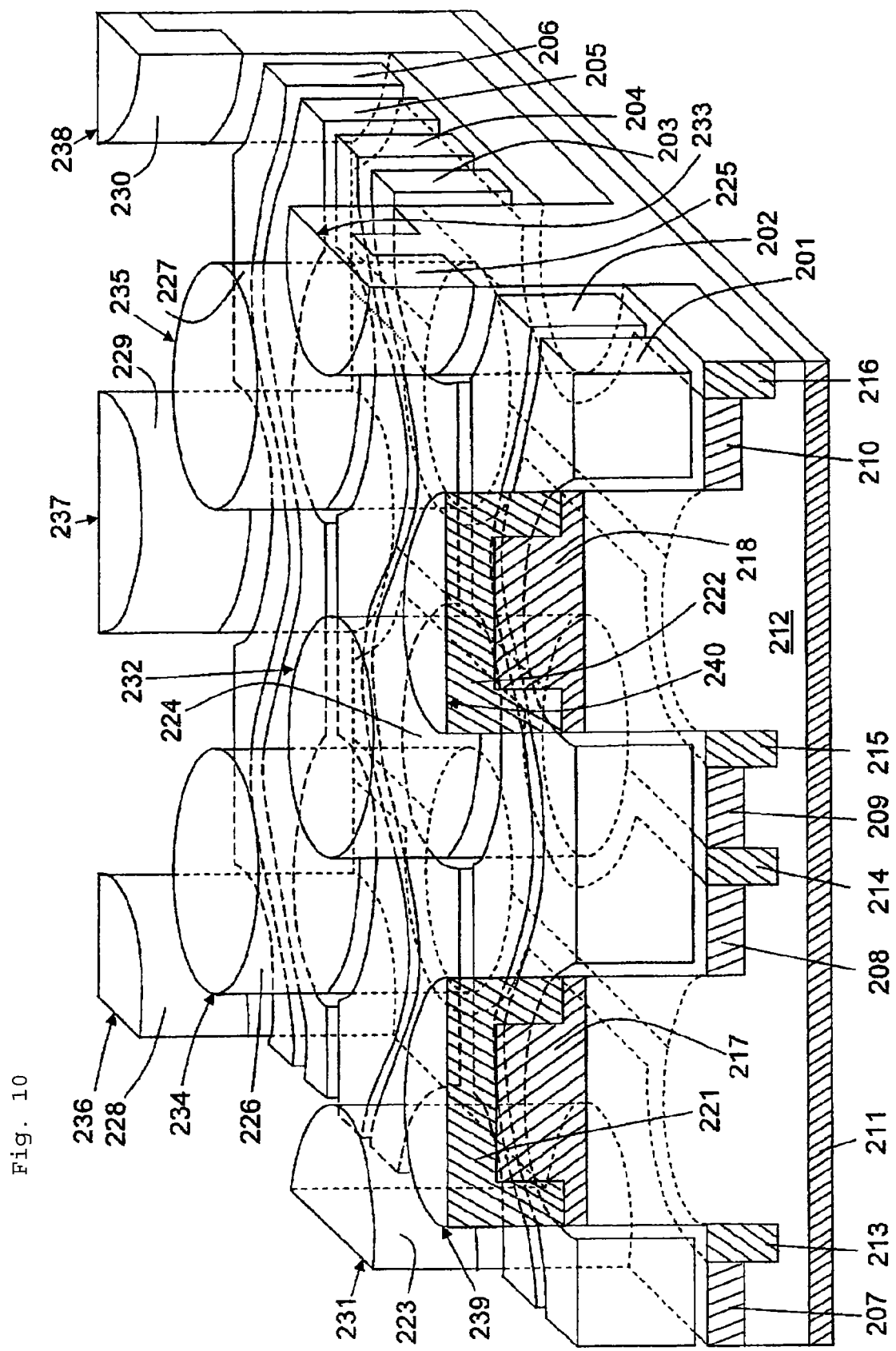
FIG. 10 illustrates a perspective view of CCD solid-state image sensors arranged in honeycomb form.
Figure 11:
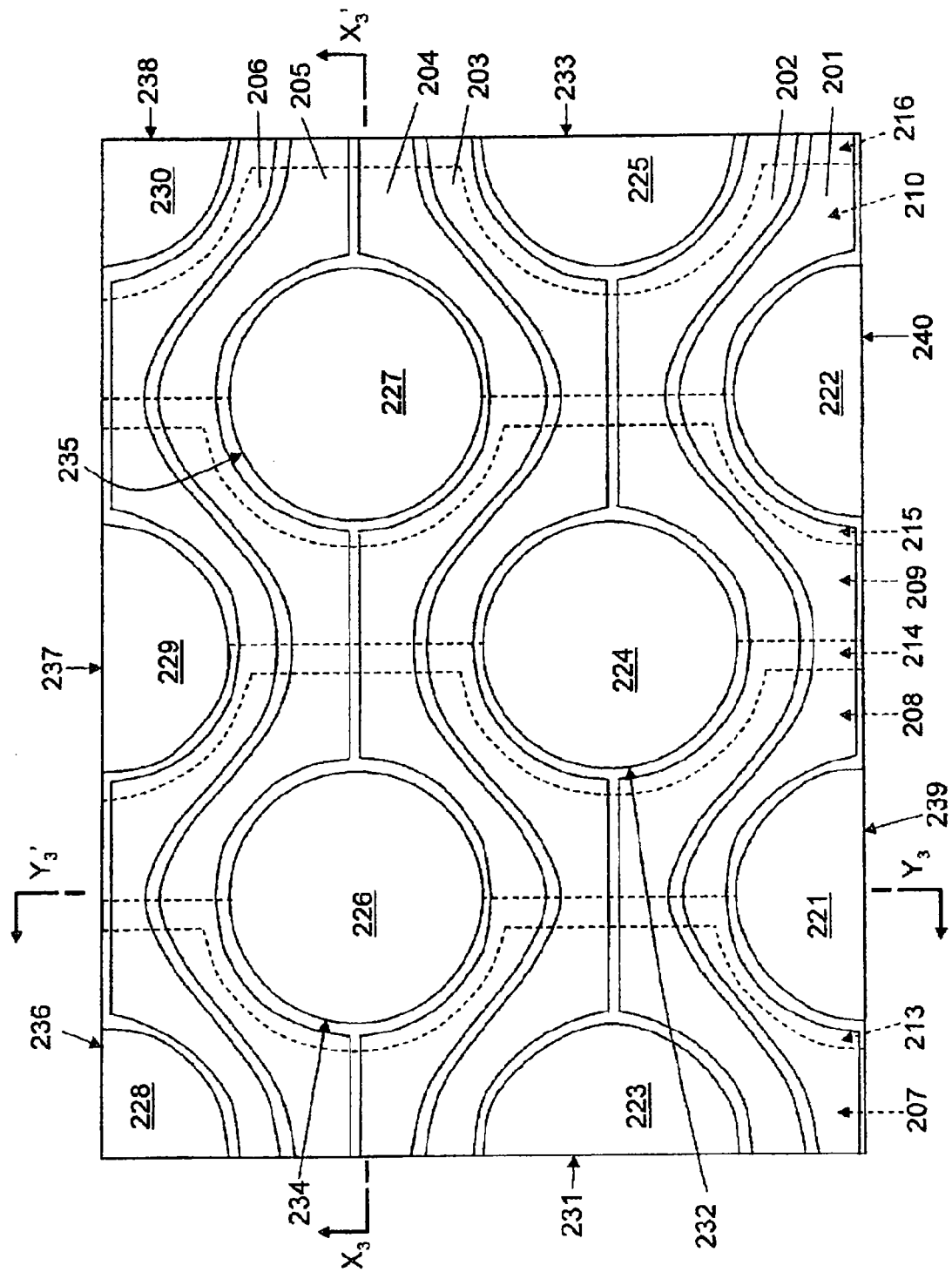
FIG. 11 illustrates a plan view of CCD solid-state image sensors arranged in honeycomb form.

Although the solid-state image sensing device in which the CCD solid-state image sensors are arranged in matrix form has been shown in the second embodiment, the CCD solid-state image sensors may be arranged in honeycomb form as shown in FIGS. 10, 11, 12, and 13. Accordingly, as the third embodiment of the present invention, the solid-state image sensing device in which the CCD solid-state image sensors of the first embodiment are arranged in honeycomb form will be described. A perspective view and a plan view of a part of the solid-state image sensing device in which the CCD solid-state image sensors are arranged in honeycomb form are shown in FIGS. 10 and 11, respectively.

In FIGS. 10 and 11, the solid-state image sensors having photodiodes (PDs) 236 and 231 respectively including p+-type regions 228 and 223 are arranged on the semiconductor substrate, at a predetermined spacing (a vertical pixel pitch VP) and in the vertical ($Y_3$-$Y_3$') direction (column direction) (the first column of solid-state image sensors). While being spaced apart from the first column of solid-state image sensors by one half of the same spacing (horizontal pixel pitch HP) as the vertical pixel pitch, the solid-state image sensor having photodiodes 234 and 239 respectively including p+-type regions 226 and 221 are arranged in the vertical direction at the same predetermined spacing as that of the first column of solid-state image sensors and they are displacedly arranged by one half of the vertical pixel pitch VP in the vertical direction with respect to the first column of solid-state image sensors (the second column of solid-state image sensors). Furthermore, while being spaced apart from the second column of solid-state image sensors by one half of the same spacing (horizontal pixel pitch HP) as the vertical pixel pitch, the solid-state image sensor having photodiodes 237 and 232 respectively including p+-type regions 229 and 224 are arranged in the vertical direction at the same predetermined spacing as that of the first column of solid-state image sensors and they are displacedly arranged by one half of the vertical pixel pitch VP in the vertical direction with respect to the second column of solid-state image sensors (a third column of solid-state image sensors). Similarly, while being spaced apart from the third column of solid-state image sensors by one half of the same spacing (horizontal pixel pitch HP) as the vertical pixel pitch, the solid-state image sensor having photodiodes 235 and 240 respectively including p+-type regions 227 and 222 are arranged in the vertical direction at the same spacing as that of the first column of solid-state image sensors, and they are displacedly arranged by one half of the vertical pixel pitch VP in the vertical direction with respect to the third column of solid-state image sensors (a fourth column of solid-state image sensors); and while being spaced apart from the fourth column of solid-state image sensors by one half of the same spacing (horizontal pixel pitch HP) as the vertical pixel pitch, the solid-state image sensor having photodiodes 238 and 233 respectively including p+-type regions 230 and 225 are arranged in the vertical direction at the same spacing as that of the first column of solid-state image sensors, and they are displacedly arranged by one half of the vertical pixel pitch VP in the vertical direction with respect to the fourth column of solid-state image sensors (a fifth column of solid-state image sensors). In other words, the solid-state image sensors having the photodiodes 236, 231, 234, 239, 237, 232, 235, 240, 238, and 233 are arranged in so-called honeycomb form.

Between the p-type pillar-shaped semiconductor layer of the first column of solid-state image sensors and the p-type pillar-shaped semiconductor layers of the second column of solid-state image sensors which are adjacently arranged, the n-type CCD channel region 207 which reads and vertically transfers the signal charges generated in the photodiodes 236 and 231 is provided. Similarly, between the p-type pillar-shaped semiconductor layer of the second column of solid-state image sensors, and the p-type pillar-shaped semiconductor layer of the third column of solid-state image sensors, between the p-type pillar-shaped semiconductor layer of the third column of solid-state image sensors, and the p-type pillar-shaped semiconductor layer of the fourth column of solid-state image sensors, and between the p-type pillar-shaped semiconductor layer of the fourth column of solid-state image sensors, and the p-type pillar-shaped semiconductor layer of the fifth column of solid-state image sensors, an n-type CCD channel region 208 which reads and vertically transfers the signal charges generated in the photodiodes 234 and 239, an n-type CCD channel region 209 which reads and vertically transfers the signal charges generated in the photodiodes 237 and 232, and an n-type CCD channel region 210 which reads and vertically transfers the signal charges generated in the photodiodes 235 and 240 are provided, respectively. These n-type CCD channel regions are extended in the vertical direction while snaking through between the p-type pillar-shaped semiconductor layers arranged in honeycomb form. Moreover, p+-type isolation regions 213, 214, 215, and 216 are provided so that the n-type CCD channel regions may be isolated not to contact with each other. Although the p+-type isolation regions 213, 214, 215, and 216 are provided along the axes of the first through fifth columns of solid-state image sensors and the outer edges of the p-type pillar-shaped semiconductor layers in the present embodiment, the p$^+$-type isolation region should just be provided so that adjacent n-type CCD channel regions may not contact with each other, for example, the p$^+$-type isolation regions 213, 214, 215, and 216 can also be displacedly arranged in the X$_3$ direction from the arrangement shown in FIG. 11.

Between the p-type pillar-shaped semiconductor layers of the first row of solid-state image sensors in which the solid-state image sensors having the photodiodes 236, 237, and 238 are arranged in the horizontal (X$_3$-X$_3$') direction (in the row direction), and the p-type pillar-shaped semiconductor layers of the second row of solid-state image sensors in which the solid-state image sensors having the photodiodes 234 and 235 are arranged in the horizontal direction, transfer electrodes 206 and 205 are provided. Similarly, between the p-type pillar-shaped semiconductor layers of the second row of solid-state image sensor in which the solid-state image sensors having the photodiodes 234 and 235 are arranged in the horizontal direction, and the p-type pillar-shaped semiconductor layers of the third row of solid-state image sensors in which the solid-state image sensors having the photodiodes 231, 232, and 233 are arranged in the horizontal direction, and between the p-type pillar-shaped semiconductor layers of the third row of solid-state image sensors in which the solid-state image sensors having the photodiodes 231, 232, and 233 are arranged in the horizontal direction, and the p-type pillar-shaped semiconductor layers of the fourth row of solid-state image sensors in which the solid-state image sensors having the photodiodes 239 and 240 are arranged in the horizontal direction, transfer electrodes 204, 203 and the transfer electrodes 202, 201 are provided, respectively. These transfer electrodes are extended in the horizontal direction while snaking through between the p-type pillar-shaped semiconductor layers arranged in honeycomb form.

Incidentally, the photodiode 239 is composed of the p$^+$-type region 221 and the n-type photoelectric conversion region 217, and the photodiode 240 is composed of the p$^+$-type region 222 and the n-type photoelectric conversion region 218.

Figure 12:
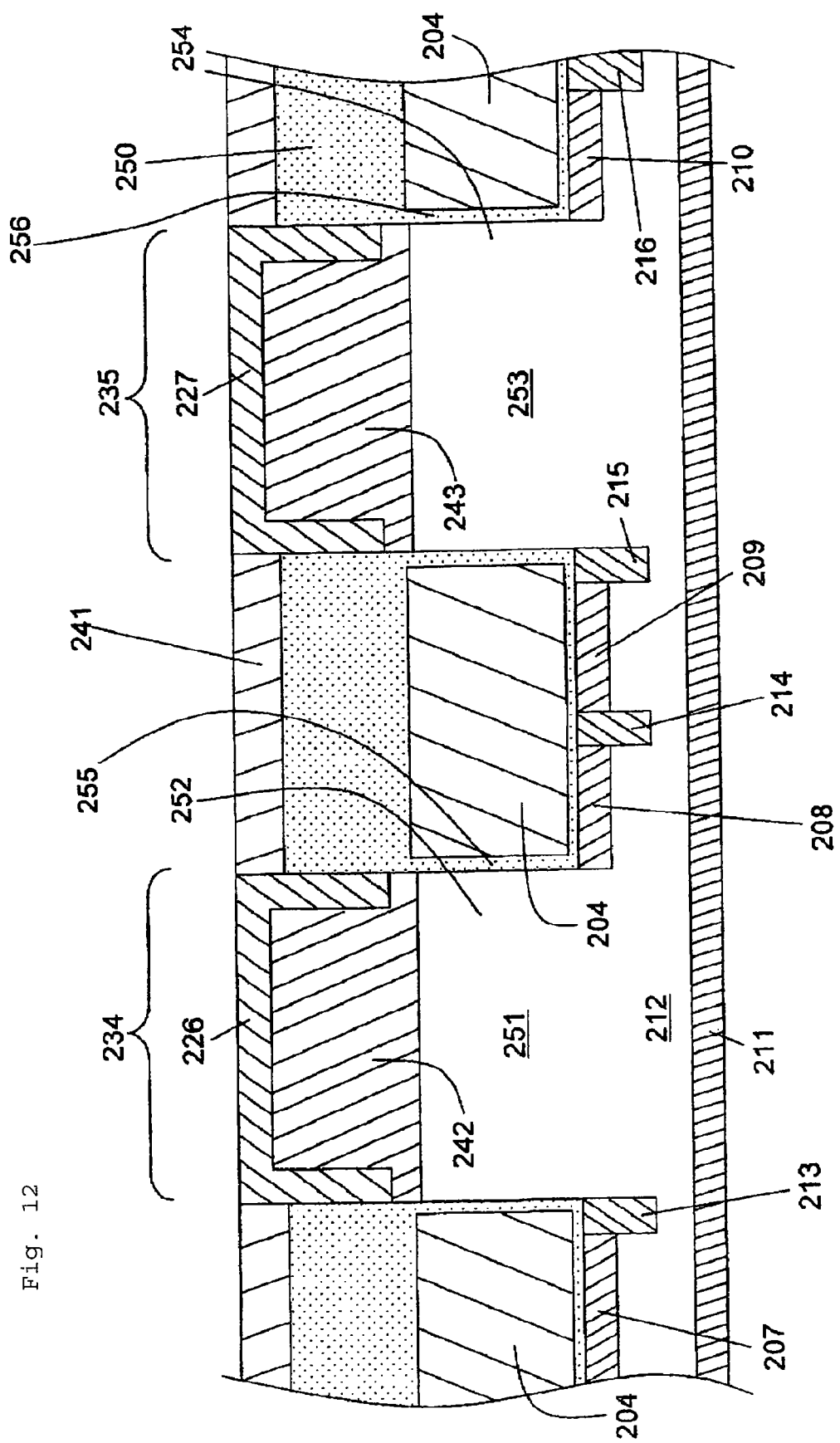
FIG. 12 illustrates a cross-sectional view taken from line $X_3$-$X_3$' shown in FIG. 11.
Figure 13:
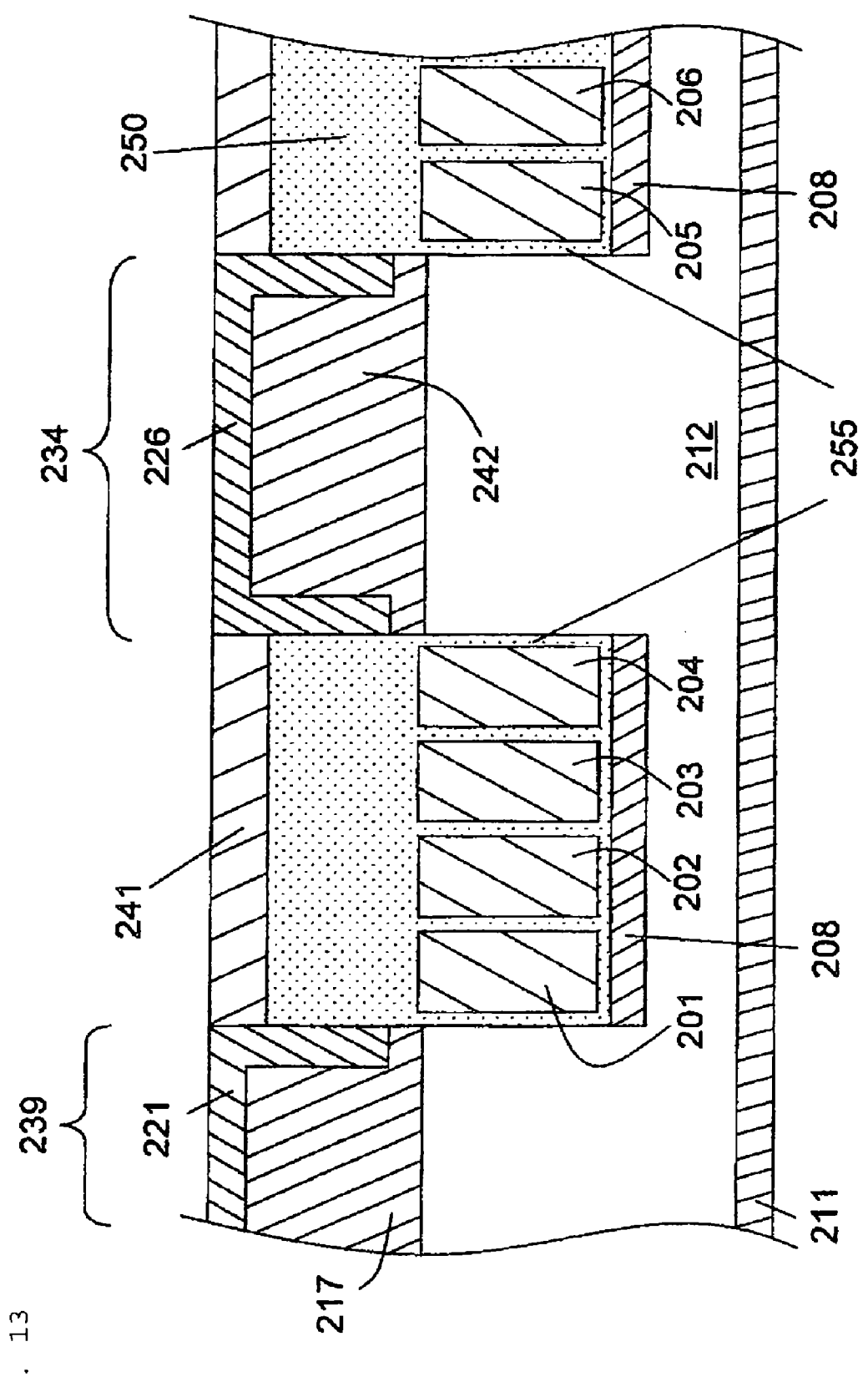
FIG. 13 illustrates a cross-sectional view taken from line $Y_3$-$Y_3$' shown in FIG. 11.

FIG. 12 is a cross-sectional view taken from line X$_3$-X$_3$' in FIG. 11, while FIG. 13 is a cross-sectional view taken from line Y$_3$-Y$_3$' in FIG. 11.

The solid-state image sensor of the second row and the first column in FIG. 11 will be described. A p-type well region 212 is formed on an n-type substrate 211, and a p-type pillar-shaped semiconductor layer 251 is further formed on the p-type well region 212. An n-type photoelectric conversion region 242 in which the amount of charge is changed by light is formed on the top of a p-type pillar-shaped semiconductor layer 251, and the p$^+$-type region 226 is further formed on the surface of the n-type photoelectric conversion region 242, while being spaced apart from the top end of the p-type pillar-shaped semiconductor layer 251 by a predetermined distance. Moreover, the transfer electrodes 204 and 205 are formed on the side of the p-type pillar-shaped semiconductor layer 251 via a gate insulating film 255. The n-type CCD channel region 208 is formed below the transfer electrodes 204 and 205. A read channel 252 is formed in a region between the n-type photoelectric conversion region 242 on the top of the p-type pillar-shaped semiconductor layer 251 and the n-type CCD channel region 208.

Subsequently, the solid-state image sensor of the second row and the fourth column in FIG. 11 will be described. The p-type well region 212 is formed on the n-type substrate 211, and a p-type pillar-shaped semiconductor layer 253 is further formed on the p-type well region 212. An n-type photoelectric conversion region 243 in which the amount of charge is changed by light is formed on the top of the p-type pillar-shaped semiconductor layer 253, and the p$^+$-type region 227 is further formed on the surface of the n-type photoelectric conversion region 243, while being spaced apart from the top end of the p-type pillar-shaped semiconductor layer by a predetermined distance. Moreover, the transfer electrodes 204 and 205 are formed on the side of the p-type pillar-shaped semiconductor layer 253 via a gate insulating film 256. The n-type CCD channel region 210 is formed below the transfer electrodes 204 and 205. A read channel 254 is formed in a region between the n-type photoelectric conversion region 243 on the top of the p-type pillar-shaped semiconductor layer 253 and the n-type CCD channel region 210.

Moreover, p$^+$-type isolation regions 213, 214, 215, and 216 are provided so that the n-type CCD channel regions may be isolated not to contact with each other. Although the p$^+$-type isolation regions 213, 214, 215, and 216 are provided along the axes of the first through fifth columns of solid-state image sensor and the outer edges of the p-type pillar-shaped semiconductor layers in the present embodiment, the p$^+$-type isolation region should just be provided so that adjacent n-type CCD channel regions may not contact with each other, for example, the p$^+$-type isolation regions 213, 214, 215, and 216 can also be displacedly arranged in an X$_3$ direction from the arrangement shown in FIG. 11.

As described above, the transfer electrodes 201, 202, 203, 204, 205, and 206 extending in the row direction are provided between the p-type pillar-shaped semiconductor layers of the adjacent rows of solid-state image sensors so as to pass through between the p-type pillar-shaped semiconductor layers of the adjacent rows of solid-state image sensors. The transfer electrodes 201, 202, 203, 204, 205, and 206 are formed on the sides of the p-type pillar-shaped semiconductor layers via the gate oxide film, and are arranged spaced apart from each other by a predetermined distance. The transfer electrodes 201, 202, 203, 204, 205, and 206 constitute a vertical charge transfer device (VCCD) for vertically transferring the signal charges generated in the photodiodes along with the n-type CCD channel regions. The VCCD is driven in four phases (Φ1-Φ4), and the signal charges generated in the photodiodes are vertically transferred by the four transfer electrodes driven with different phases with respect to each photodiode. Although the VCCD is driven in four phases in the present those skilled in the art that the VCCD can also have the configuration driven by any appropriate number of phases.

The surfaces of the transfer electrodes 201, 202, 203, 204, 205, and 206 are covered with an oxide film (planarized film) 250, and a metal shield film 241 is formed on the oxide film. The metal shield film 241 has a circle-like opening portion for every photodiode as a light transmission portion for transmitting light received by the p$^+$-type region acting as a light receiving portion.

Note herein that, although it is not shown in the drawing, a color filter, a microlens, and the like are formed on the above metal shield film via a protective film or the planarized film in a manner similar to that of a usual CCD image sensor.

Next, an example of a manufacturing process for forming the solid-state image sensor and the solid-state image sensing device according to the embodiment of the present invention will be described with reference to FIGS. 14 through 30.

In FIGS. 14 through 30, drawing symbols (a) and (b) correspond to the X$_2$-X$_2$' cross-section and the Y$_2$-Y$_2$' cross-section of FIG. 7, respectively.

Figure 14A:
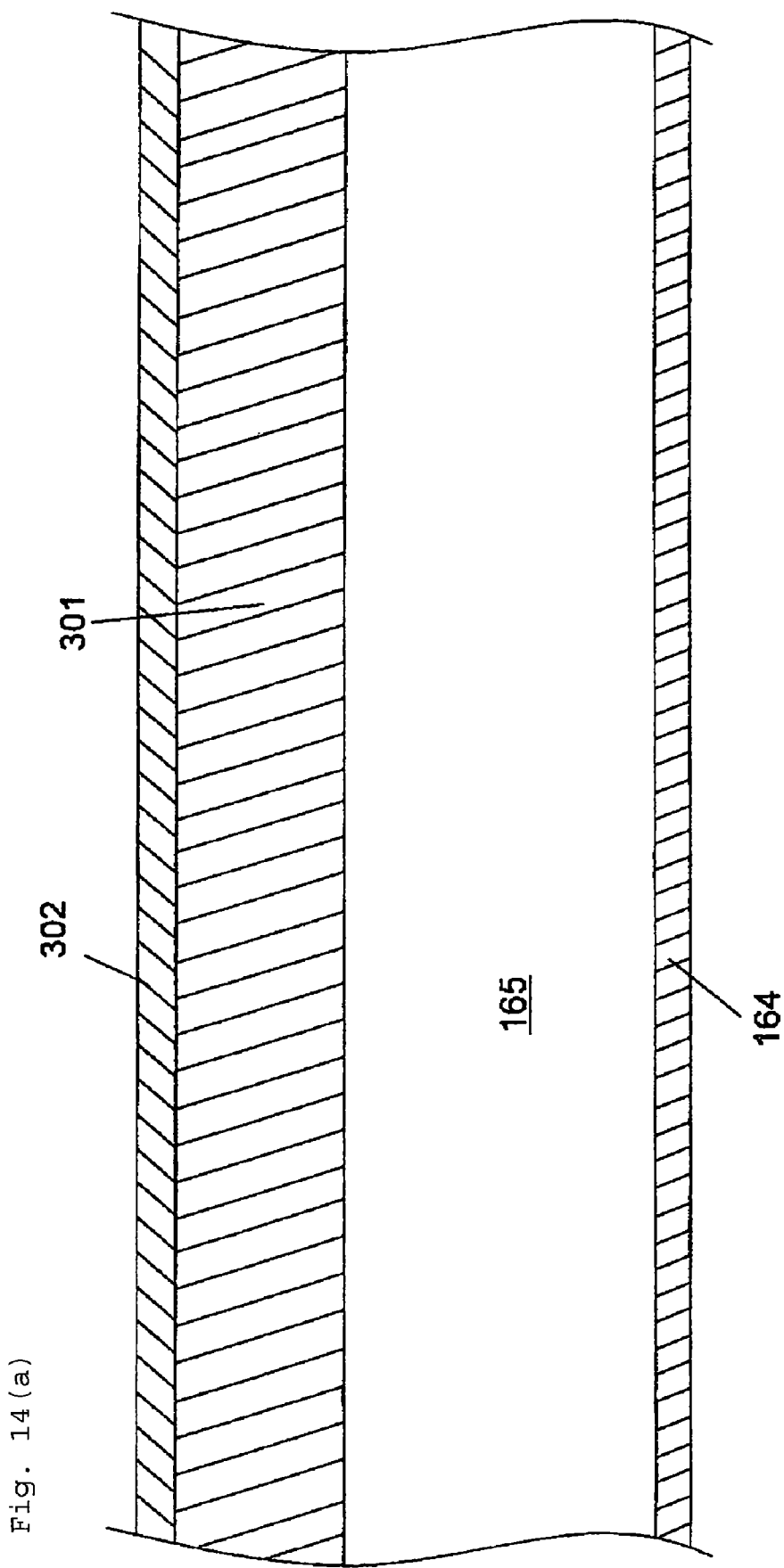
FIG. 14($a$) illustrates a cross-sectional process view taken from $X_2$-$X_2$', showing an example of production of the solid-state image sensor in accordance with the present invention.
FIG. 14(b) illustrates a cross-sectional process view taken from $Y_2$-$Y_2'$, showing the example of production of the solid-state image sensor in accordance with the present invention.
Figure 14B:
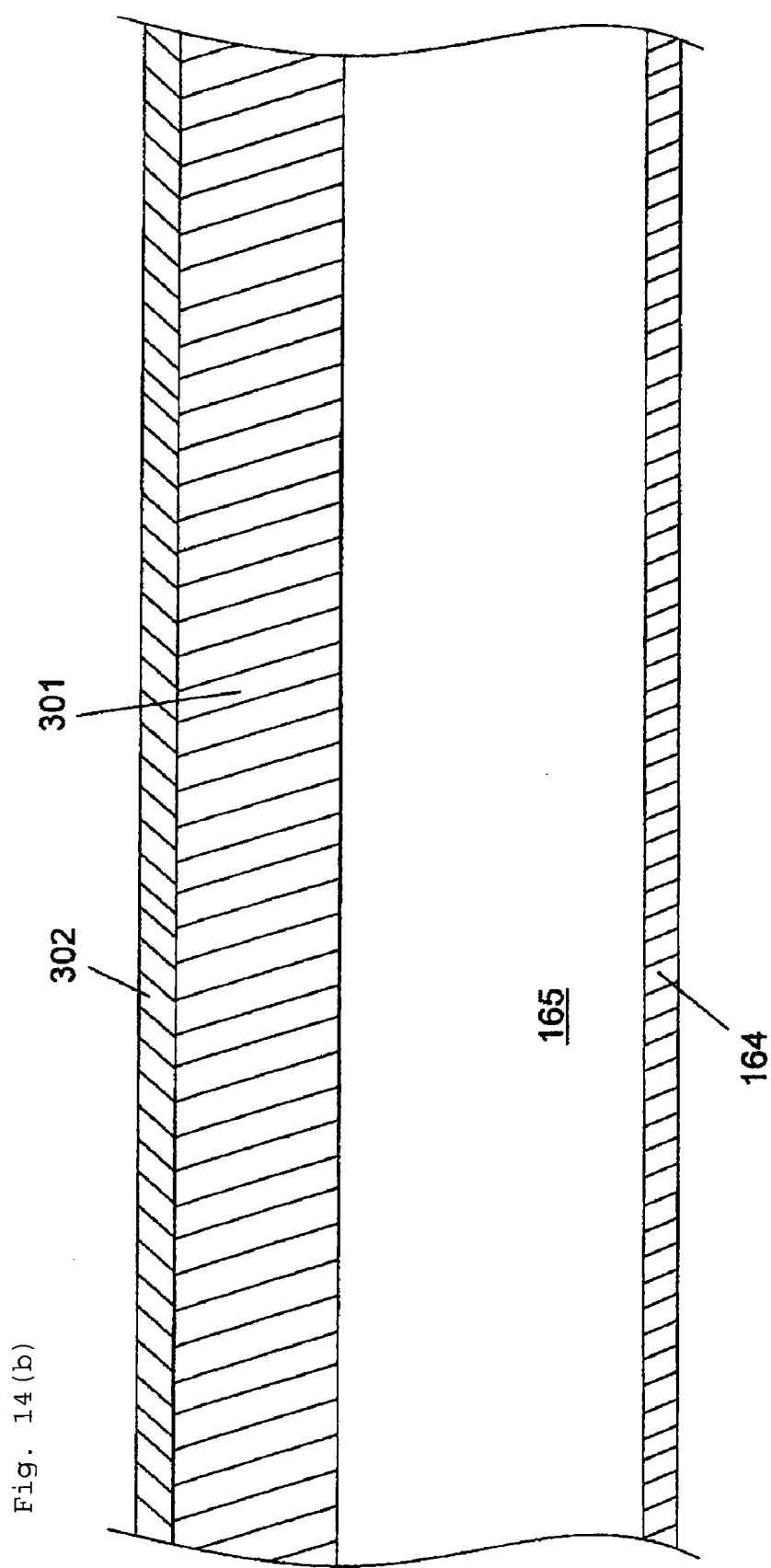

The p-type well region 165 is formed on the silicon n-type substrate 164, and the n-type region 301 is formed on the top of the p-type well region 165, and then the p⁺-type region 302 is formed (FIGS. 14(a) and 14(b)).

Figure 15A:
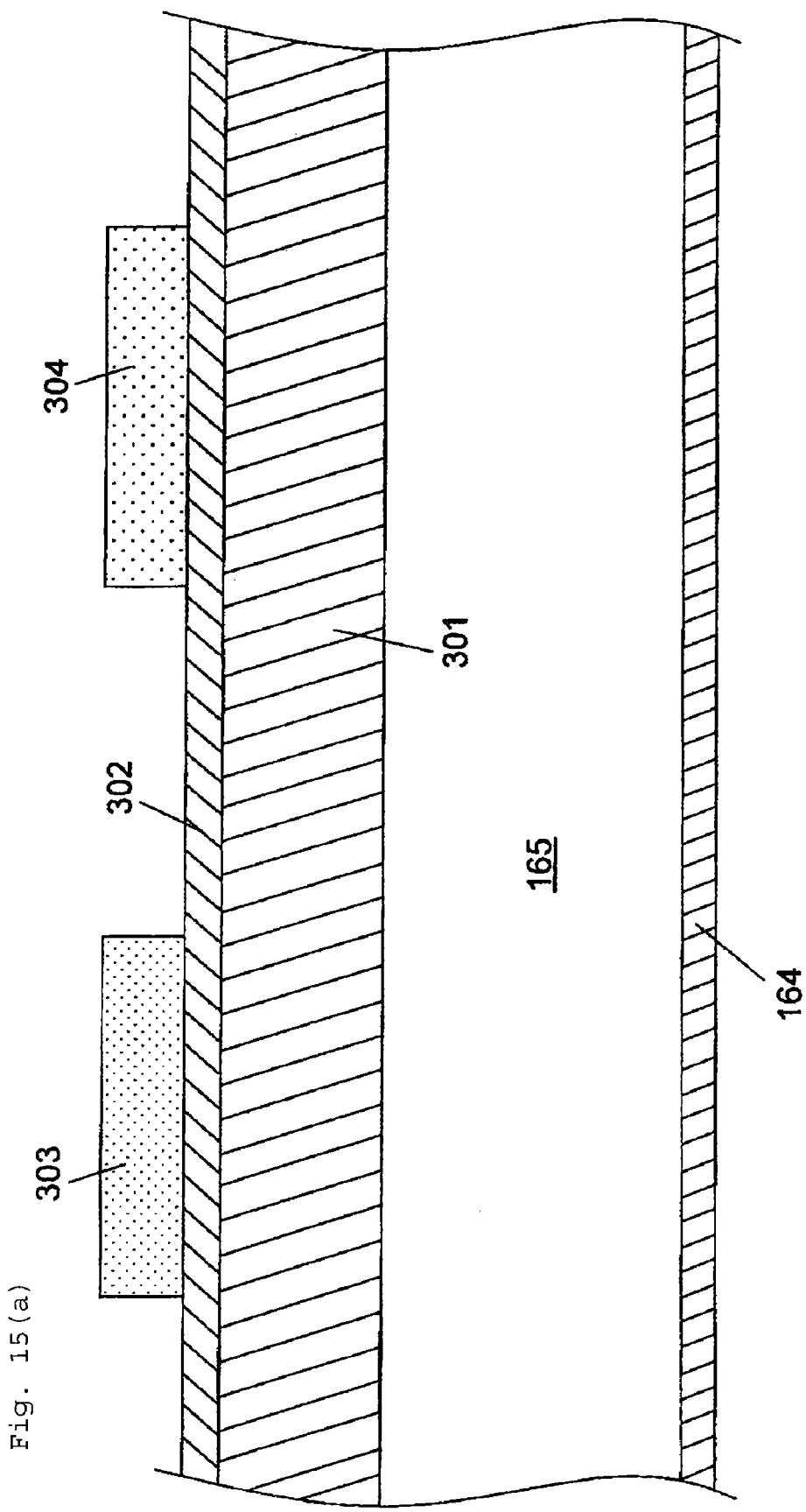
FIG. 15(a) illustrates a cross-sectional process view taken from $X_2$-$X_2'$, showing the example of production of the solid-state image sensor in accordance with the present invention.
Figure 15B:
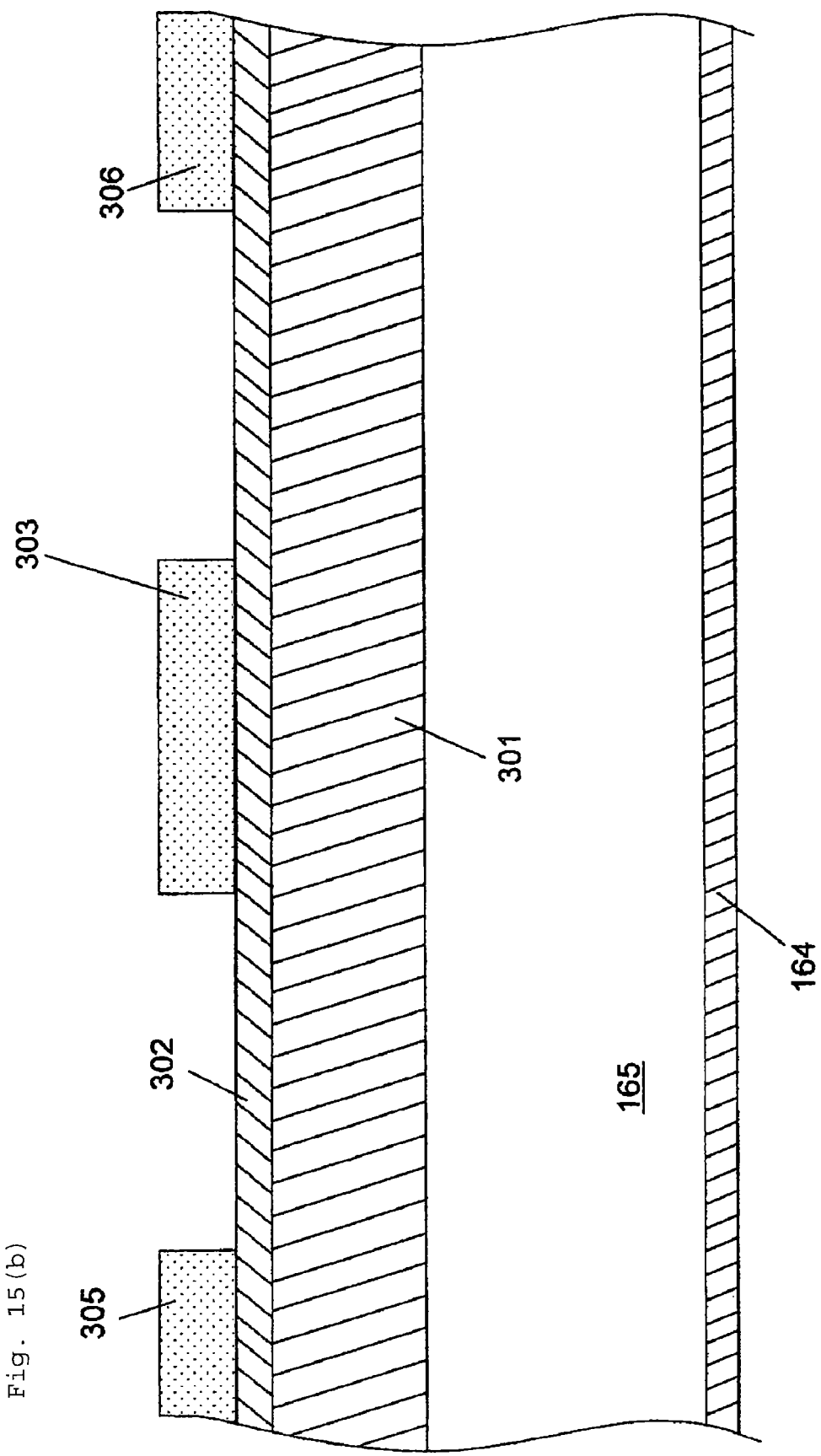
FIG. 15(b) illustrates a cross-sectional process view taken from $Y_2$-$Y_2'$, showing the example of production of the solid-state image sensor in accordance with the present invention.

Next, an oxide film is deposited and etching is performed to form oxide film masks 303, 304, 305, and 306 (FIGS. 15(a) and 15(b)).

Figure 16A:
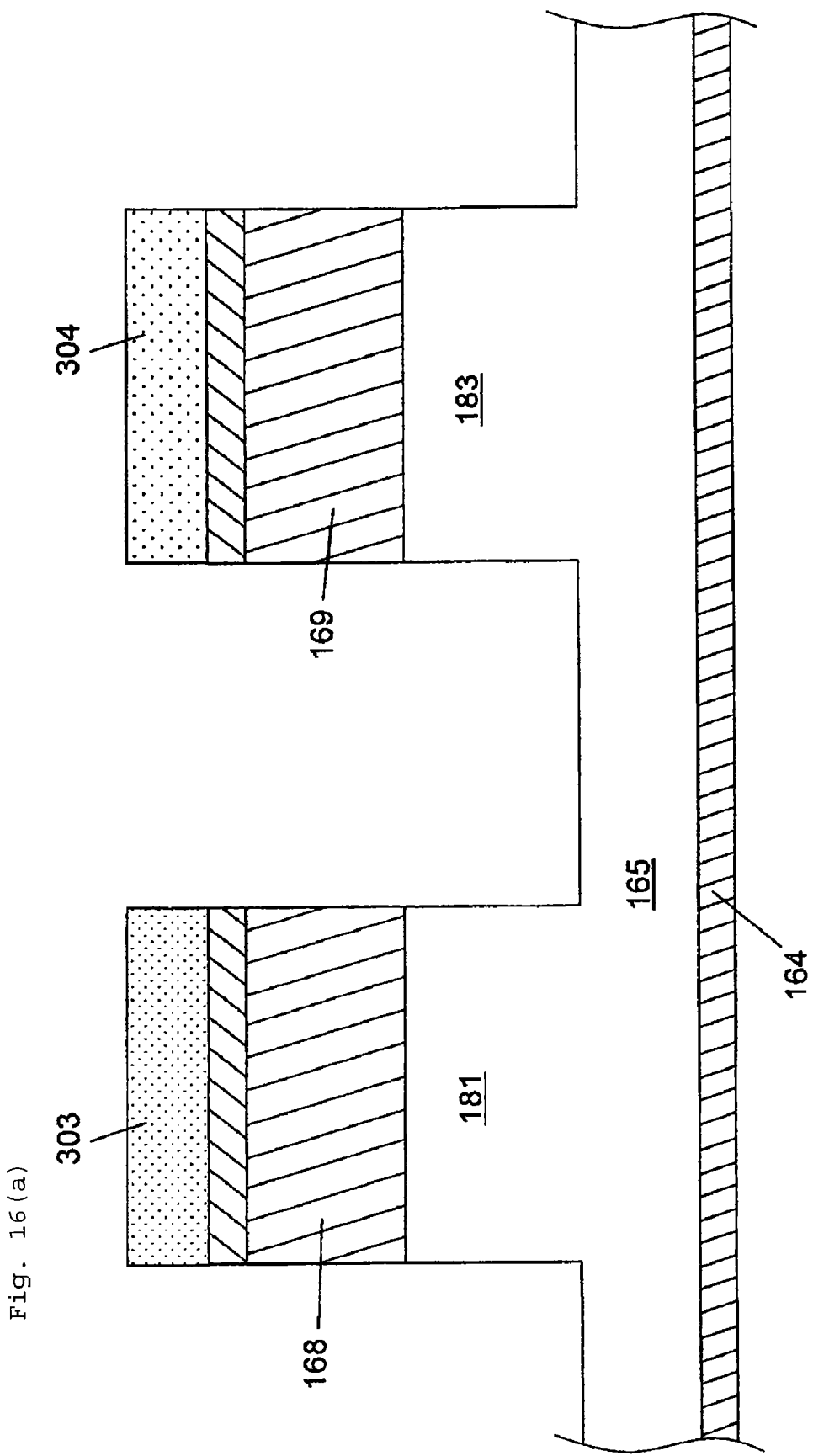
FIG. 16(a) illustrates a cross-sectional process view taken from $X_2$-$X_2'$, showing the example of production of the solid-state image sensor in accordance with the present invention.
Figure 16B:
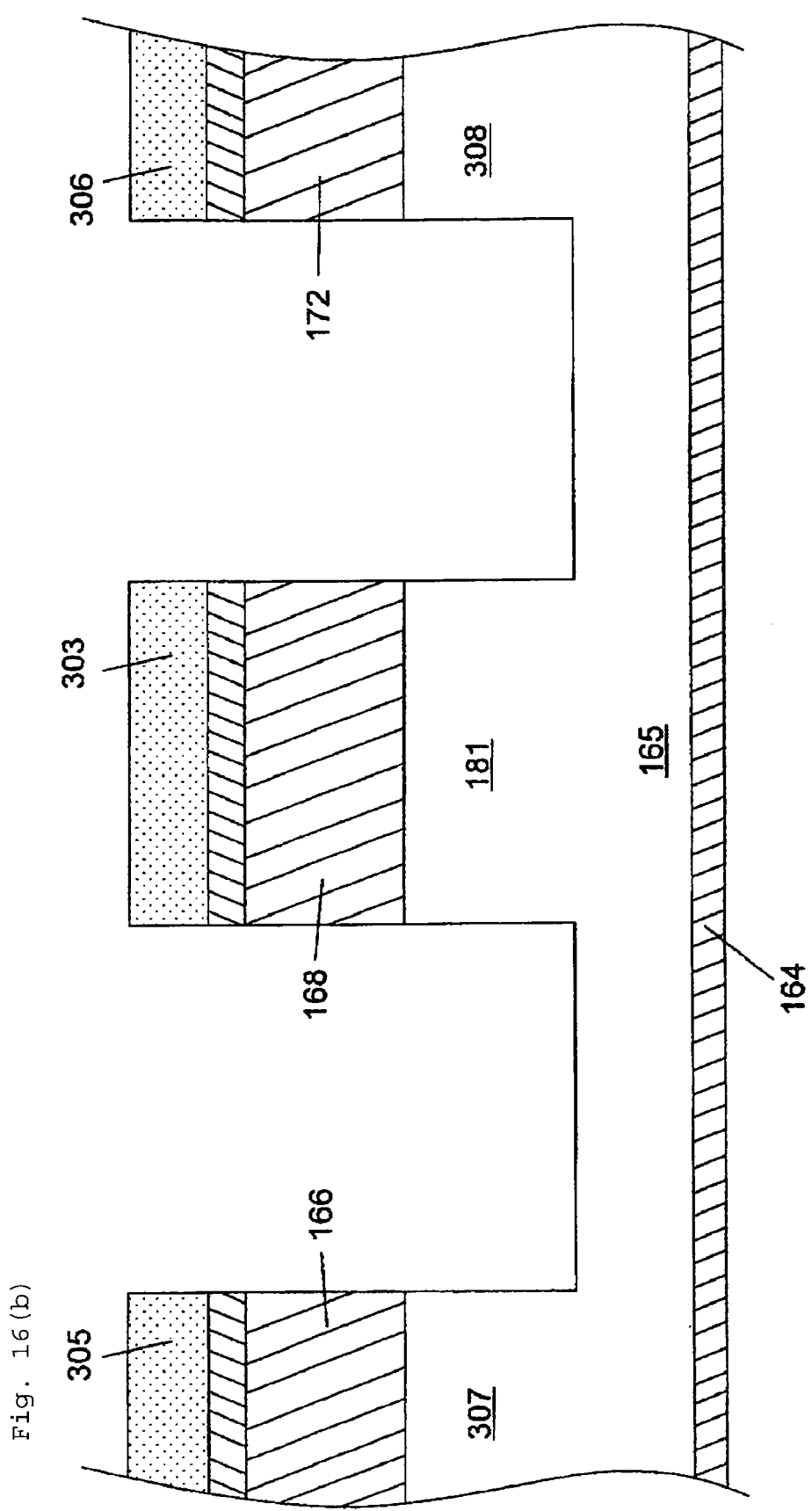
FIG. 16(b) illustrates a cross-sectional process view taken from $Y_2$-$Y_2'$, showing the example of production of the solid-state image sensor in accordance with the present invention.

Silicon is etched to form the pillar-shaped semiconductors 181, 183, 307, and 308 (FIGS. 16(a) and 16(b)).

Figure 17A:
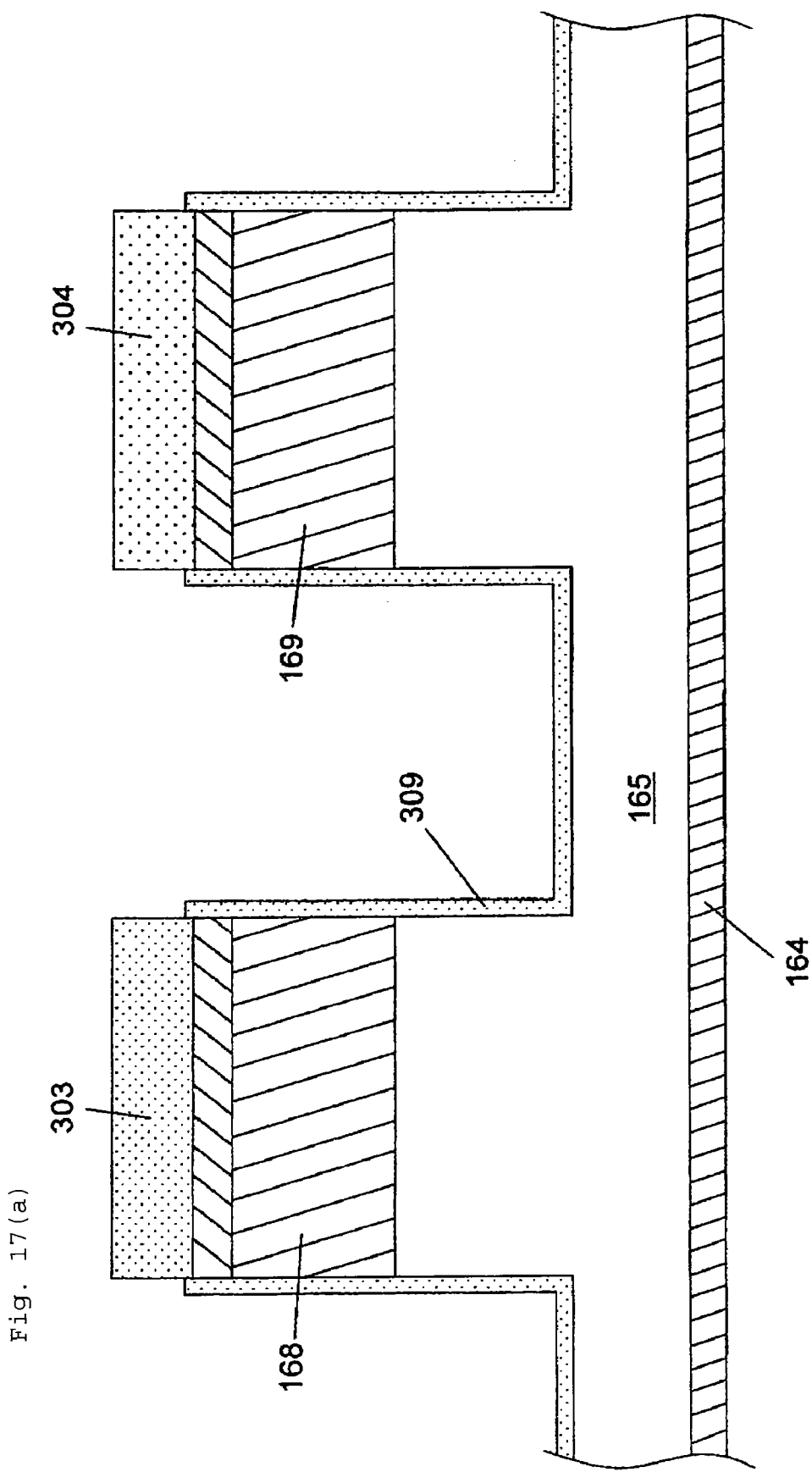
FIG. 17(a) illustrates a cross-sectional process view taken from $X_2$-$X_2'$, showing the example of production of the solid-state image sensor in accordance with the present invention.
Figure 17B:
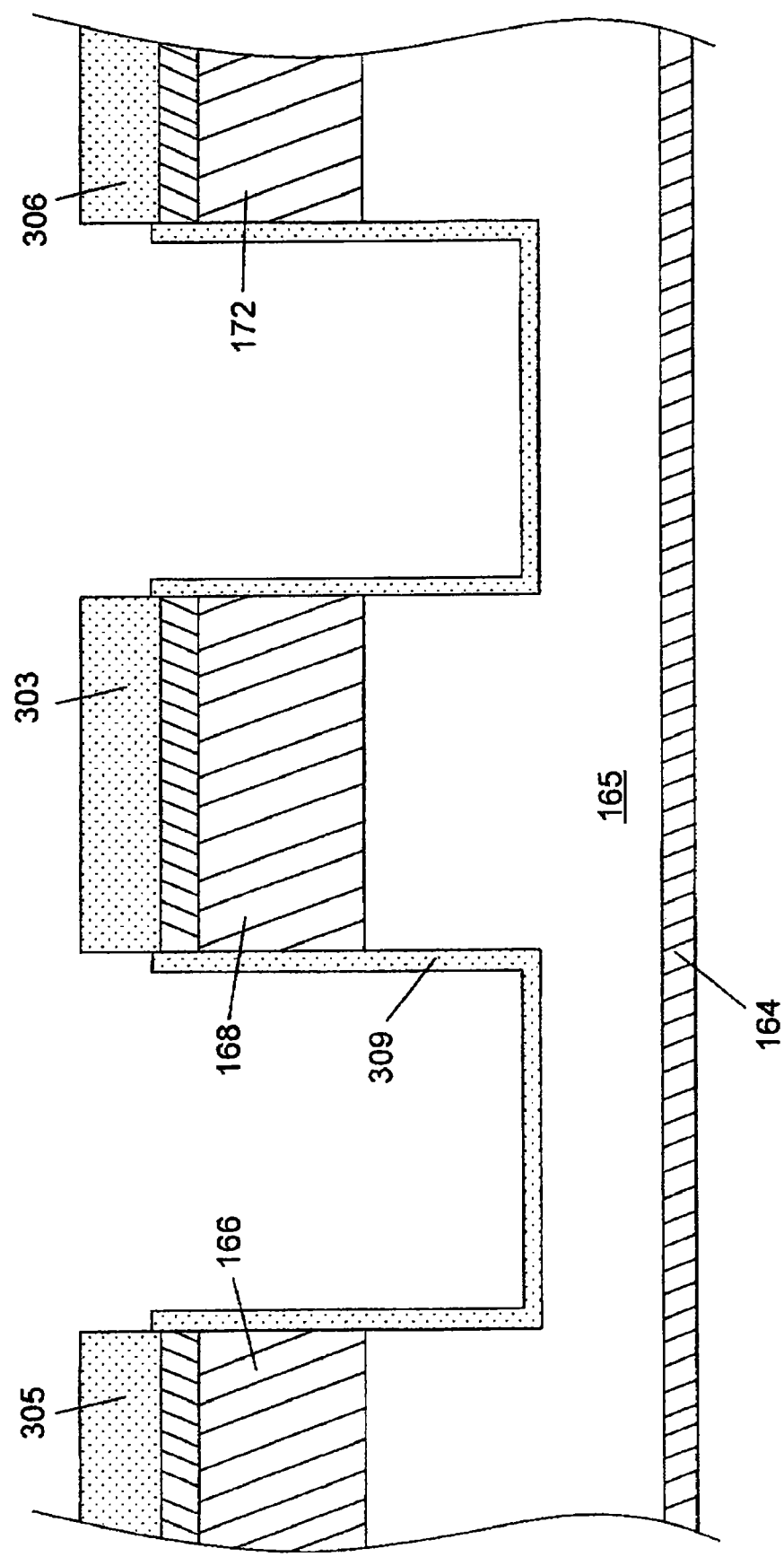
FIG. 17(b) illustrates a cross-sectional process view taken from $Y_2$-$Y_2'$, showing the example of production of the solid-state image sensor in accordance with the present invention.

An oxide film 309 is formed for ion channeling prevention upon ion implantation (FIGS. 17(a) and 17(b)).

Figure 18A:
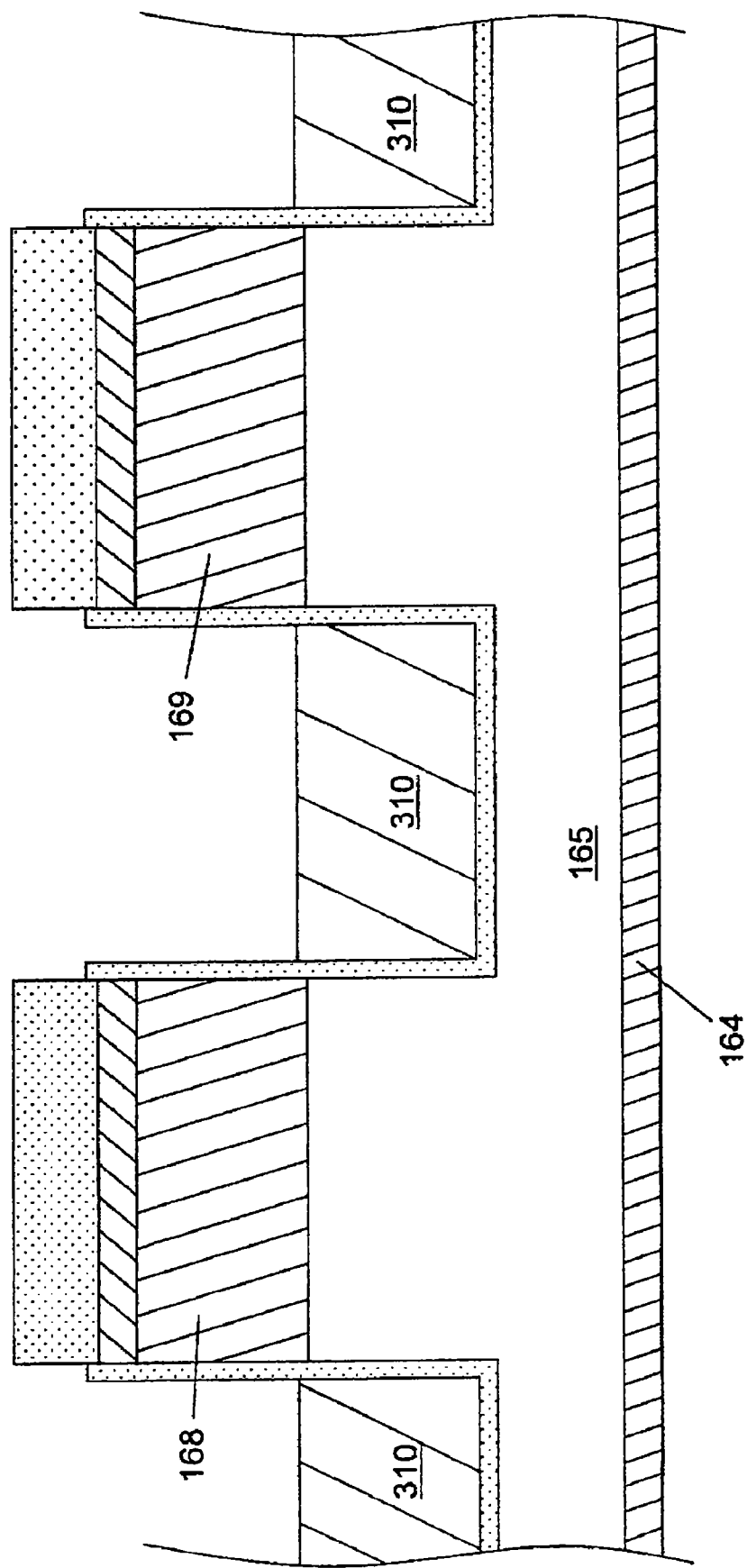
FIG. 18(a) illustrates a cross-sectional process view taken from $X_2$-$X_2'$, showing the example of production of the solid-state image sensor in accordance with the present invention.
Figure 18B:
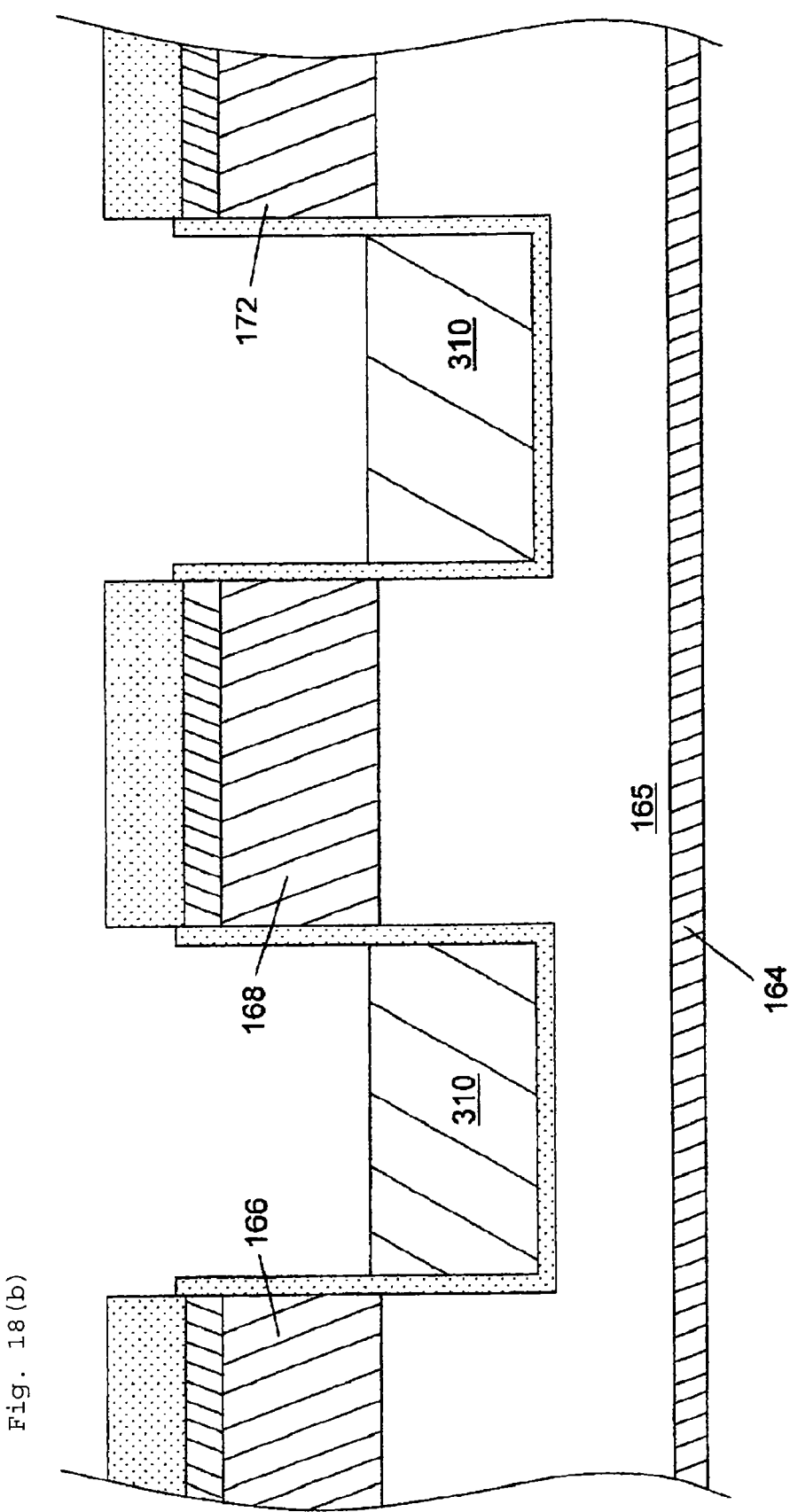
FIG. 18(b) illustrates a cross-sectional process view taken from $Y_2$-$Y_2'$, showing the example of production of the solid-state image sensor in accordance with the present invention.

A polysilicon 310 is deposited so as to be used as a mask upon ion implantation and is planarized, and etchback is performed thereto (FIGS. 18(a) and 18(b)). Other materials such as a photoresist or the like may also be used as a mask material.

Figure 19A:
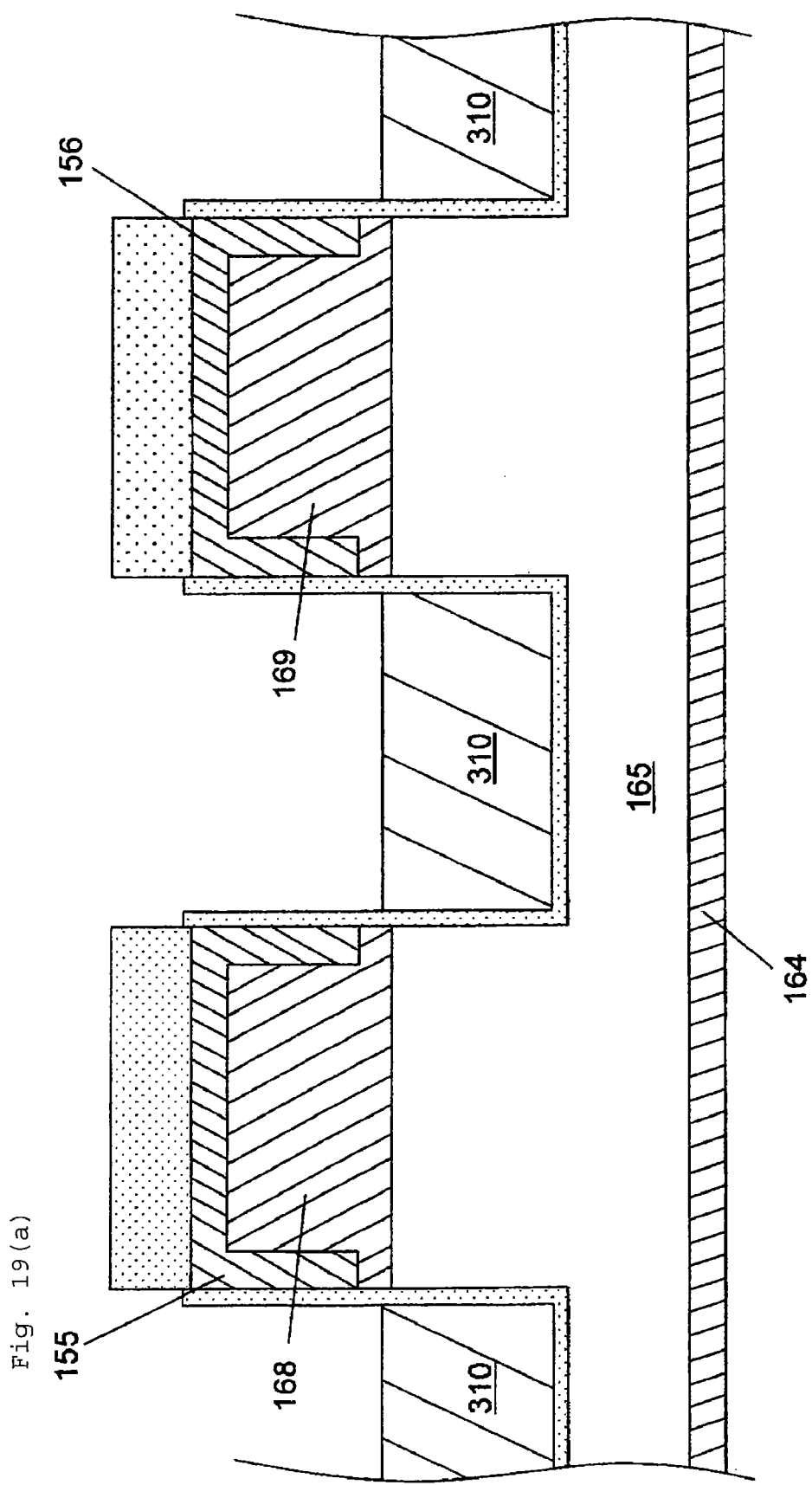
FIG. 19(a) illustrates a cross-sectional process view taken from $X_2$-$X_2'$, showing the example of production of the solid-state image sensor in accordance with the present invention.
Figure 19B:
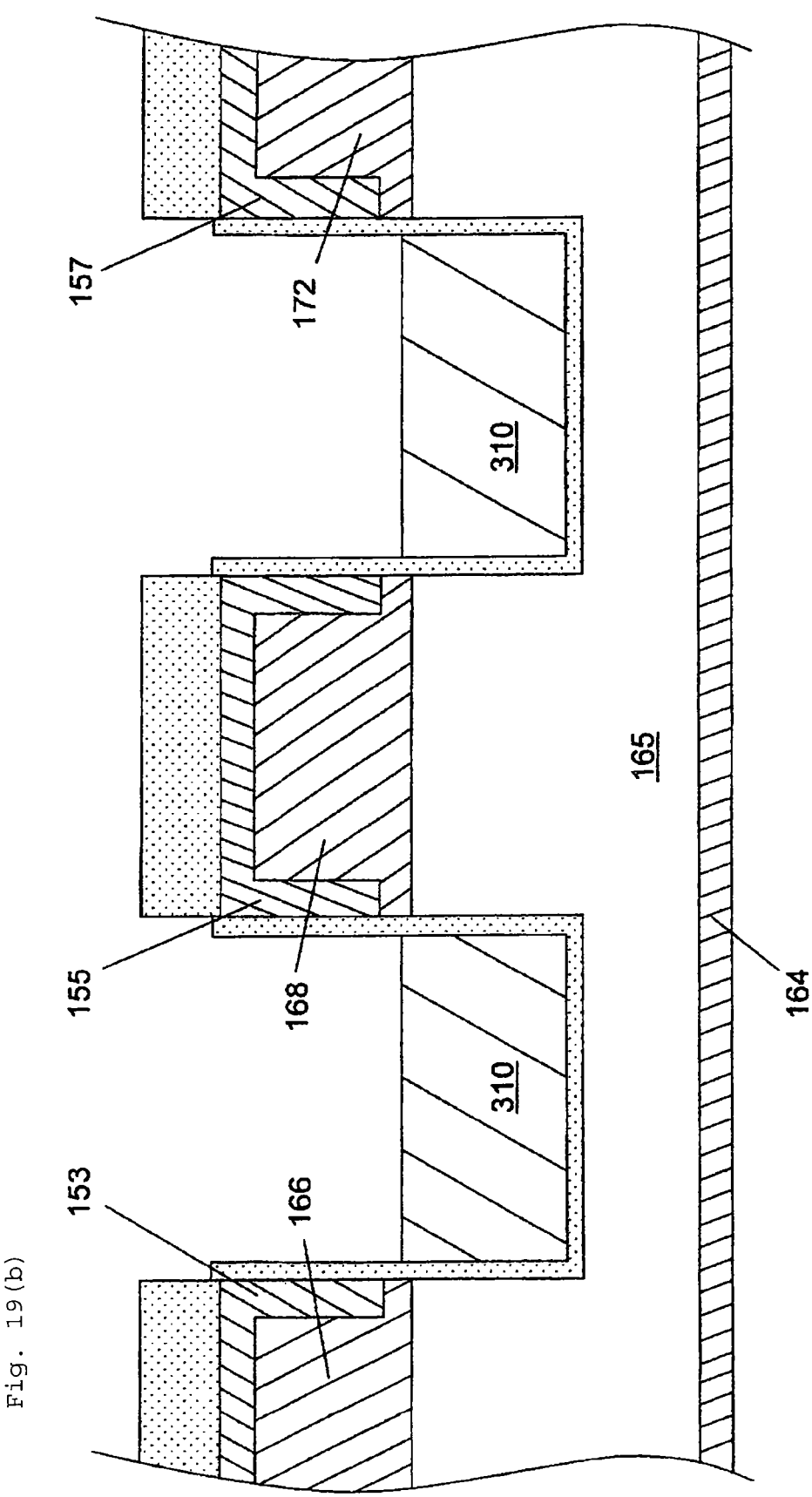
FIG. 19(b) illustrates a cross-sectional process view taken from $Y_2$-$Y_2'$, showing the example of production of the solid-state image sensor in accordance with the present invention.

Ion implantation is performed to form the p⁺-type regions 155, 156, 153, and 157 (FIGS. 19(a) and 19(b)).

Figure 20A:
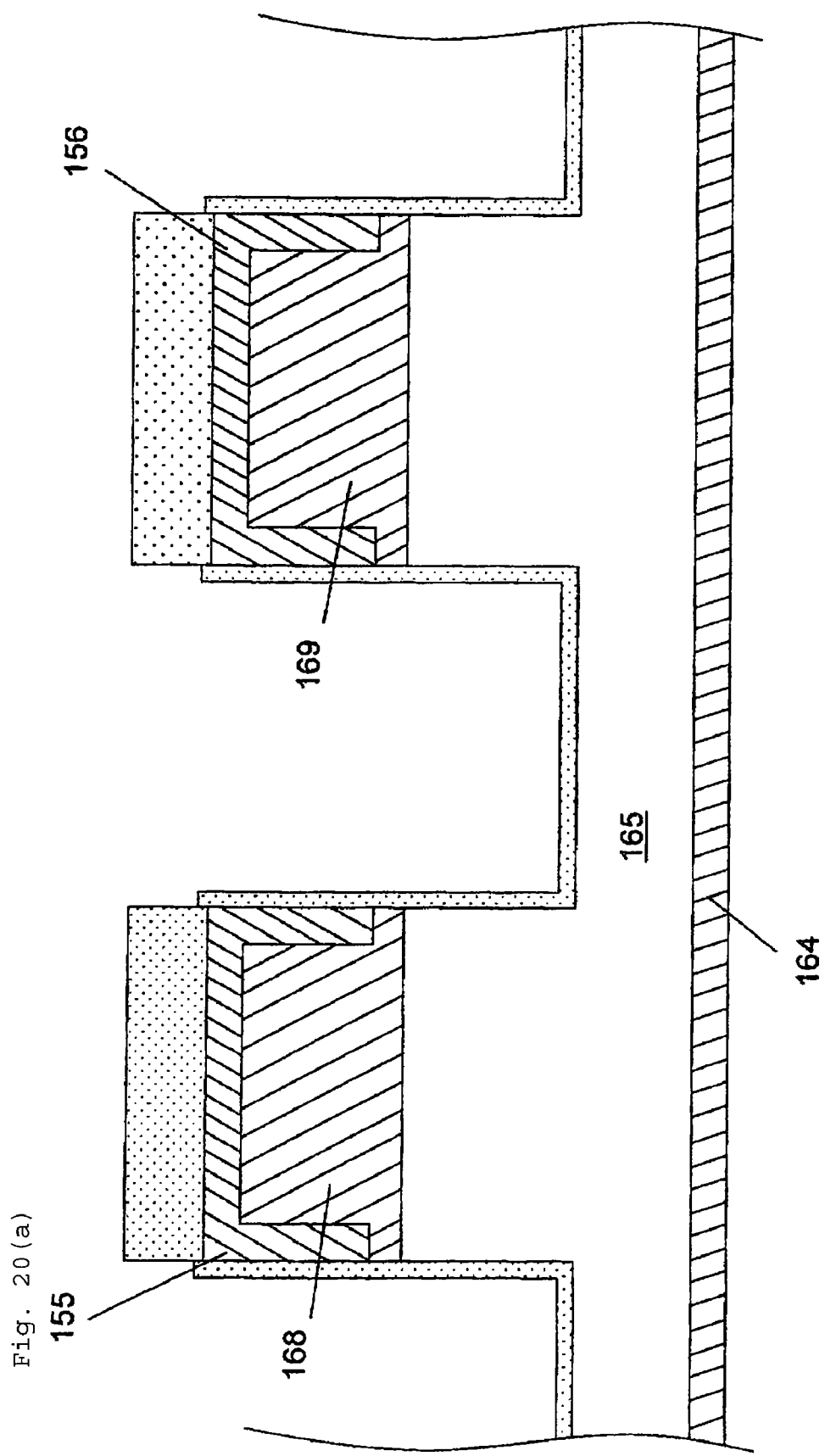
FIG. 20(a) illustrates a cross-sectional process view taken from $X_2$-$X_2'$, showing the example of production of the solid-state image sensor in accordance with the present invention.
Figure 20B:
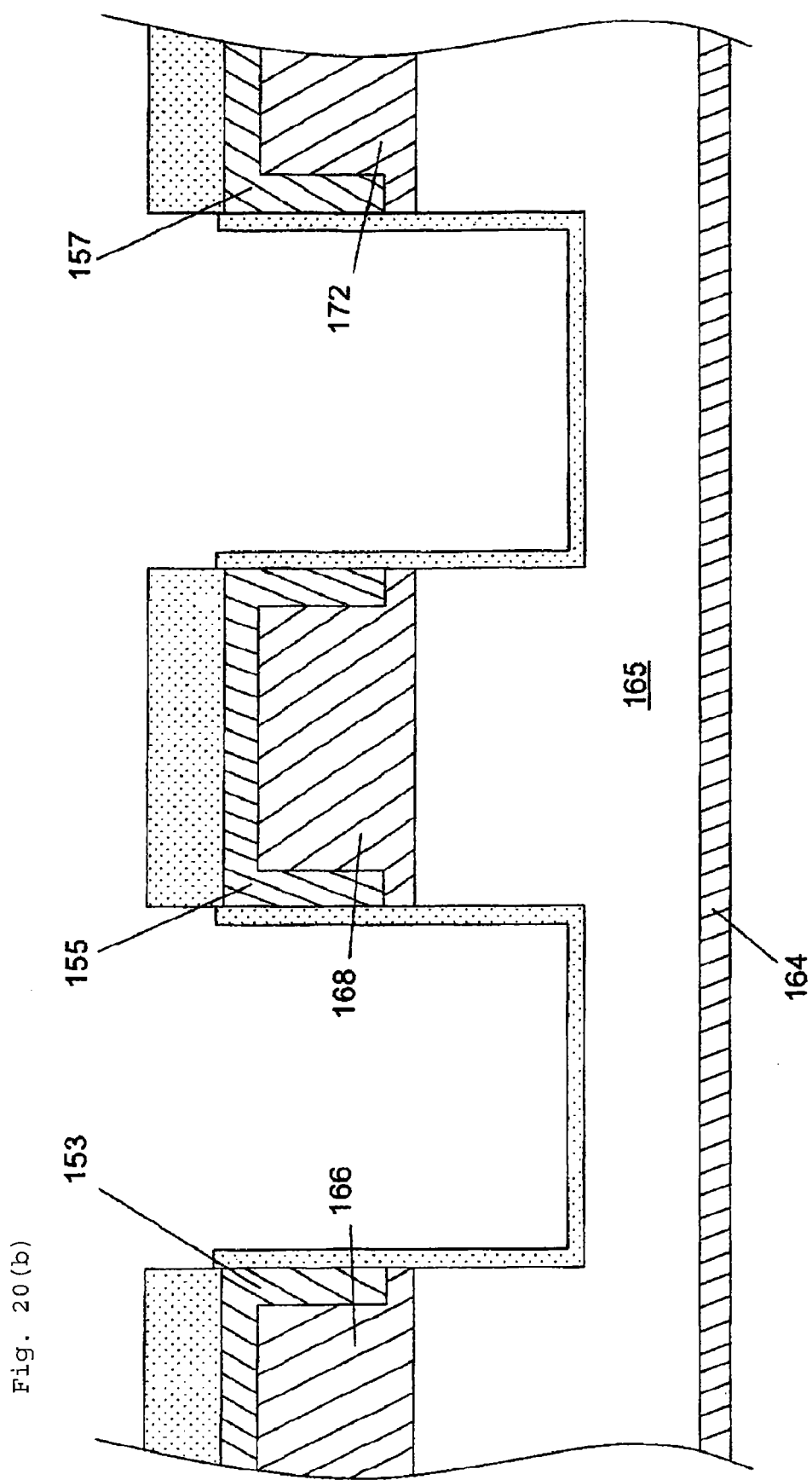
FIG. 20(b) illustrates a cross-sectional process view taken from $Y_2$-$Y_2'$, showing the example of production of the solid-state image sensor in accordance with the present invention.

The polysilicon is etched and removed (FIGS. 20(a) and 20(b)).

Figure 21A:
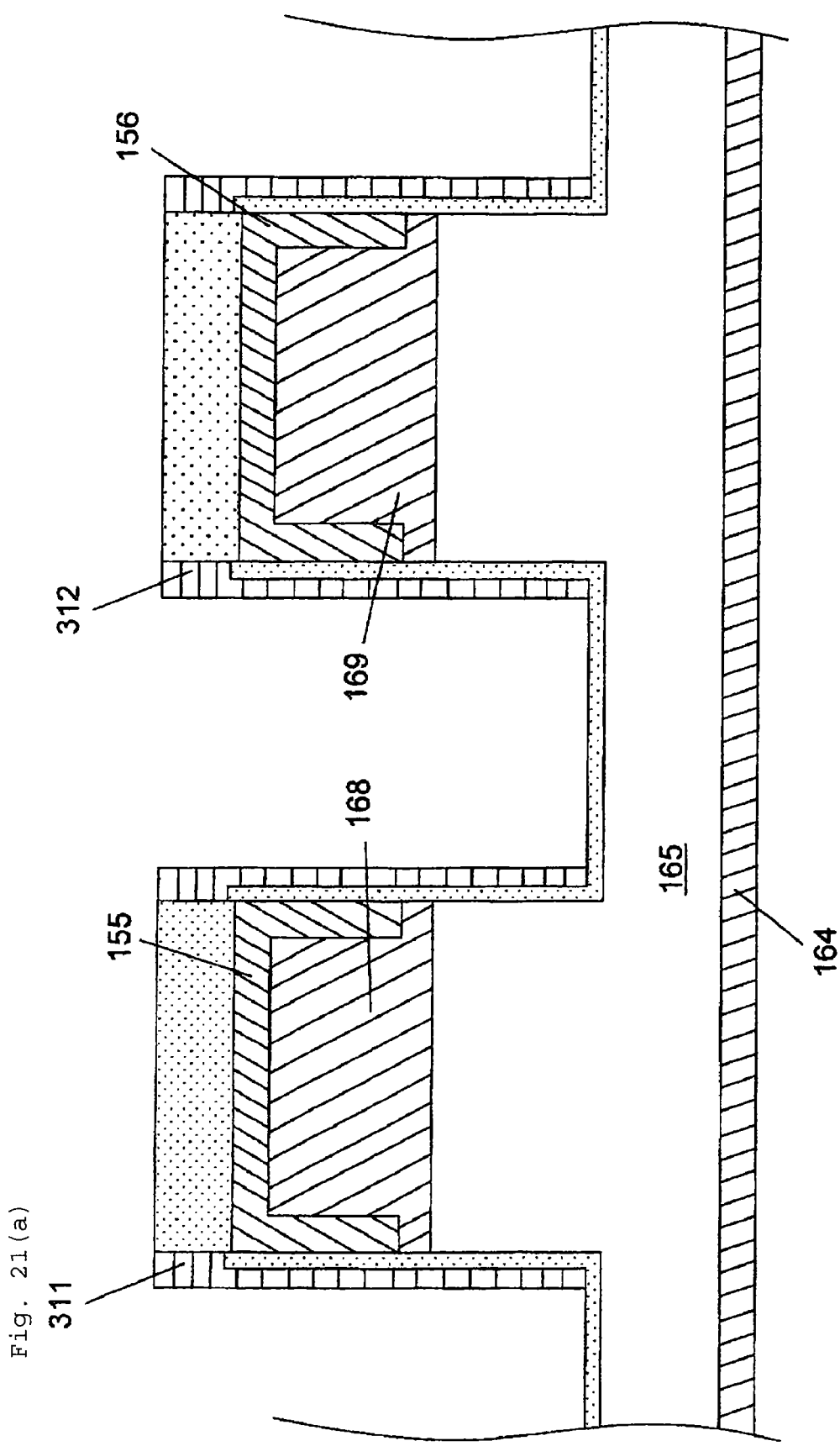
FIG. 21(a) illustrates a cross-sectional process view taken from $X_2$-$X_2'$, showing the example of production of the solid-state image sensor in accordance with the present invention.
Figure 21B:
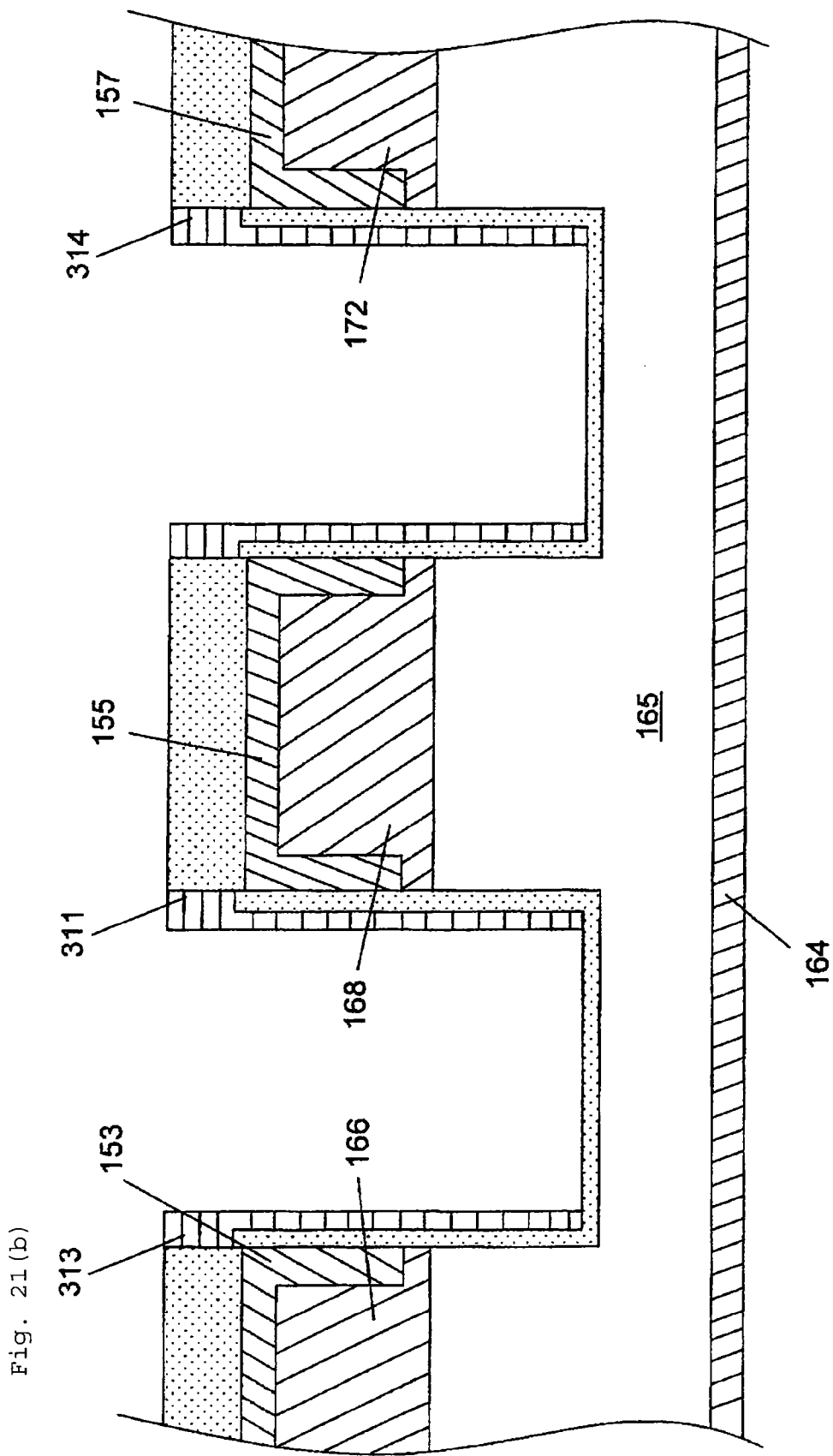
FIG. 21(b) illustrates a cross-sectional process view taken from $Y_2$-$Y_2'$, showing the example of production of the solid-state image sensor in accordance with the present invention.

A nitride film is deposited and etchback is performed to then leave it in the form of sidewall spacers 311, 312, 313, and 314 on the pillar-shaped semiconductor sidewall so as to use it as a mask upon ion implantation (FIGS. 21(a) and 21(b)).

Figure 22A:
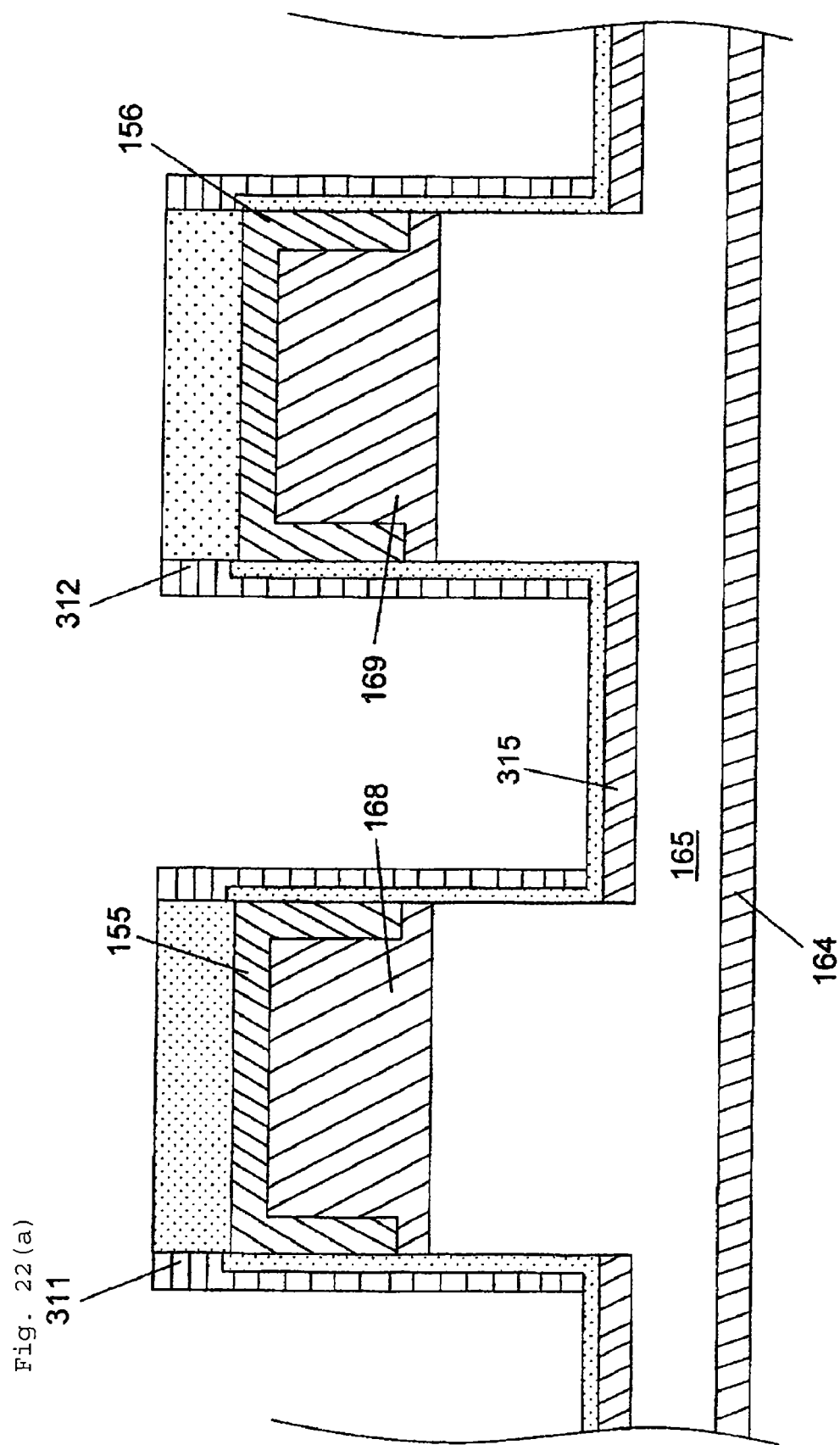
FIG. 22(a) illustrates a cross-sectional process view taken from $X_2$-$X_2'$, showing the example of production of the solid-state image sensor in accordance with the present invention.

An n-type region 315 which will be an n-type CCD channel region later is formed (FIGS. 22(a) and 22(b)).

Figure 23A:
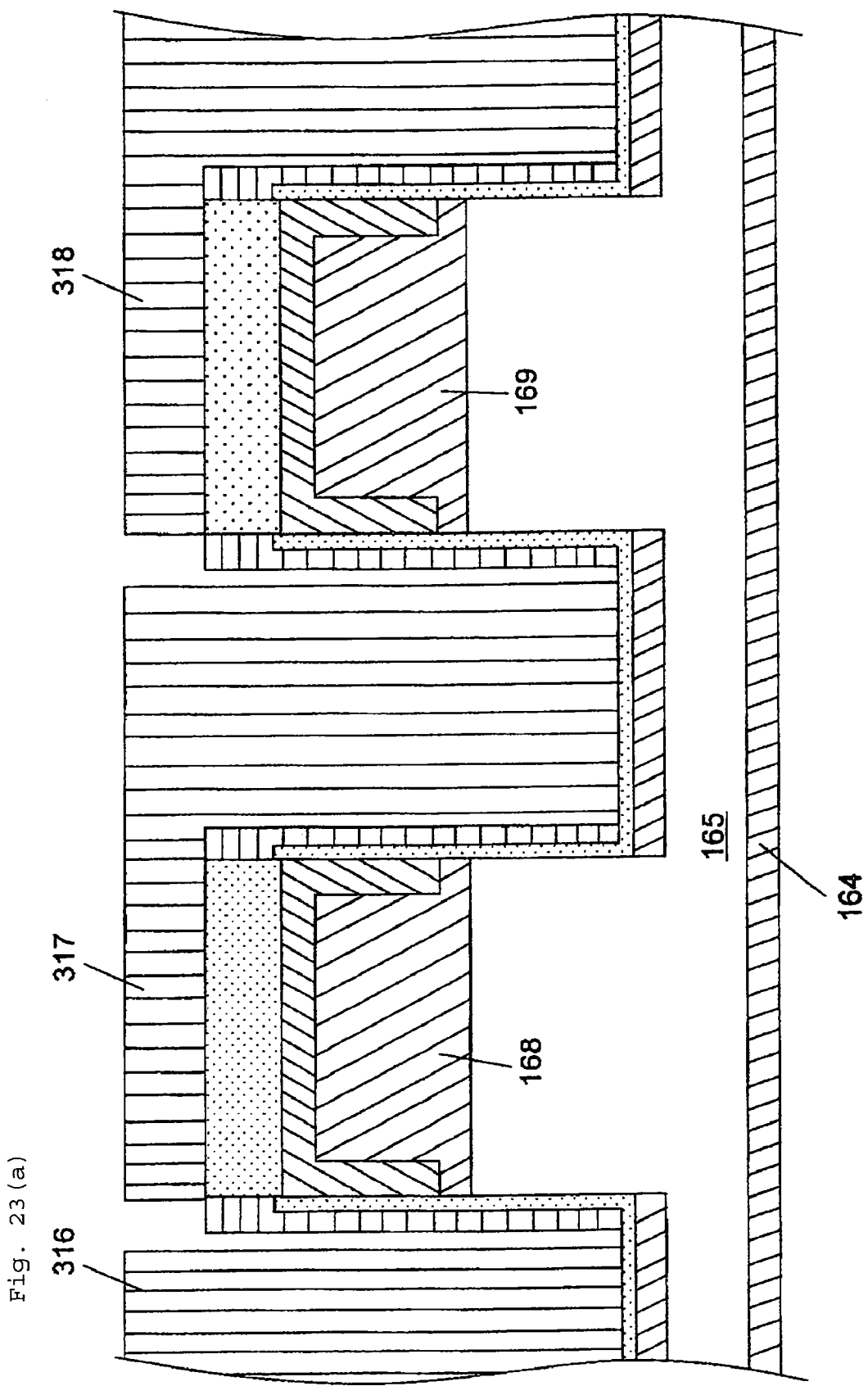
FIG. 23(a) illustrates a cross-sectional process view taken from $X_2$-$X_2'$, showing the example of production of the solid-state image sensor in accordance with the present invention.
Figure 23:
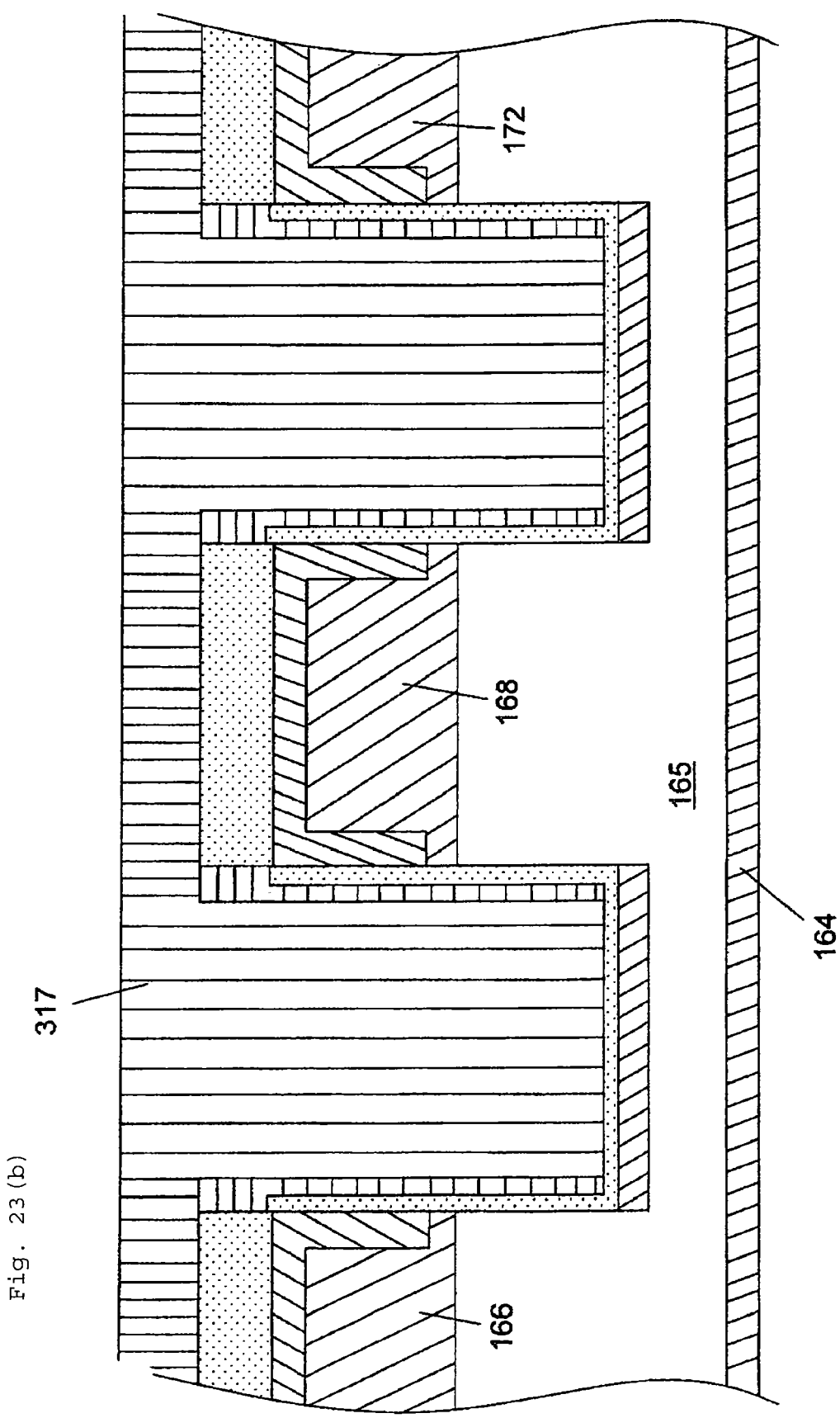
FIG. 23(b) illustrates a cross-sectional process view taken from $Y_2$-$Y_2'$, showing the example of production of the solid-state image sensor in accordance with the present invention.

Photoresists 316, 317, and 318 which are mask materials for forming the p⁺-type isolation regions are formed (FIGS. 23(a) and 23(b)).

Figure 24A:
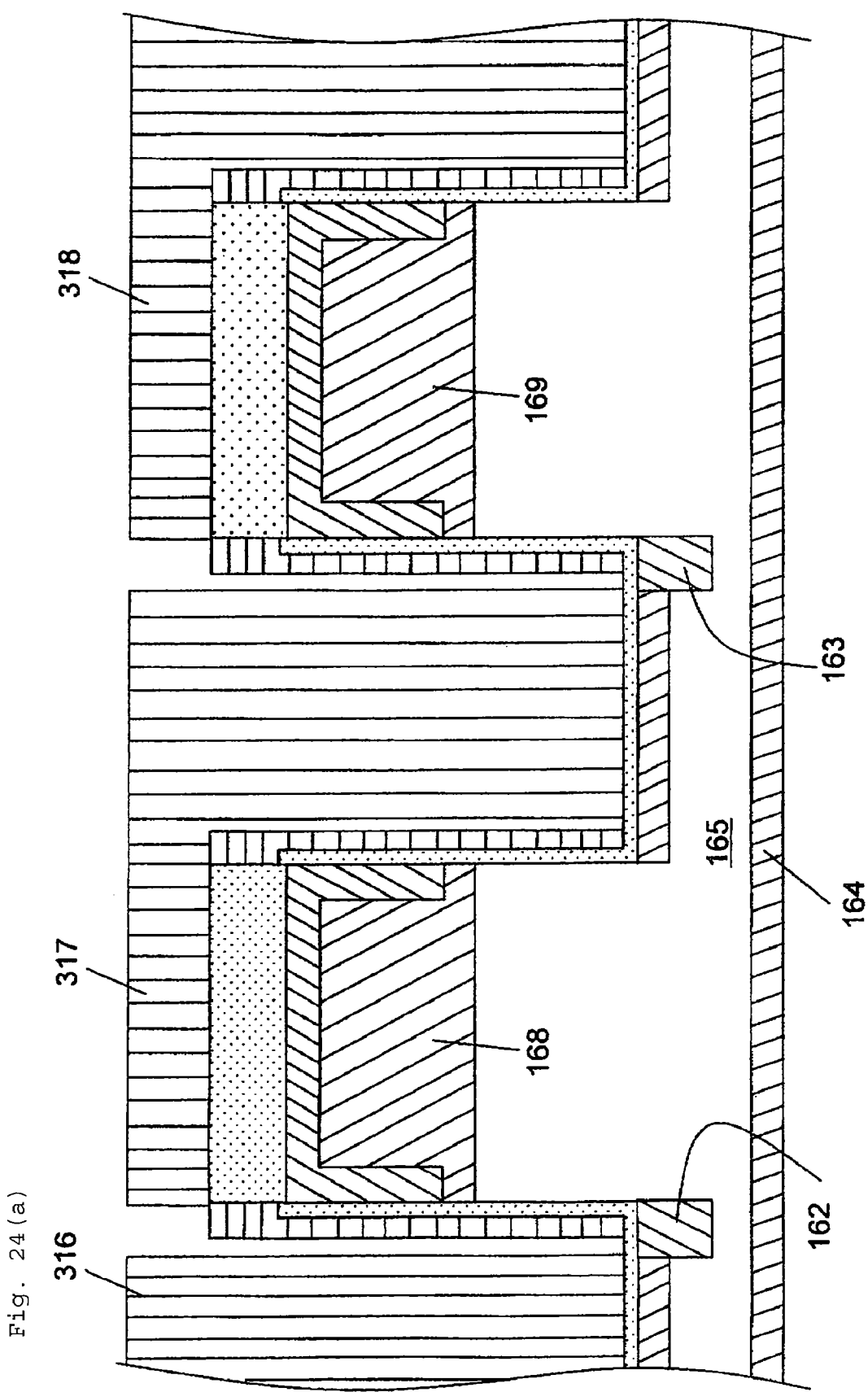
FIG. 24(a) illustrates a cross-sectional process view taken from $X_2$-$X_2'$, showing the example of production of the solid-state image sensor in accordance with the present invention.
Figure 24B:
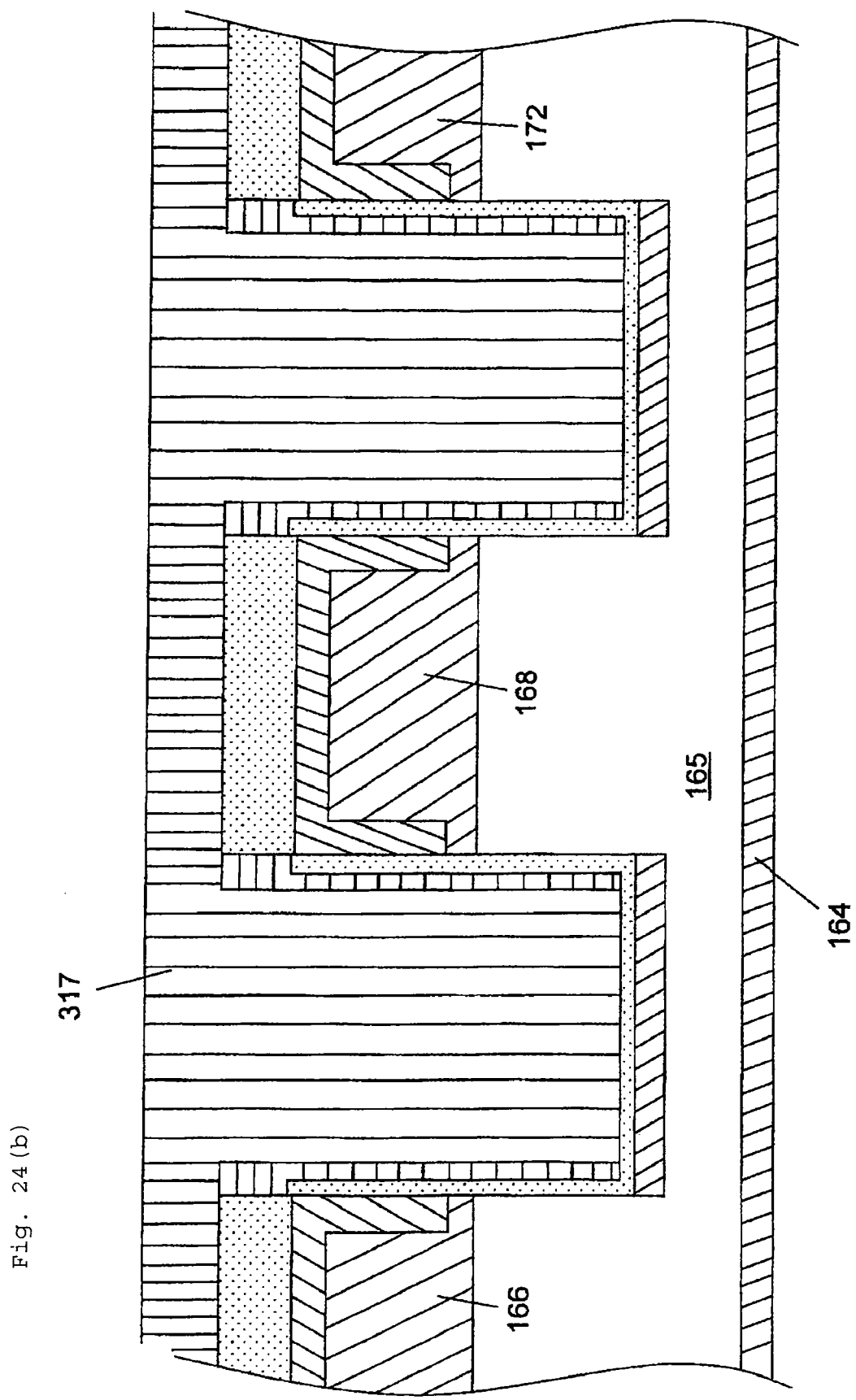
FIG. 24(b) illustrates a cross-sectional process view taken from $Y_2$-$Y_2'$, showing the example of production of the solid-state image sensor in accordance with the present invention.

Ion implantation is performed to form the p⁺-type isolation regions 162 and 163 (FIGS. 24(a) and 24(b)).

Figure 25A:
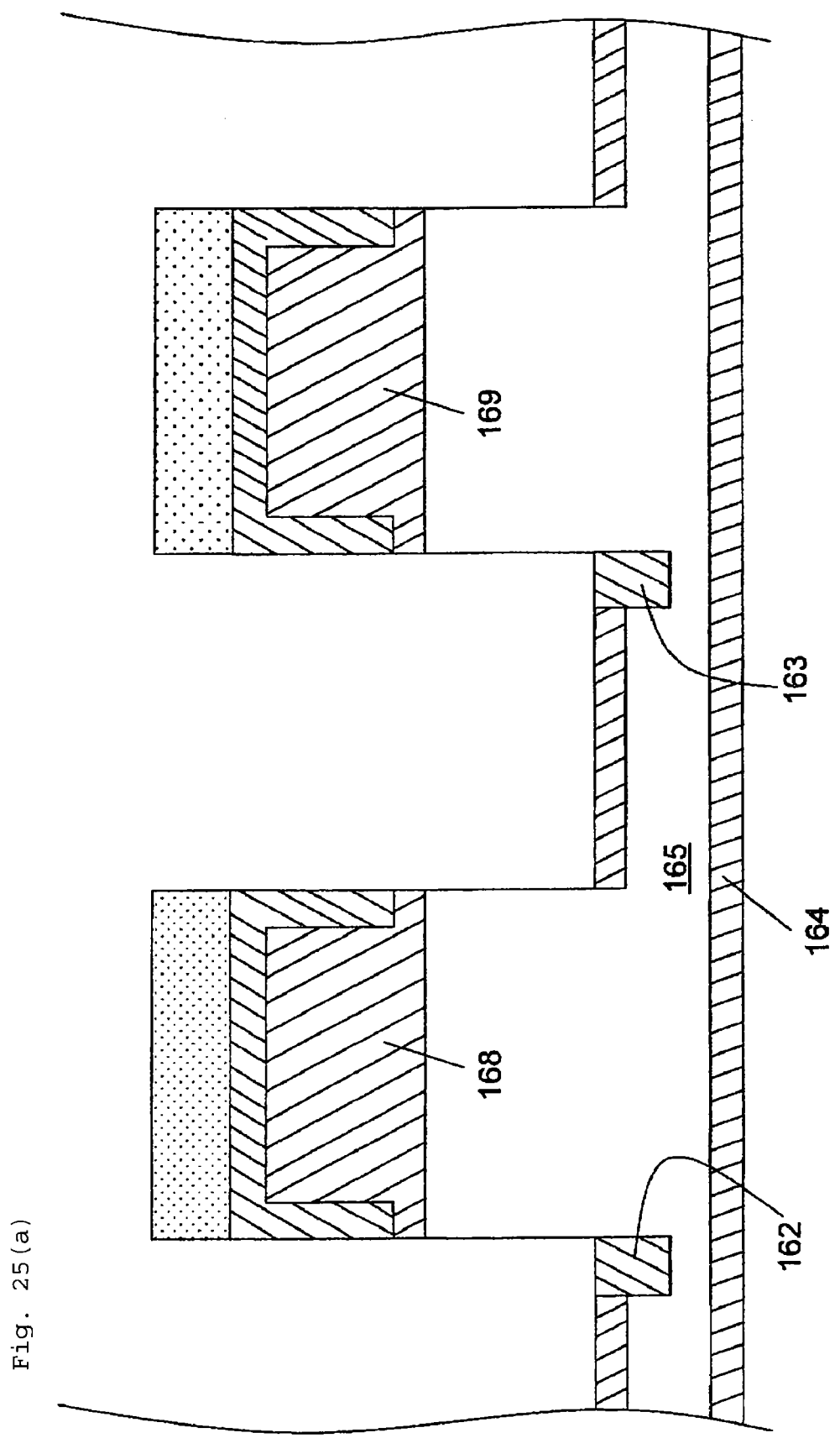
FIG. 25(a) illustrates a cross-sectional process view taken from $X_2$-$X_2'$, showing the example of production of the solid-state image sensor in accordance with the present invention.
Figure 25B:
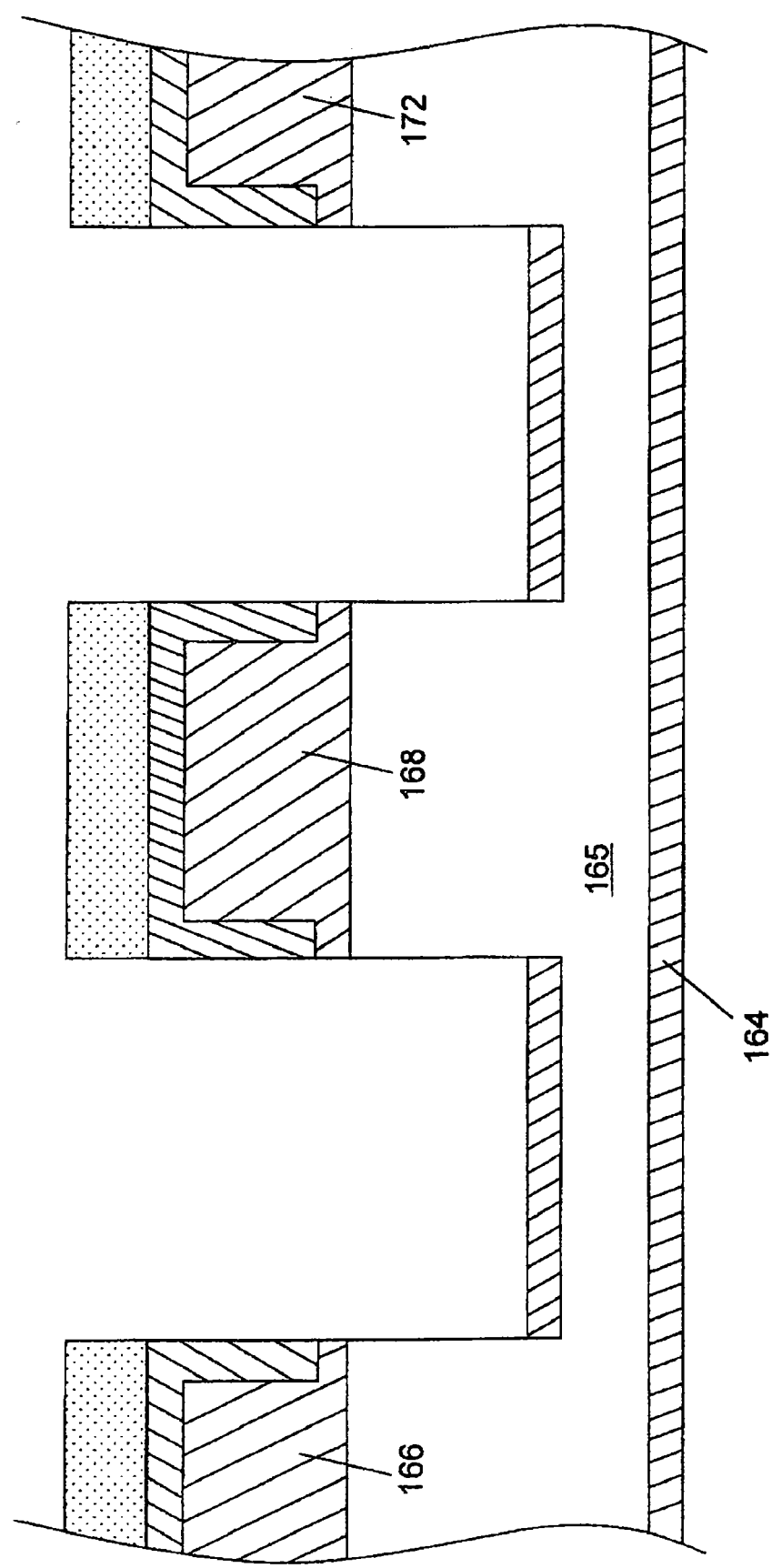
FIG. 25(b) illustrates a cross-sectional process view taken from $Y_2$-$Y_2'$, showing the example of production of the solid-state image sensor in accordance with the present invention.

The photoresist, the nitride film, and the oxide film are removed in this order (FIGS. 25(a) and 25(b)).

Figure 26A:
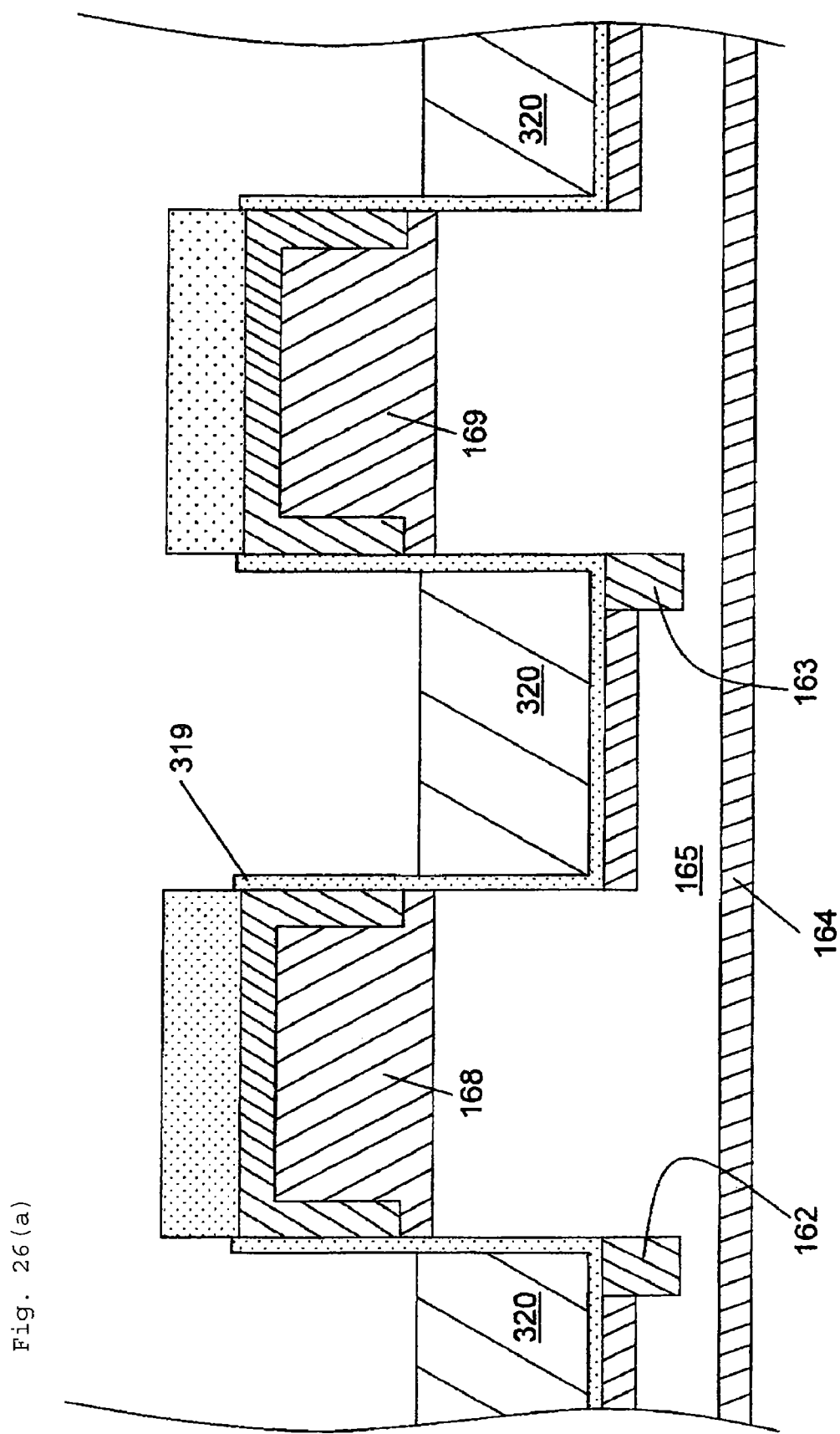
FIG. 26(a) illustrates a cross-sectional process view taken from $X_2$-$X_2'$, showing the example of production of the solid-state image sensor in accordance with the present invention.
Figure 26:
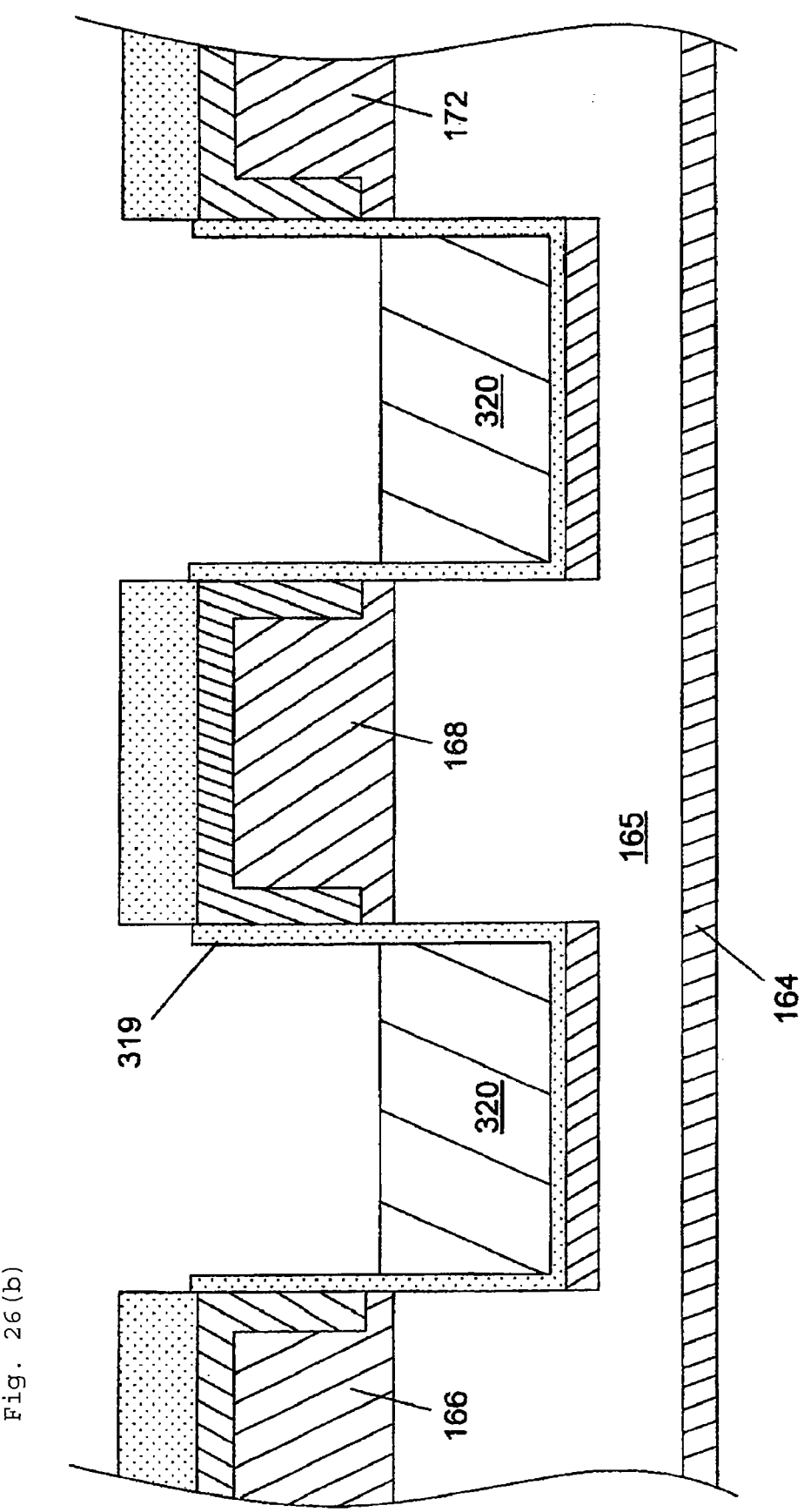
FIG. 26(b) illustrates a cross-sectional process view taken from $Y_2$-$Y_2'$, showing the example of production of the solid-state image sensor in accordance with the present invention.

Gate oxidation is performed to form a gate oxide film 319, and a polysilicon 320 is deposited and planarized, and etchback is performed thereto (FIGS. 26(a) and 26(b)).

Figure 27A:
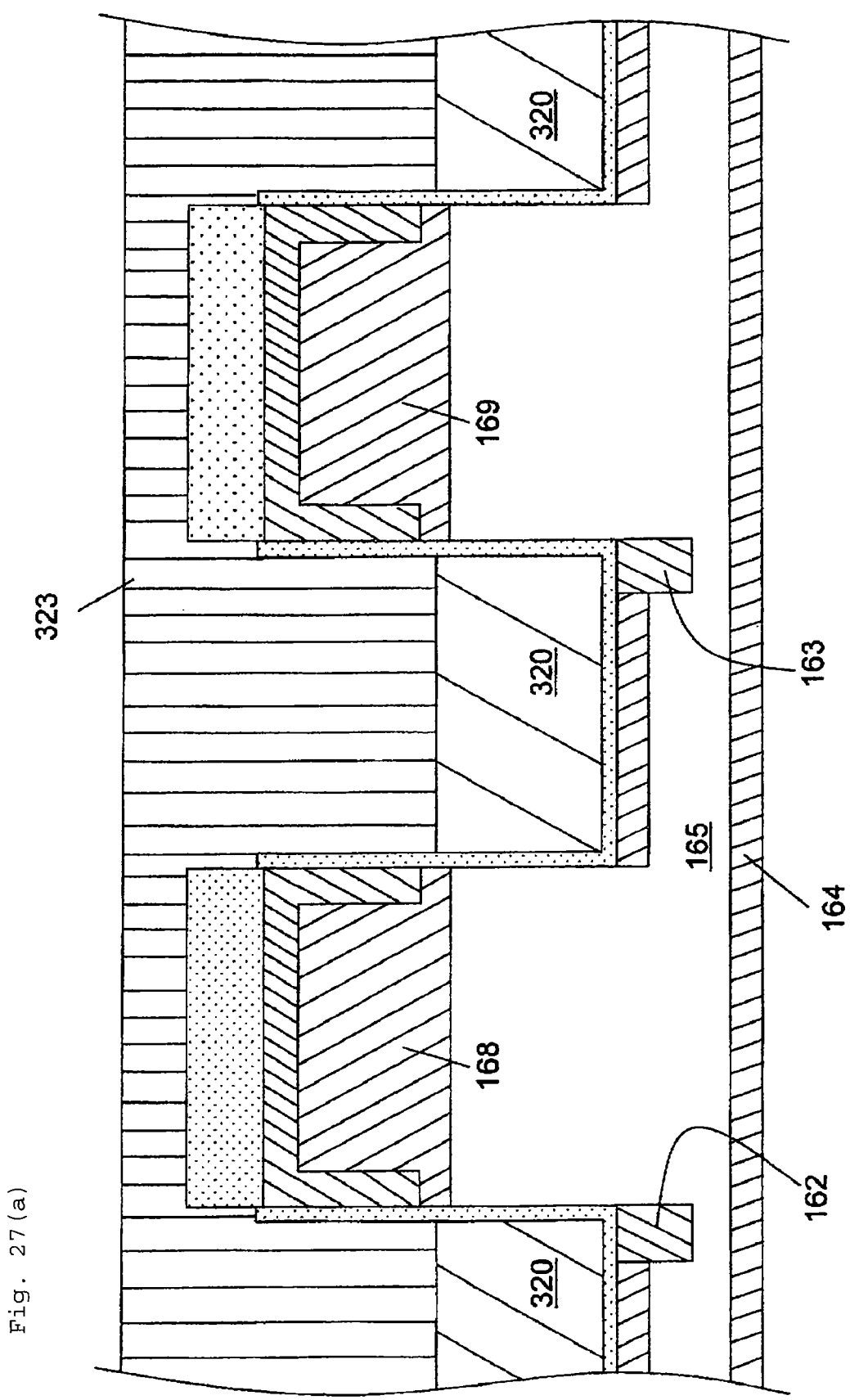
FIG. 27(a) illustrates a cross-sectional process view taken from $X_2$-$X_2'$, showing the example of production of the solid-state image sensor in accordance with the present invention.
Figure 27B:
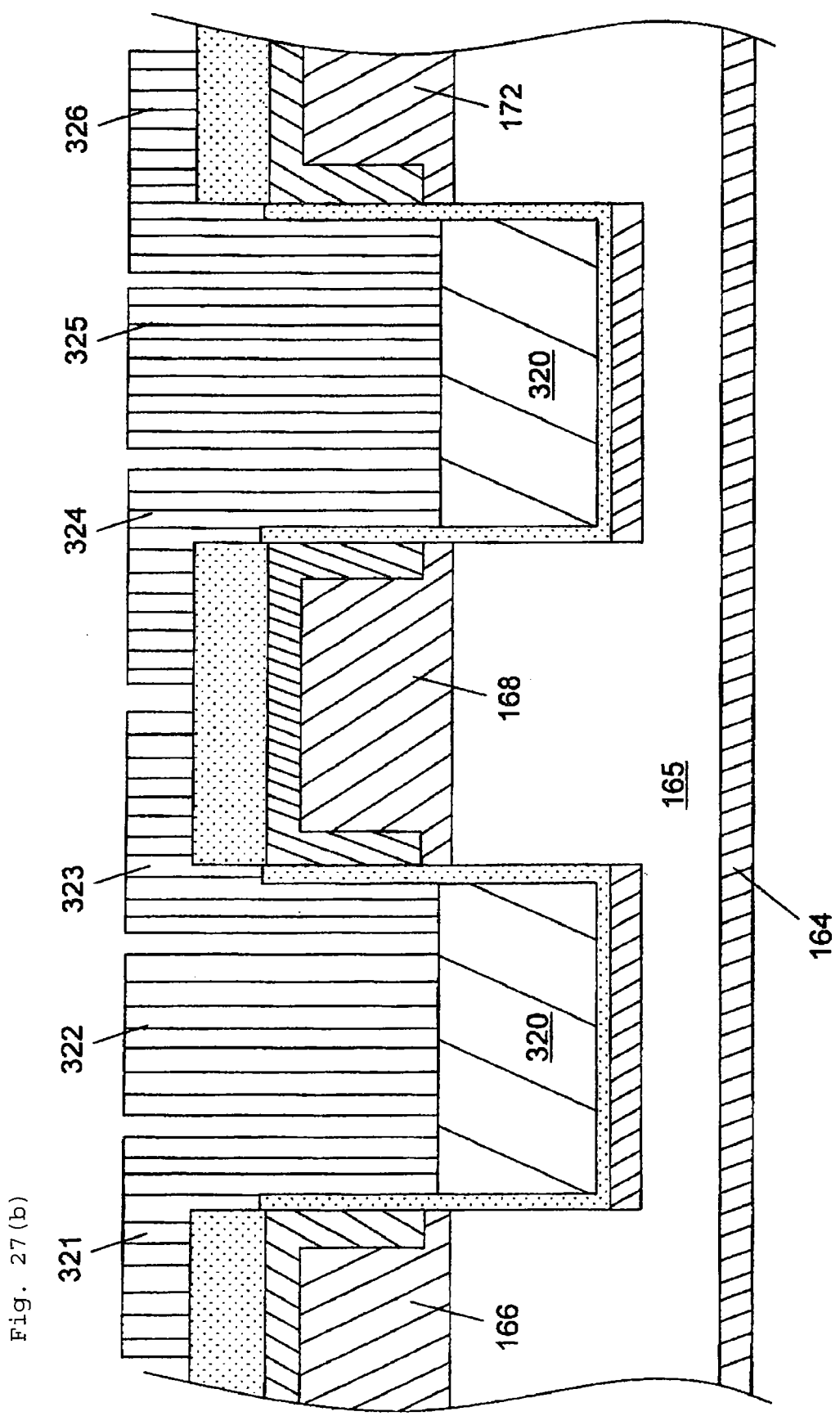
FIG. 27(b) illustrates a cross-sectional process view taken from $Y_2$-$Y_2'$, showing the example of production of the solid-state image sensor in accordance with the present invention.

Photoresists 321, 322, 323, 324, 325, and 326 for forming the transfer electrodes are formed (FIGS. 27(a) and 27(b)).

Figure 28B:
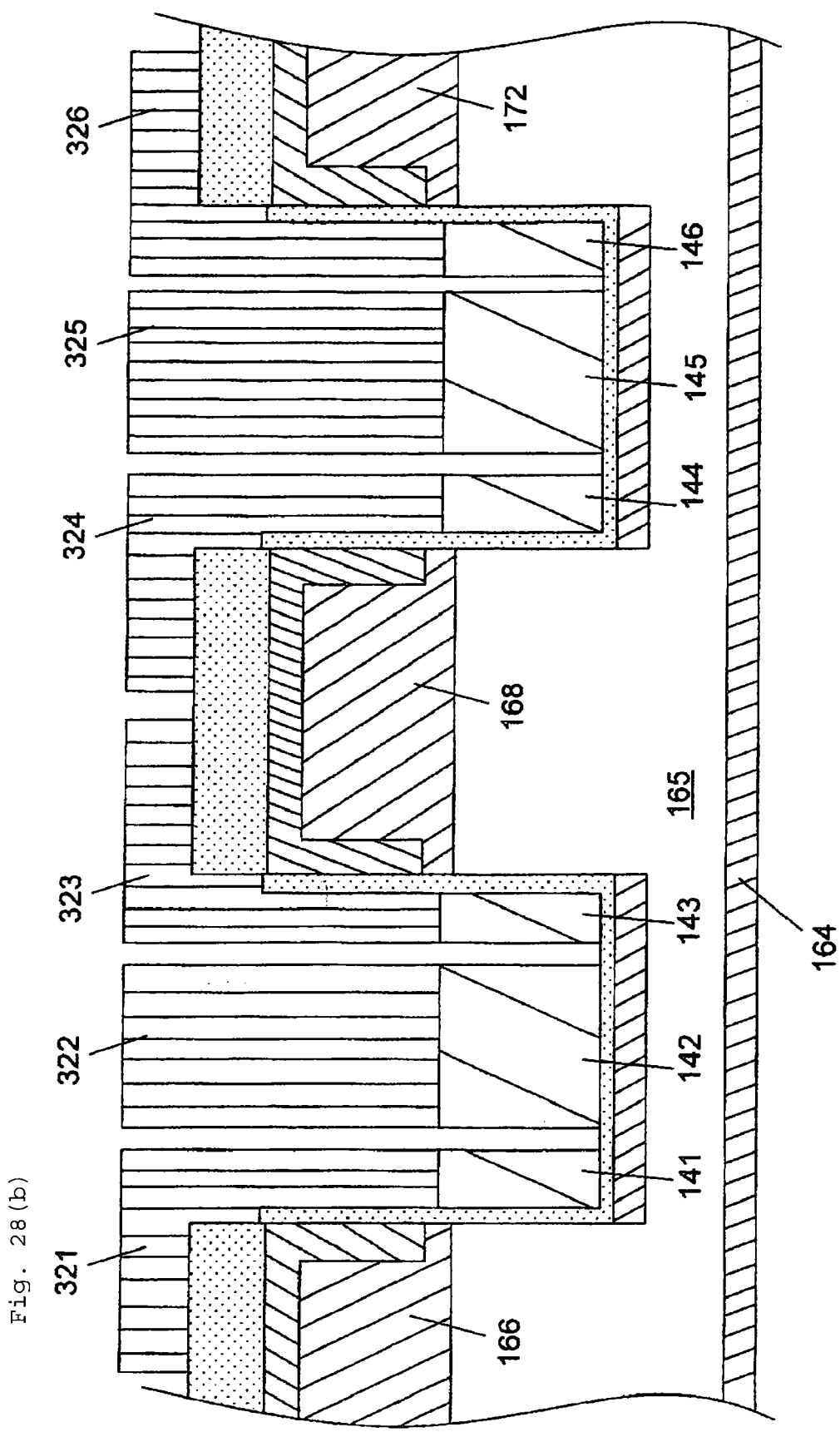
FIG. 28(b) illustrates a cross-sectional process view taken from $Y_2$-$Y_2'$, showing the example of production of the solid-state image sensor in accordance with the present invention.

The polysilicon is etched to form the transfer electrodes 141, 142, 143, 144, 145, and 146 (FIGS. 28(a) and 28(b)).

Figure 29A:
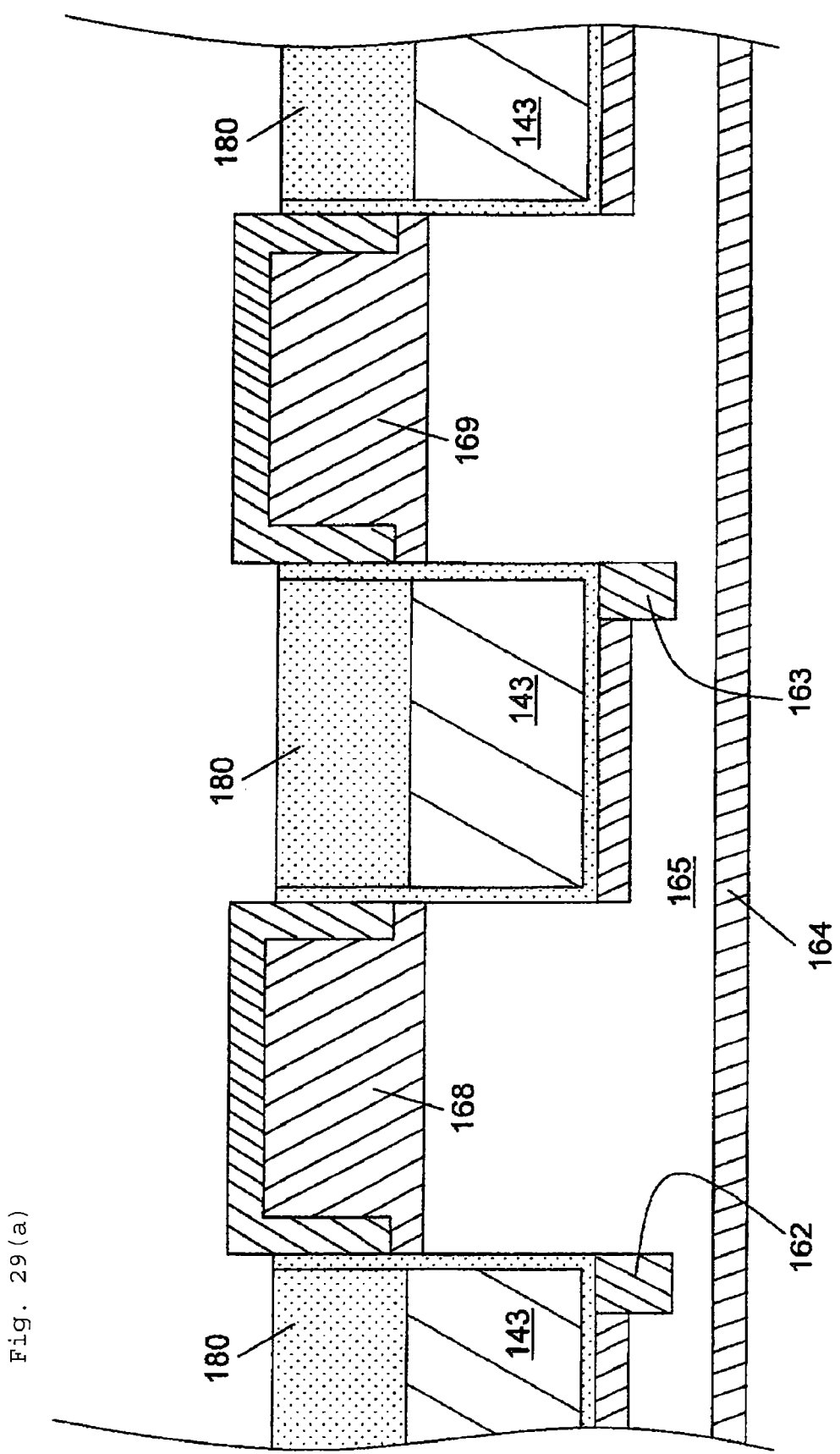
FIG. 29(a) illustrates a cross-sectional process view taken from $X_2$-$X_2'$, showing the example of production of the solid-state image sensor in accordance with the present invention.
Figure 29:
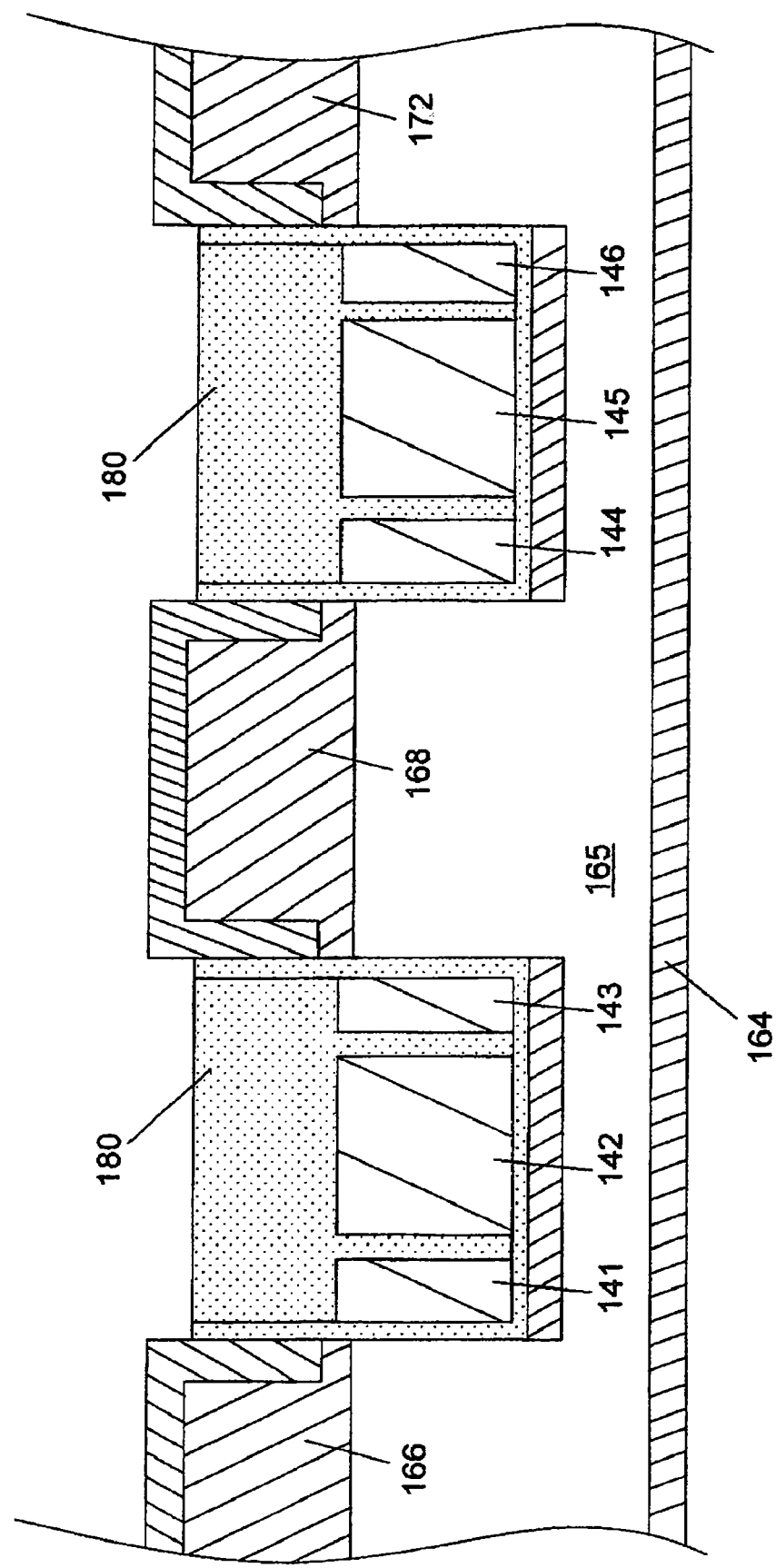
FIG. 29(b) illustrates a cross-sectional process view taken from $Y_2$-$Y_2'$, showing the example of production of the solid-state image sensor in accordance with the present invention.

The photoresist is removed, and an oxide film 180 is deposited and planarized, and etchback is performed thereto (FIGS. 29(a) and 29(b)).

Figure 30A:
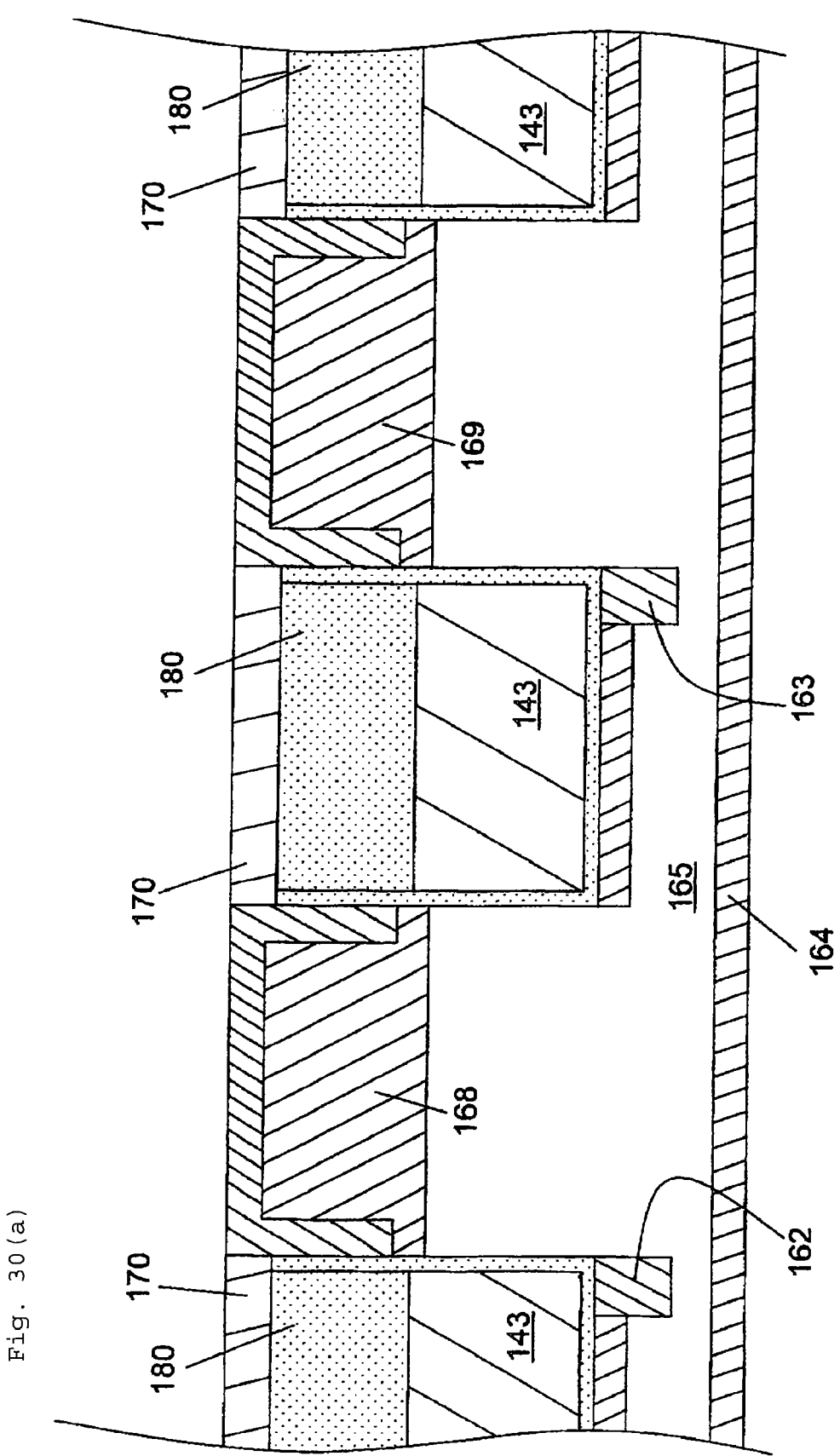
FIG. 30(a) illustrates a cross-sectional process view taken from $X_2$-$X_2'$, showing the example of production of the solid-state image sensor in accordance with the present invention.
Figure 30B:
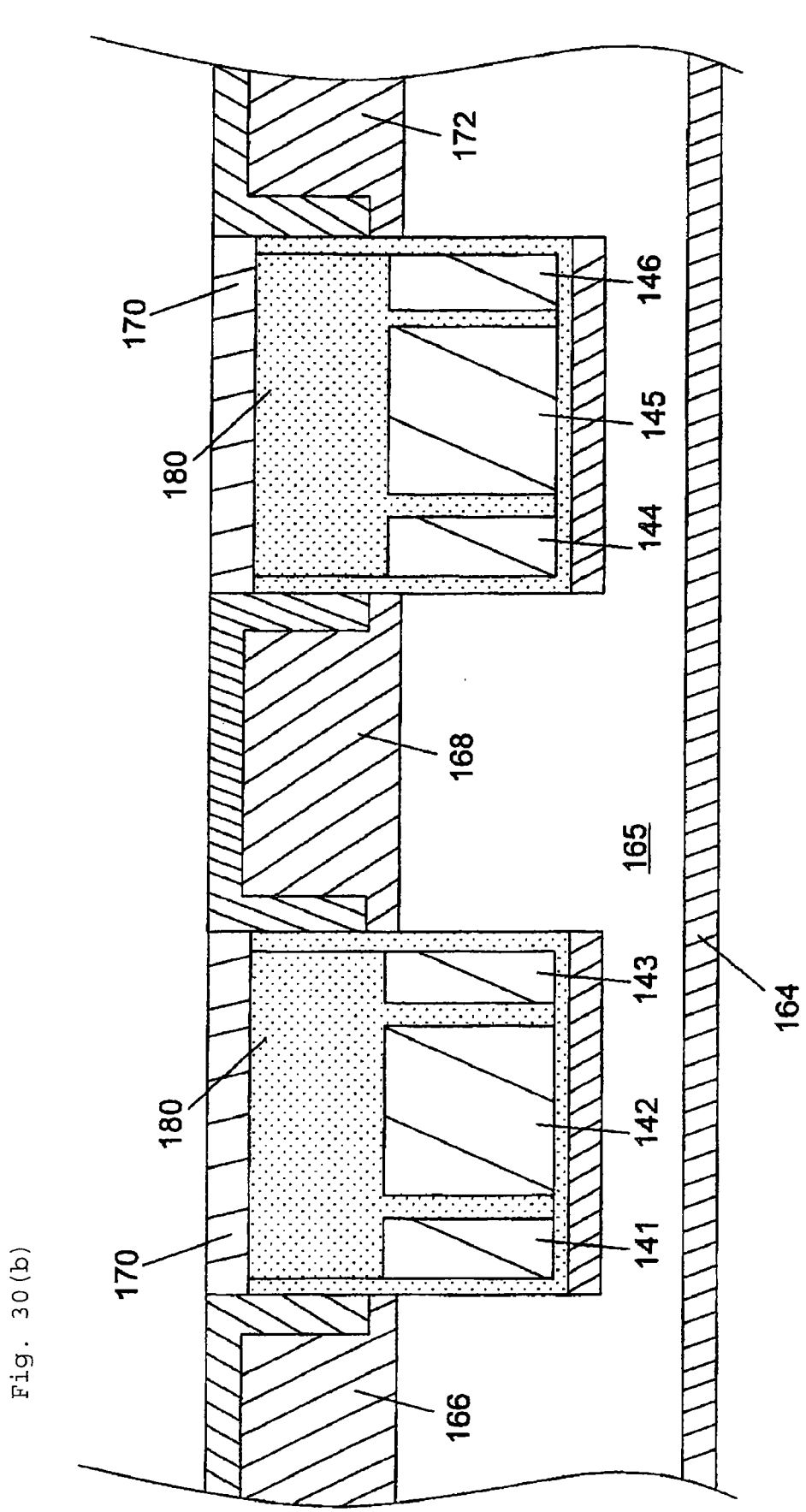
FIG. 30(b) illustrates a cross-sectional process view taken from $Y_2$-$Y_2'$, showing the example of production of the solid-state image sensor in accordance with the present invention.

The metal shield film 170 is deposited and planarized, and etchback is performed thereto (FIGS. 30(a) and 30(b)).

Although the pillar-shaped semiconductor layer is formed by etching the semiconductor layer in the above embodiment, the pillar-shaped semiconductor layer may also be formed by another method, for example, an epitaxial growth.

The pillar-shaped semiconductor layers of the solid-state image sensor and the solid-state image sensing device are formed on the p-type well region formed on the n-type substrate in the above embodiment, but it is not limited to this, and it may also be formed on the silicon layer on an insulating film formed on the substrate (for example, on an SOI substrate), for example.

Moreover, although the n-type photoelectric conversion region formed on the top of the p-type pillar-shaped semiconductor layer is pillar-shaped with the same diameter as that of the p-type pillar-shaped semiconductor layer in the above embodiment, it may be formed into any appropriate shapes other than that.

Moreover, the transfer electrode can be composed of an electrode material generally used in a semiconductor process or a solid state device in the above embodiments. For example, it may include a low resistivity polysilicon, tungsten (W), molybdenum (Mo), a tungsten silicide (WSi), a molybdenum silicide (MoSi), a titanium silicide (TiSi), a tantalum silicide (TaSi), and a copper silicide (CuSi). Moreover, the transfer electrode may be formed by stacking these electrode materials in layers without including the insulating film.

Additionally, the metal shield film may be formed of, for example, a metal film such as aluminum (Al), chromium (Cr), tungsten (W), titanium (Ti), molybdenum (Mo), or the like, an alloy film composed of two or more kinds of these metals, a multilayered metal film in which two or more kinds selected from a group including the above metal films and the above alloy films are combined.

What is claimed is:

1. A solid-state image sensor, comprising:
a first conductivity-type semiconductor layer;
a first conductivity-type pillar-shaped semiconductor layer overlying the first conductivity-type semiconductor layer;
a second conductivity-type photoelectric conversion region formed on a top of the first conductivity-type pillar-shaped semiconductor layer, wherein an electric charge in the photoelectric conversion region is light-reactive; and
a highly-concentrated impurity region of the first conductivity-type overlying a surface of the second conductivity-type photoelectric conversion region, the highly-concentrated impurity region being spaced apart from a top end of the first conductivity-type pillar-shaped semiconductor layer by a predetermined distance;
a transfer electrode adjacent to a side of the first conductivity-type pillar-shaped semiconductor layer and separated therefrom by a gate insulating film;
a second conductivity-type CCD channel region underlies the transfer electrode; and
a read channel within the first conductivity-type pillar-shaped semiconductor layer in a region between the second conductivity-type photoelectric conversion region and the second conductivity-type CCD channel region.

2. A solid-state image sensing device comprising a plurality of solid-state image sensors according to claim 1 arranged in a matrix pattern.

3. The solid-state image sensing device according to claim 2, wherein the second conductivity-type CCD channel region comprises a second conductivity-type impurity region extending in a column direction at least in respective portions between adjacent columns of the first conductivity-type pillar-shaped semiconductor layers, and an isolation region comprising highly concentrated impurities of the first conductivity-type structured so that the respective portions of the second conductivity-type CCD channel region are electrically isolated from each other.

4. The solid-state image sensing device according to claim 3, wherein a plurality of transfer electrodes including the transfer electrodes on the side of the first conductivity-type pillar-shaped semiconductor layer extend in a row direction, in respective portions between adjacent rows of the first conductivity-type pillar-shaped semiconductor layers, and are arranged at a predetermined spacing so as to transfer a signal charge generated in the solid-state image sensor along the second conductivity-type CCD channel region.

5. A solid-state image sensing device, wherein a plurality of sets of the columns of solid-state image sensors, in which a first column of solid-state image sensors having a plurality of solid-state image sensors according to claim 1 are arranged in a first direction at a first spacing and a second column of solid-state image sensors having a plurality of solid-state image sensors according to claim 1 are arranged in the first direction at the first spacing and are displaced by a predetermined amount in the first direction with respect to the first column of solid-state image sensors and are displacedly arranged at a second spacing and are displacedly arranged by a predetermined amount in the first direction at the second spacing.

6. The solid-state image sensing device according to claim 5, wherein the second conductivity-type CCD channel region is composed of a second conductivity-type impurity region which extends in the column direction passing through and between respective pillar-shaped semiconductor layers of the adjacent columns of the first conductivity-type pillar-shaped semiconductor layers, at least in respective portions between the adjacent columns of the pillar-shaped semiconductor layers, and an isolation region comprising highly-concentration impurities of the first conductivity-type arranged so that the second conductivity-type CCD channel regions are electrically isolated from each other.

7. The solid-state image sensing device according to claim 6, wherein the transfer electrodes extend in the row direction passing through and between respective pillar-shaped semiconductor layers of the adjacent rows of the pillar-shaped semiconductor layers, in respective portions between adjacent rows of the pillar-shaped semiconductor layers, and are arranged at a predetermined spacing so as to transfer a signal charge generated in the solid-state image sensor along the second conductivity-type CCD channel region.

8. A solid-state image sensor comprising:
a laterally-oriented semiconductor layer of a first conductivity-type;
a vertically-oriented pillar-shaped semiconductor layer of the first conductivity-type overlying the semiconductor layer;
a photoelectric conversion region of a second conductivity-type overlies an upper surface of the pillar-shaped semiconductor layer, wherein the photoelectric conversion region comprises a light-reactive electric charge; and
a highly-concentrated impurity region of the first conductivity-type partially encapsulating the photoelectric conversion region and spaced apart from an upper end of the pillar-shaped semiconductor layer by a portion of the photoelectric conversion region;
a transfer electrode adjacent to side surfaces of the pillar-shaped semiconductor layer and separated therefrom by a gate insulating film;
a CCD channel region of the second conductivity-type between the transfer electrode the laterally-oriented semiconductor layer; and
a read channel within the pillar-shaped semiconductor layer in a region intermediate to the photoelectric conversion region and the CCD channel region.

9. The solid-state image sensing device comprising a plurality of solid-state image sensors according to claim 8 and arranged in a matrix pattern of orthogonal rows and columns, wherein the CCD channel region comprises a region extending in a column direction at least in respective portions between adjacent columns of the pillar-shaped semiconductor layers, and an isolation region comprising highly concentrated impurities of the first conductivity-type is structured such that the respective portions of the CCD channel region are electrically isolated from each other.

10. A solid-state image sensing device comprising a plurality of solid-state image sensors according to claim 8 and arranged in a honeycomb pattern of rows and columns in which a first column of solid-state image sensors are arranged in a first direction at a first spacing and a second column of solid-state image sensors are arranged in the first direction at the first spacing and are offset by a predetermined amount in the first direction with respect to solid-state image sensors in the first column and in which a first row of solid-state image sensors are arranged in a second direction at a the first spacing and a second row of solid-state image sensors are arranged in the second direction at the first spacing and are offset by a predetermined amount in the second direction with respect to solid-state image sensors in the first row.

* * * * *

UNITED STATES PATENT AND TRADEMARK OFFICE
CERTIFICATE OF CORRECTION

| | | |
|---|---|---|
| PATENT NO. | : 7,960,762 B2 | Page 1 of 1 |
| APPLICATION NO. | : 12/509239 | |
| DATED | : June 14, 2011 | |
| INVENTOR(S) | : Masuoka et al. | |

It is certified that error appears in the above-identified patent and that said Letters Patent is hereby corrected as shown below:

In column 16, claim 5, line 63, immediately after "direction at a first spacing" insert --,--.

Signed and Sealed this
Twenty-ninth Day of November, 2011

David J. Kappos
*Director of the United States Patent and Trademark Office*